US012615890B2

(12) United States Patent
Kim et al.

(10) Patent No.: US 12,615,890 B2
(45) Date of Patent: Apr. 28, 2026

(54) DISPLAY DEVICE WITH LIGHT EMITTING ELEMENTS HAVING DIFFERENT WIDTHS

(71) Applicant: Samsung Display Co., LTD., Yongin-si (KR)

(72) Inventors: Su Jeong Kim, Hwaseong-si (KR); Sang Jo Kim, Daejeon (KR); Seung Geun Lee, Hwaseong-si (KR); Min Woo Kim, Hwaseong-si (KR); Jin Wan Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 811 days.

(21) Appl. No.: 17/873,557

(22) Filed: Jul. 26, 2022

(65) Prior Publication Data

US 2023/0155063 A1 May 18, 2023

(30) Foreign Application Priority Data

Nov. 15, 2021 (KR) ........................ 10-2021-0156704

(51) Int. Cl.
*H10H 20/812* (2025.01)
*H10H 20/831* (2025.01)
(Continued)

(52) U.S. Cl.
CPC ...... *H10H 20/8312* (2025.01); *H10H 20/812* (2025.01); *H10H 20/857* (2025.01); *H10H 29/142* (2025.01)

(58) Field of Classification Search
CPC .. H10H 20/812; H10H 20/822; H10H 29/142; H10K 59/35; H10K 59/351; H10K 59/352; H10K 59/353; H01L 25/167
(Continued)

(56) References Cited

U.S. PATENT DOCUMENTS 10,847,506 B2  11/2020  Yoo
10,957,818 B2  3/2021  Ahmed
(Continued)

FOREIGN PATENT DOCUMENTS

JP    2003-158296    5/2003
JP       5211352    6/2013
(Continued)

OTHER PUBLICATIONS

Atsunori Tanaka et al., "Strong Geometrical Effects in Submillimeter Selective Area Growth and Light Extraction of GaN Light Emitting Diodes on Sapphire", Scientific Reports, Nov. 27, 2015, pp. 1-12.

*Primary Examiner* — Hoai V Pham
(74) *Attorney, Agent, or Firm* — CANTOR COLBURN LLP

(57) ABSTRACT

The display device is provided. The display device comprises contact electrodes disposed on a substrate, light-emitting elements disposed on the contact electrodes, and an insulating layer defining emission areas corresponded to the light-emitting elements. The light-emitting elements comprise a first light-emitting element that emits a first light having a blue color, a second light-emitting element that emits a second light having a green color, and a third light-emitting element that emits a third light having a red color. A width of the first light-emitting element is greater than a width of the second light-emitting element. The width of the first light-emitting element is greater than a width of the third light-emitting element.

10 Claims, 53 Drawing Sheets

(51) Int. Cl.
　　H10H 20/857　　　(2025.01)
　　H10H 29/14　　　　(2025.01)
(58) Field of Classification Search
　　USPC .......................................................... 257/89
　　See application file for complete search history.

(56)　　　　　　　　References Cited

U.S. PATENT DOCUMENTS

| 2011/0151606 A1* | 6/2011 | Jeong ................... H10H 20/835 |
| | | 257/E33.068 |
| 2016/0276615 A1* | 9/2016 | Kitabayashi ........... H10K 59/30 |
| 2022/0115564 A1 | 4/2022 | Jeon et al. |
| 2025/0089508 A1* | 3/2025 | Qu ....................... H10K 59/352 |

FOREIGN PATENT DOCUMENTS

| KR | 10-2011-0111121 | 10/2011 |
| KR | 10-1710159 | 3/2017 |
| KR | 10-2017-0084139 | 7/2017 |
| KR | 10-2018-0118488 | 10/2018 |
| KR | 10-2019-0060525 | 6/2019 |
| KR | 10-2020-0096546 | 8/2020 |
| KR | 10-2020-0142685 | 12/2020 |
| KR | 10-2022-0049065 | 4/2022 |
| WO | 2021/013641 | 1/2021 |

* cited by examiner

FIG. 1
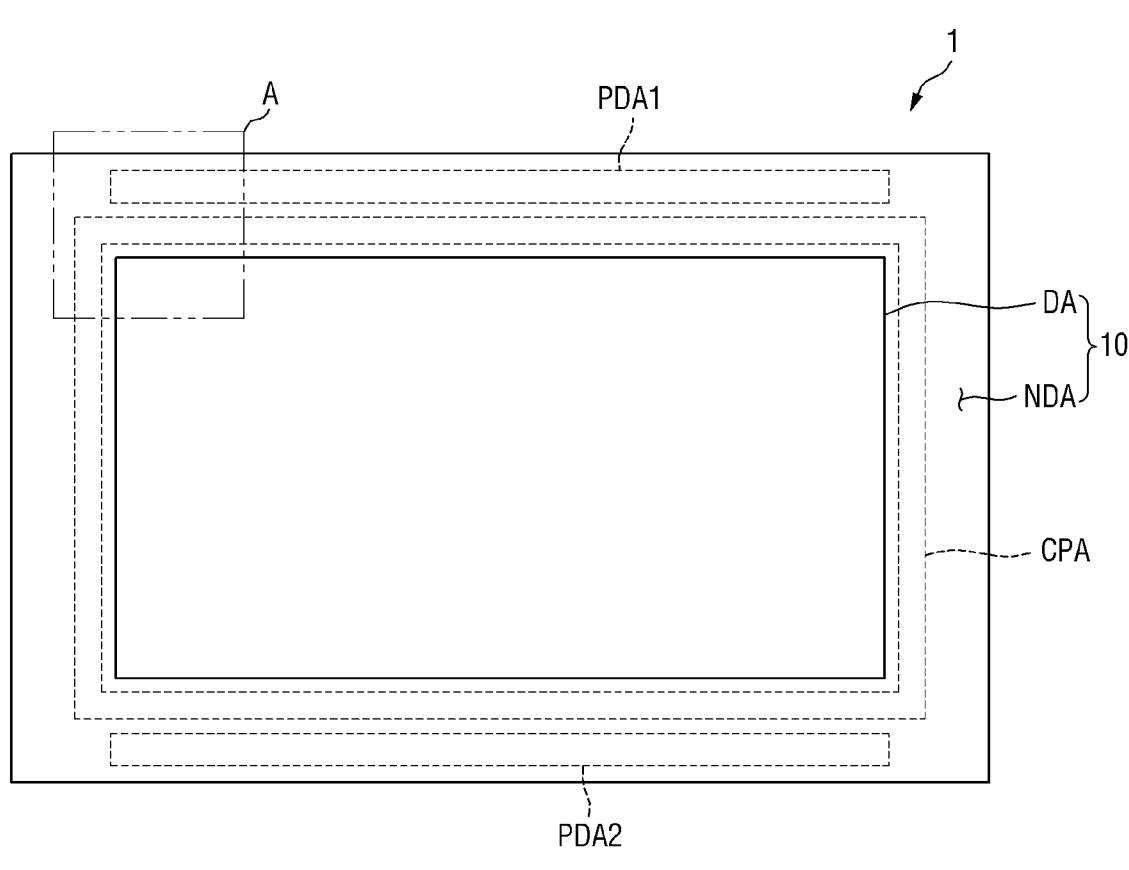
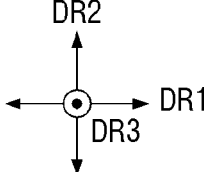

FIG. 2
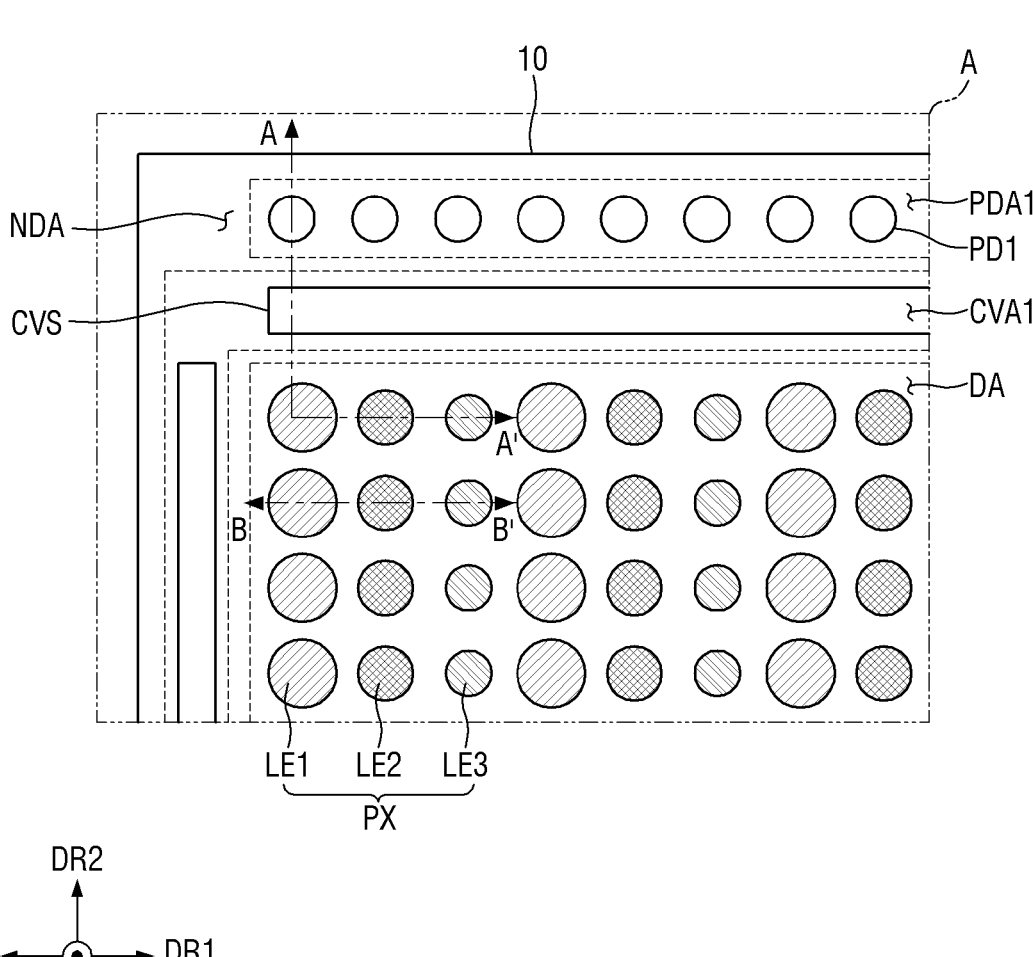
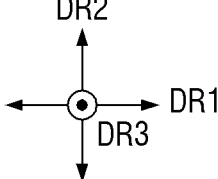

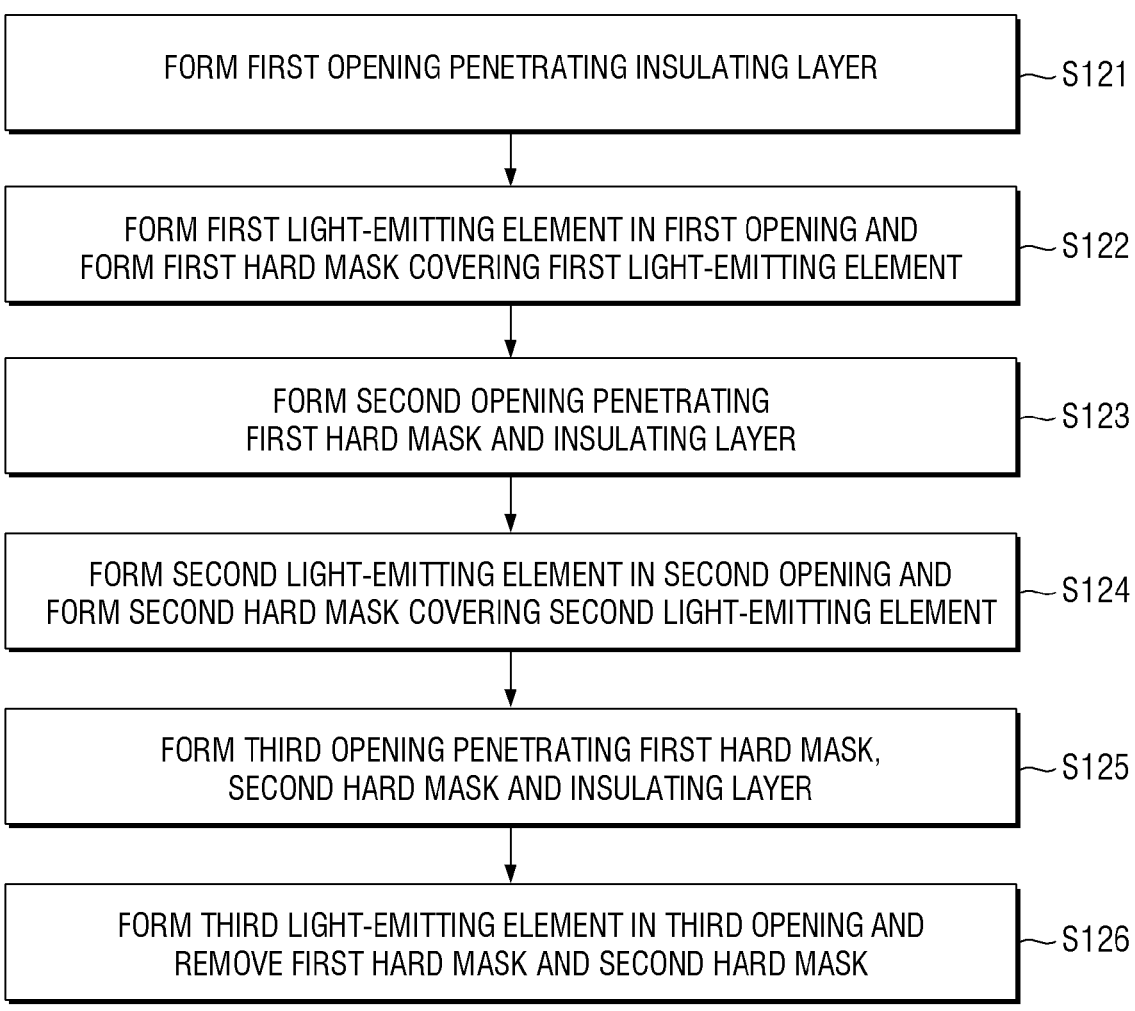

FORM FIRST OPENING PENETRATING INSULATING LAYER — S121

FORM FIRST LIGHT-EMITTING ELEMENT IN FIRST OPENING AND
FORM FIRST HARD MASK COVERING FIRST LIGHT-EMITTING ELEMENT — S122

FORM SECOND OPENING PENETRATING
FIRST HARD MASK AND INSULATING LAYER — S123

FORM SECOND LIGHT-EMITTING ELEMENT IN SECOND OPENING AND
FORM SECOND HARD MASK COVERING SECOND LIGHT-EMITTING ELEMENT — S124

FORM THIRD OPENING PENETRATING FIRST HARD MASK,
SECOND HARD MASK AND INSULATING LAYER — S125

FORM THIRD LIGHT-EMITTING ELEMENT IN THIRD OPENING AND
REMOVE FIRST HARD MASK AND SECOND HARD MASK — S126

FIG. 21
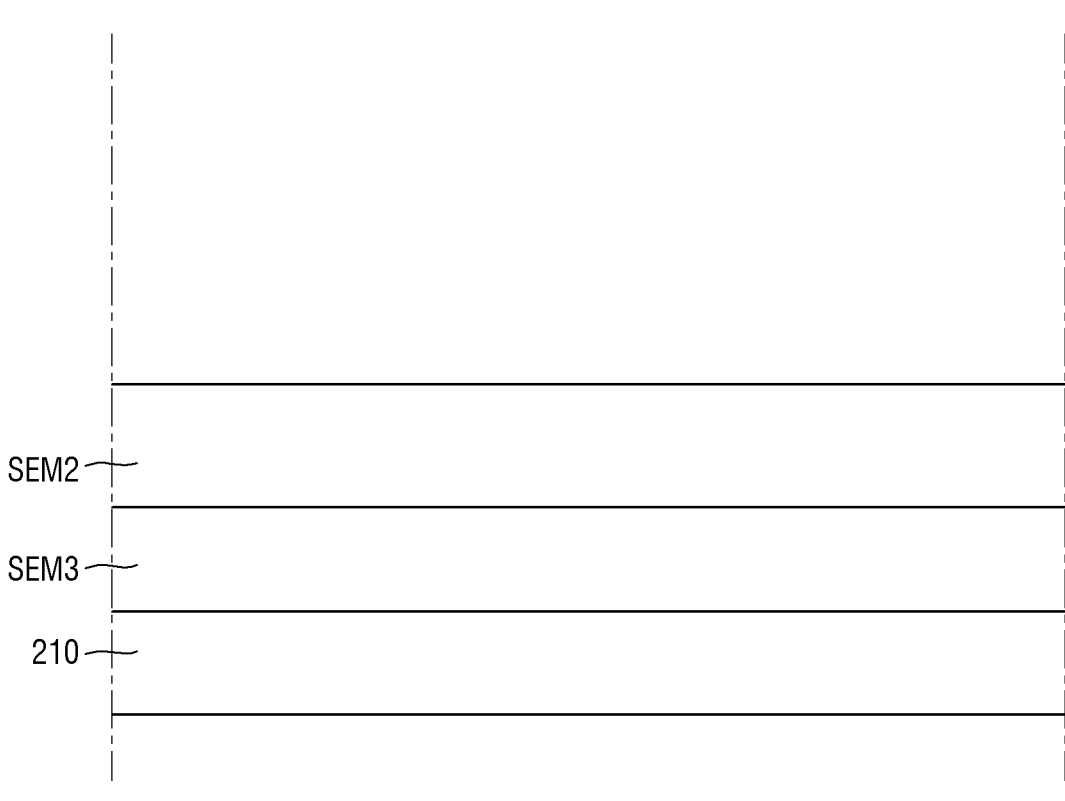
SEM2
SEM3
210
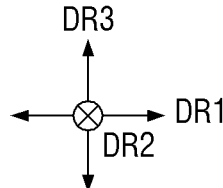
DR3
DR1
DR2

FIG. 22
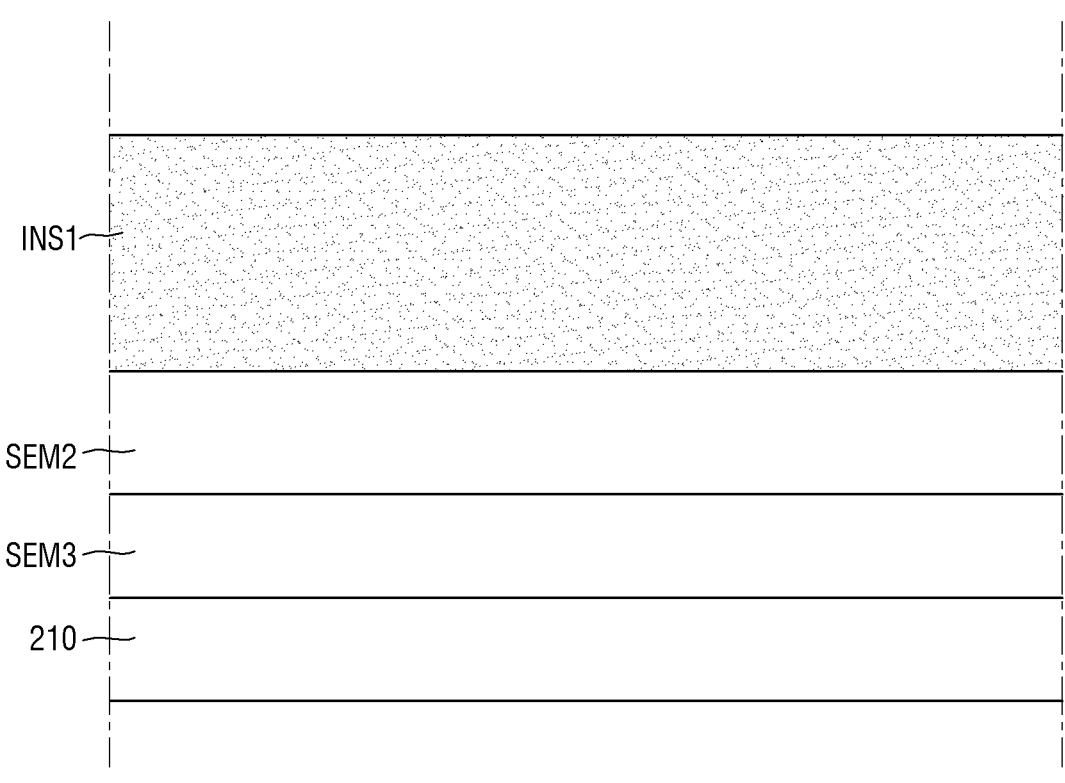
INS1
SEM2
SEM3
210
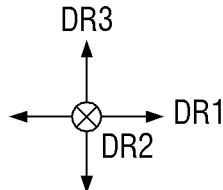

FIG. 23
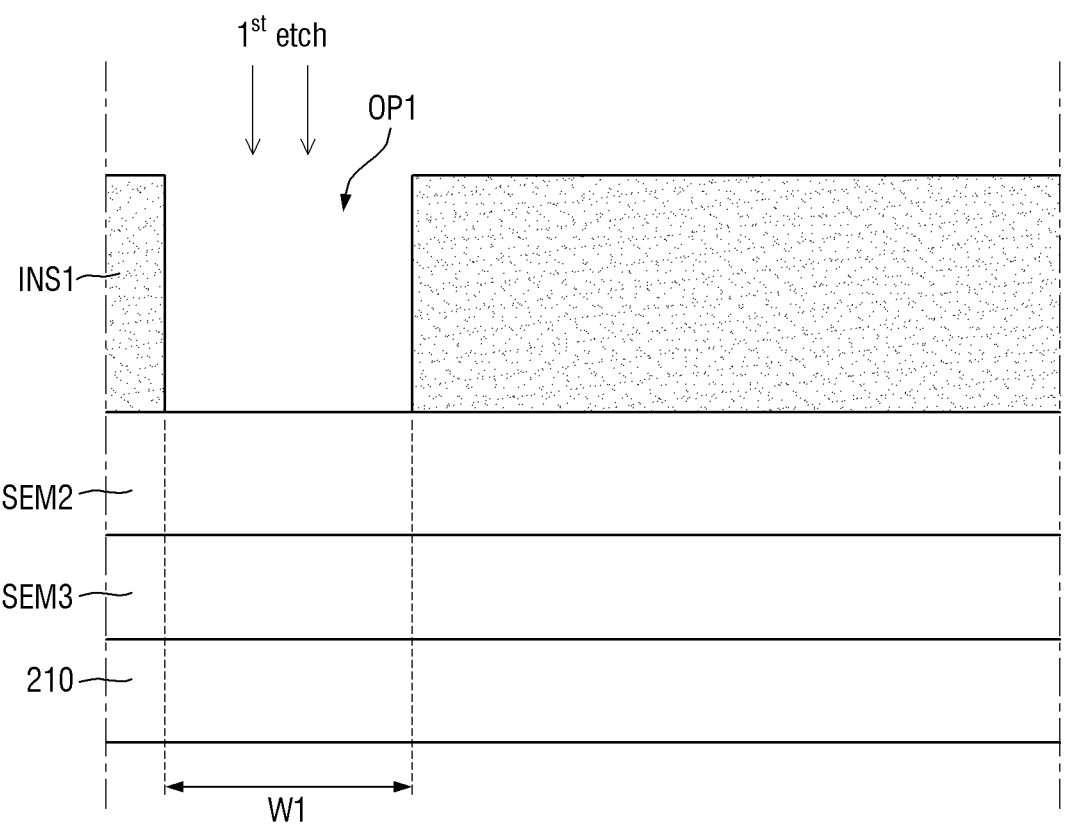
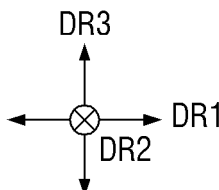

FIG. 24
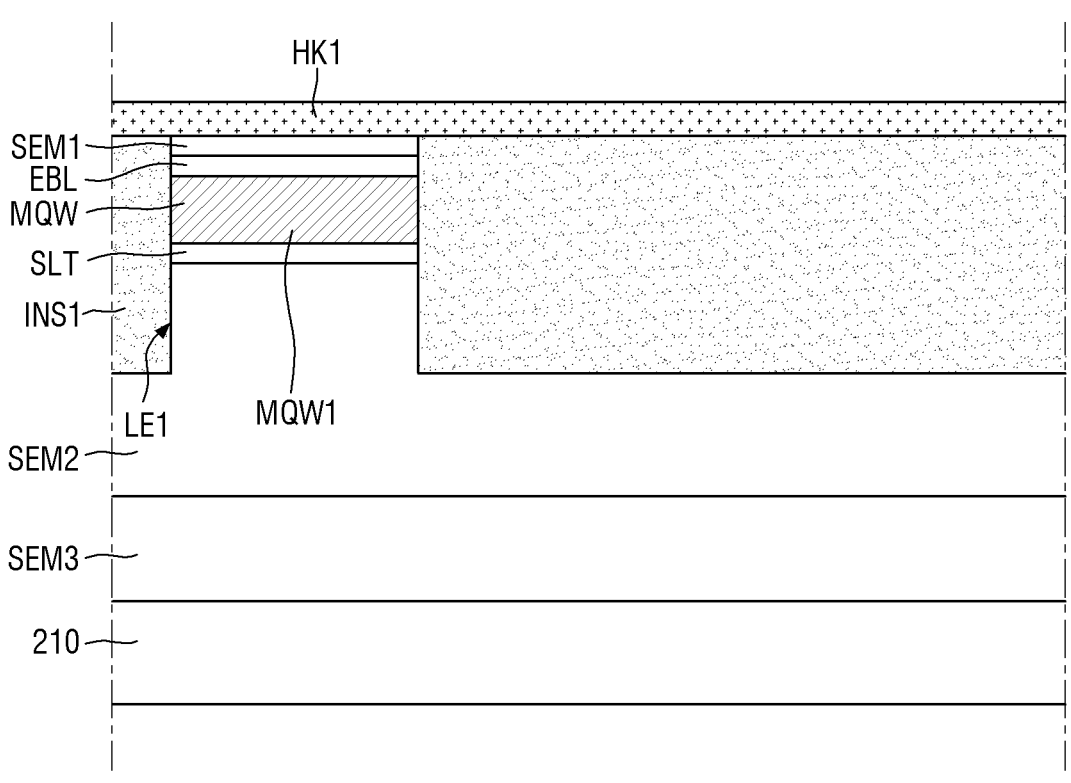
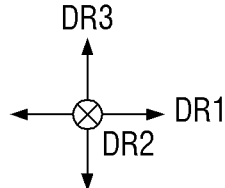

FIG. 25
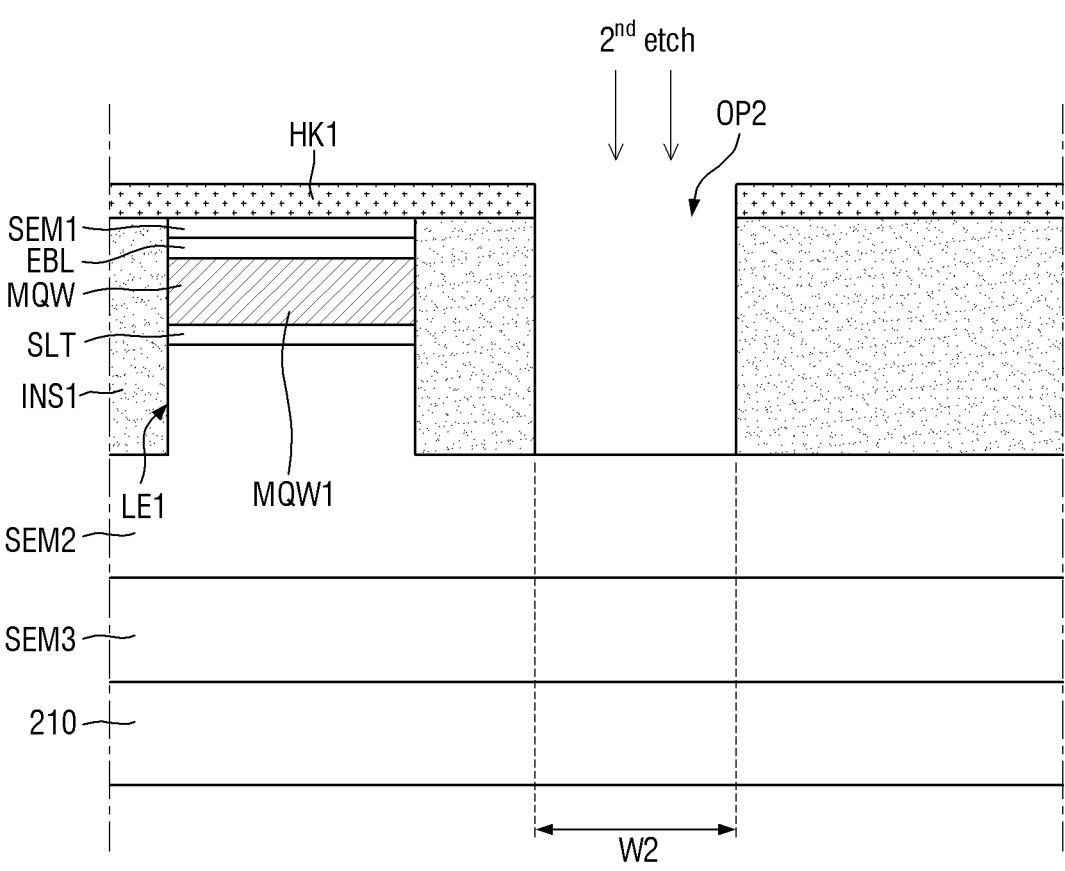
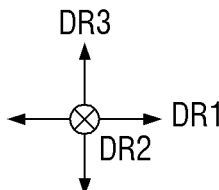

FIG. 26
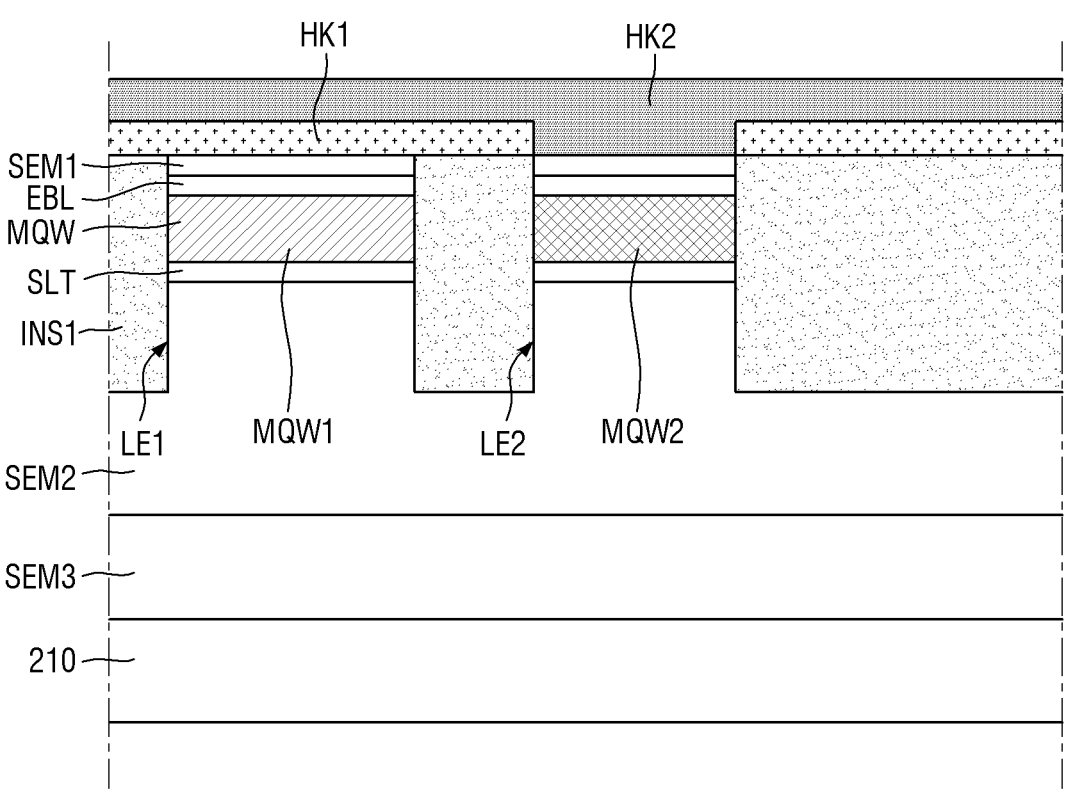
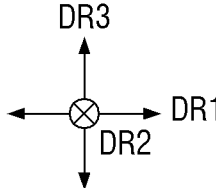

FIG. 27
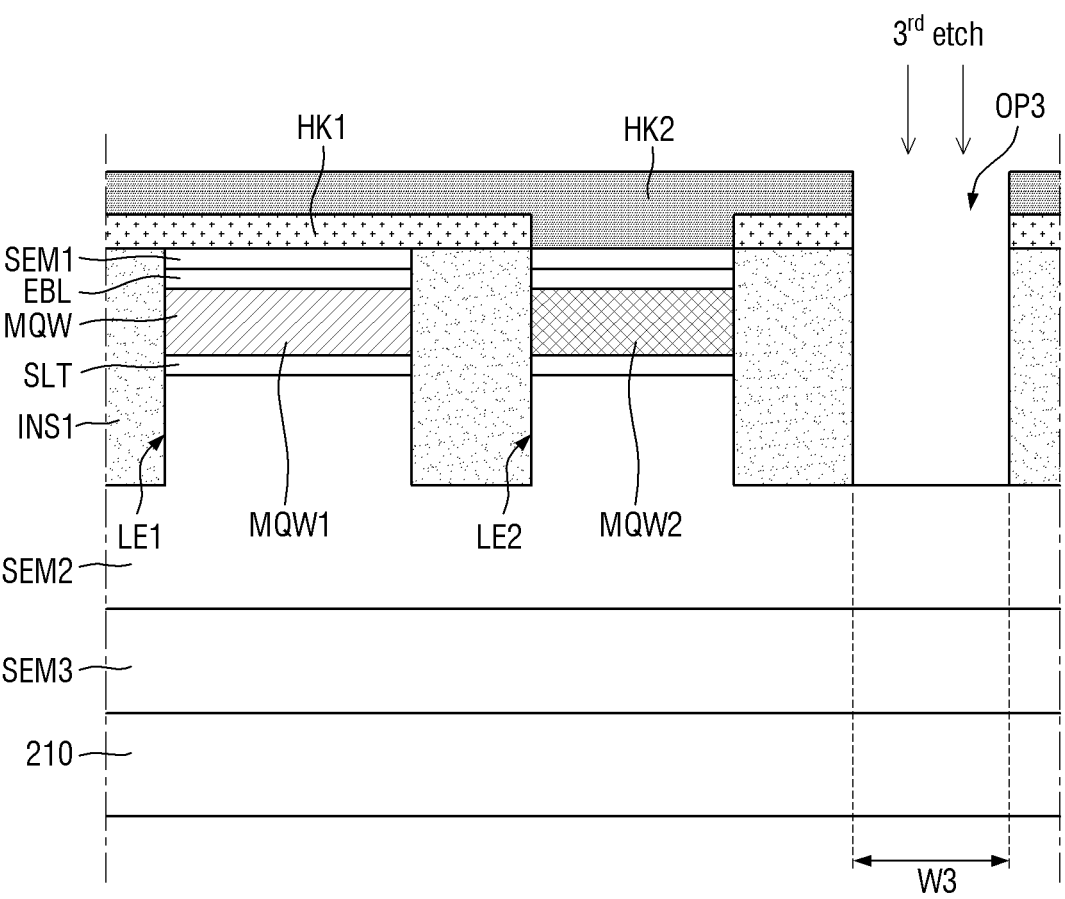
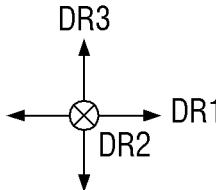

FIG. 28
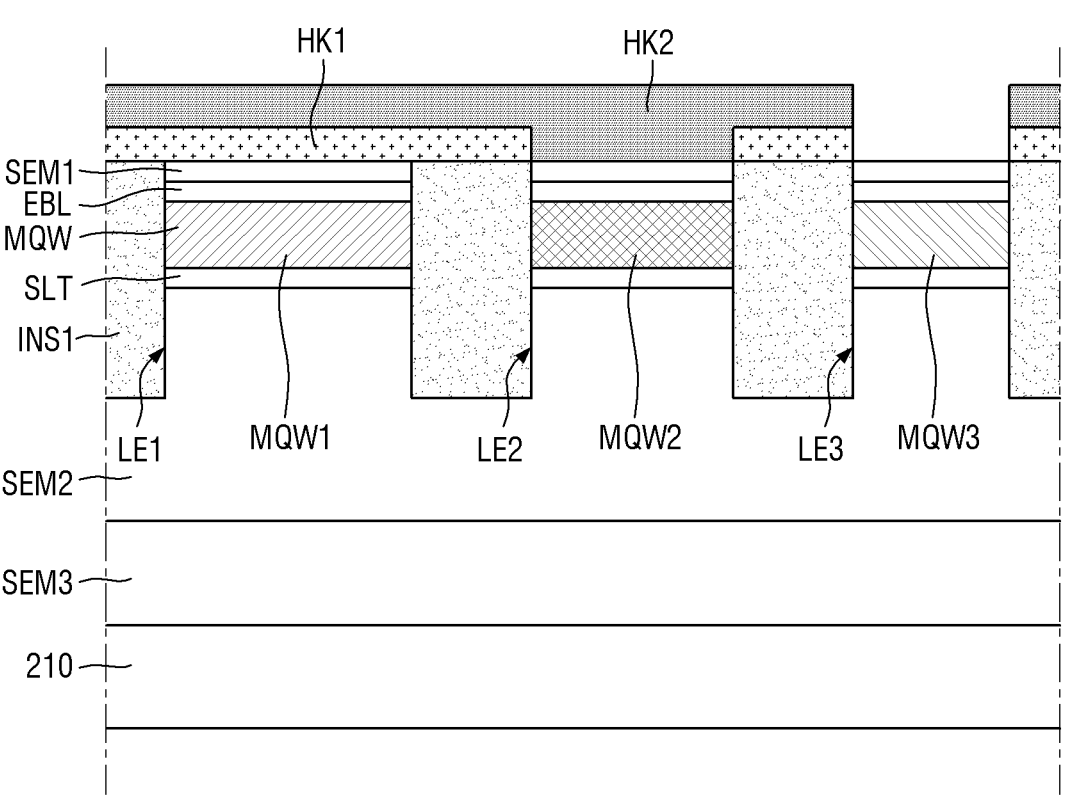
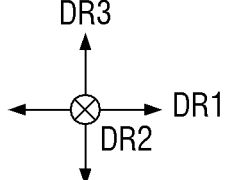
LE: LE1, LE2, LE3

LE: LE1, LE2, LE3

4$^{th}$ etch

210

SEM3

LE1    LE2    LE3    SEM2

INS1    120

SLT
MQW
EBL
SEM1
126

113
111

MQW1    MQW2    MQW3    PXC    100

110

LE: LE1, LE2, LE3

FIG. 32
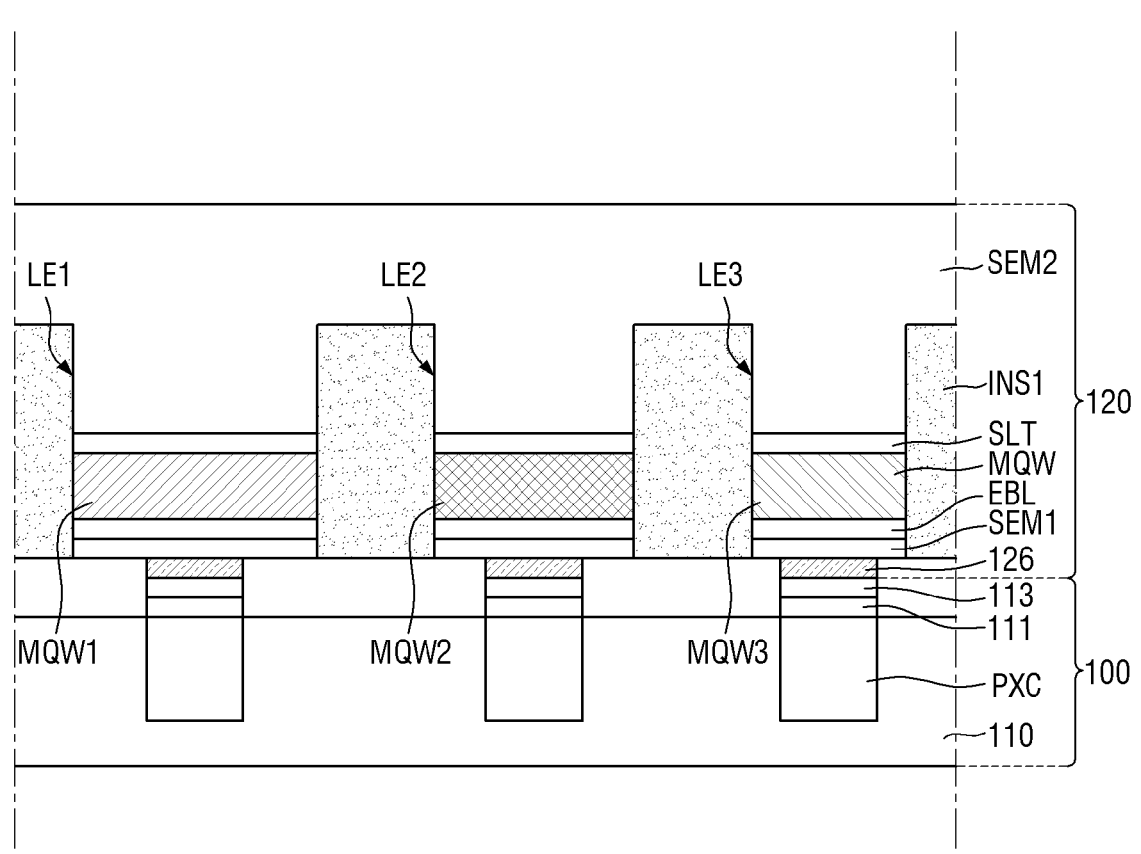
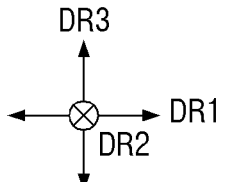
LE: LE1, LE2, LE3

FIG. 33
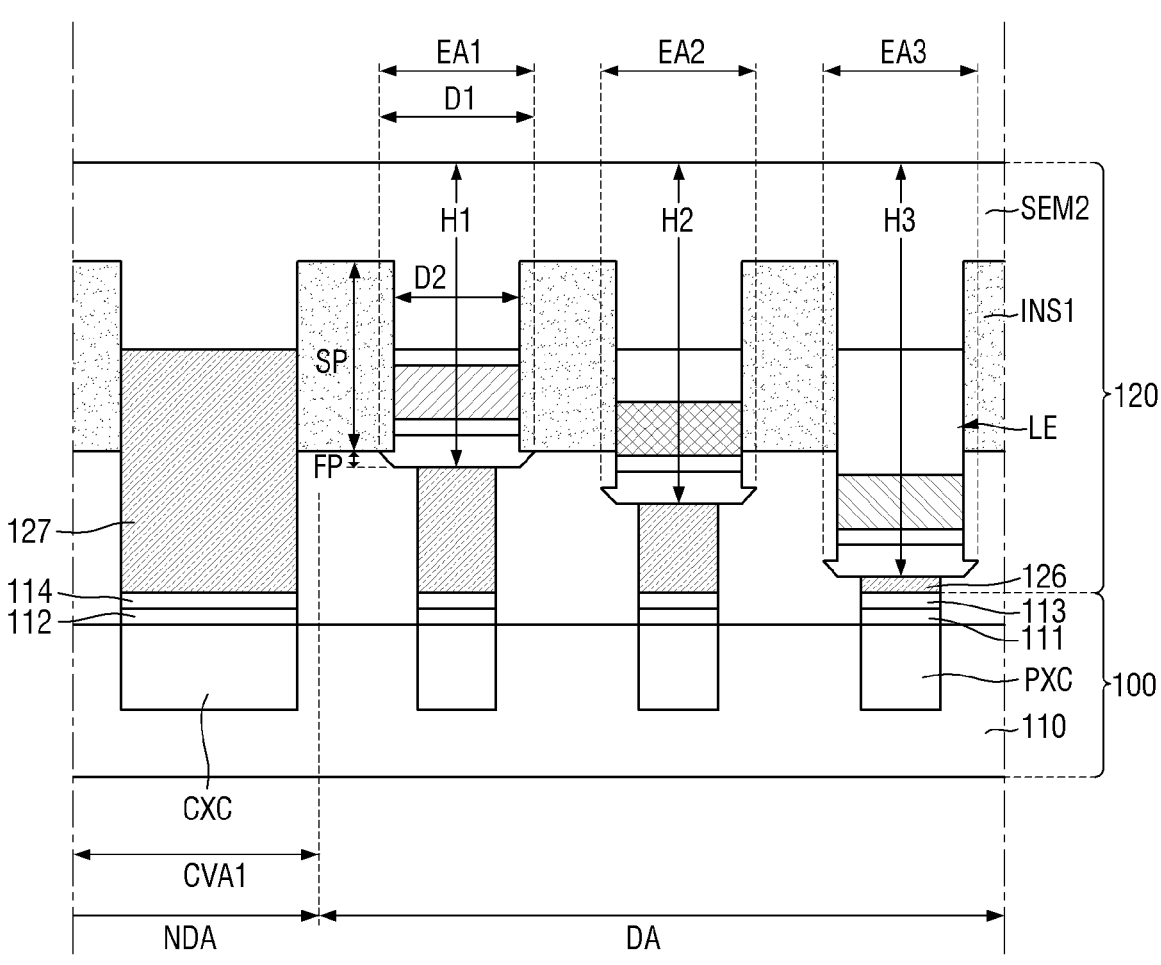
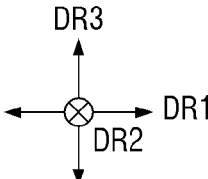

FIG. 34
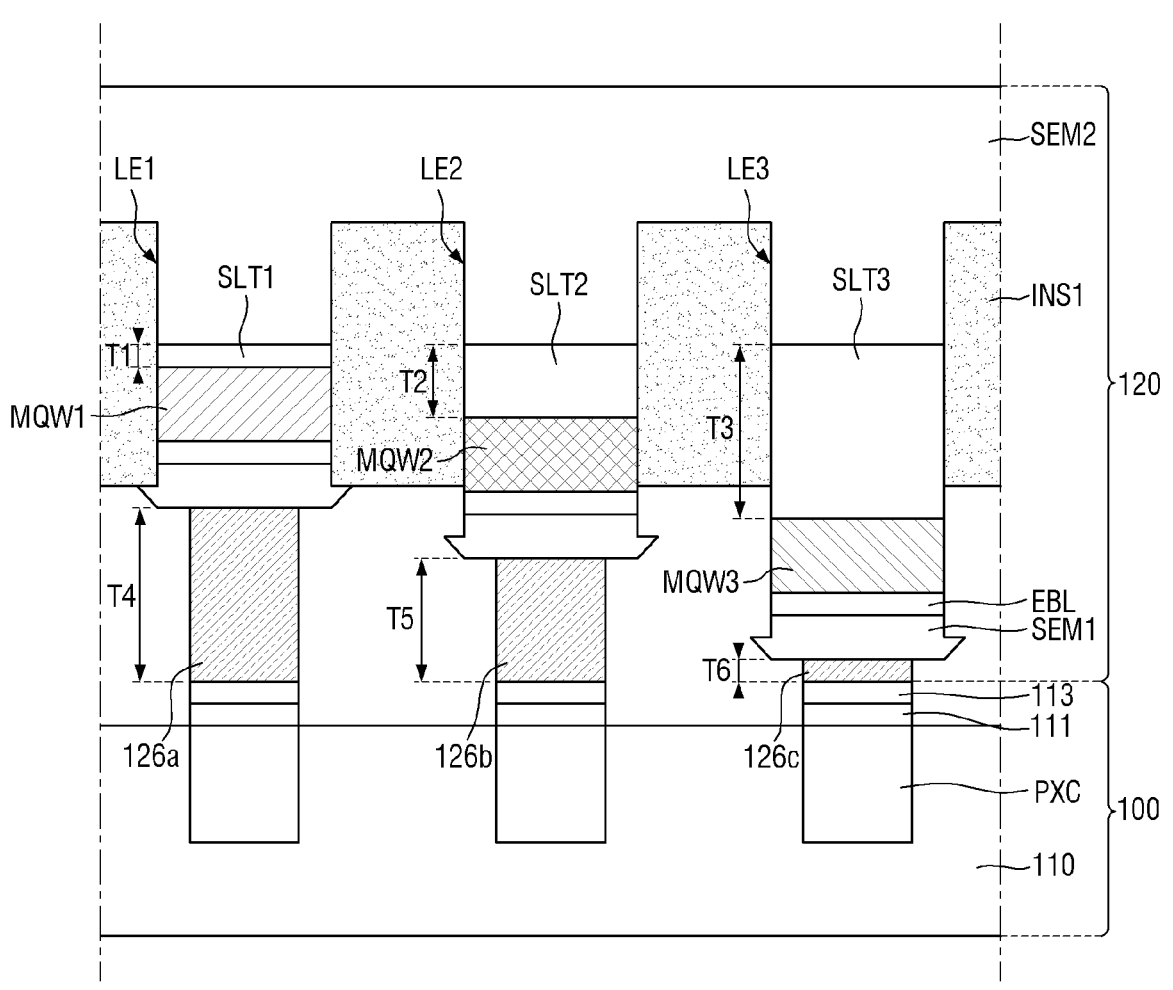
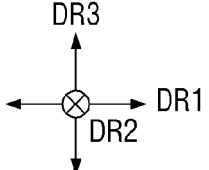
126: 126a, 126b, 126c
MQW: MQW1, MQW2, MQW3
SLT: SLT1, SLT2, SLT3
LE: LE1, LE2, LE3

(a)                                    (b)

FIG. 40
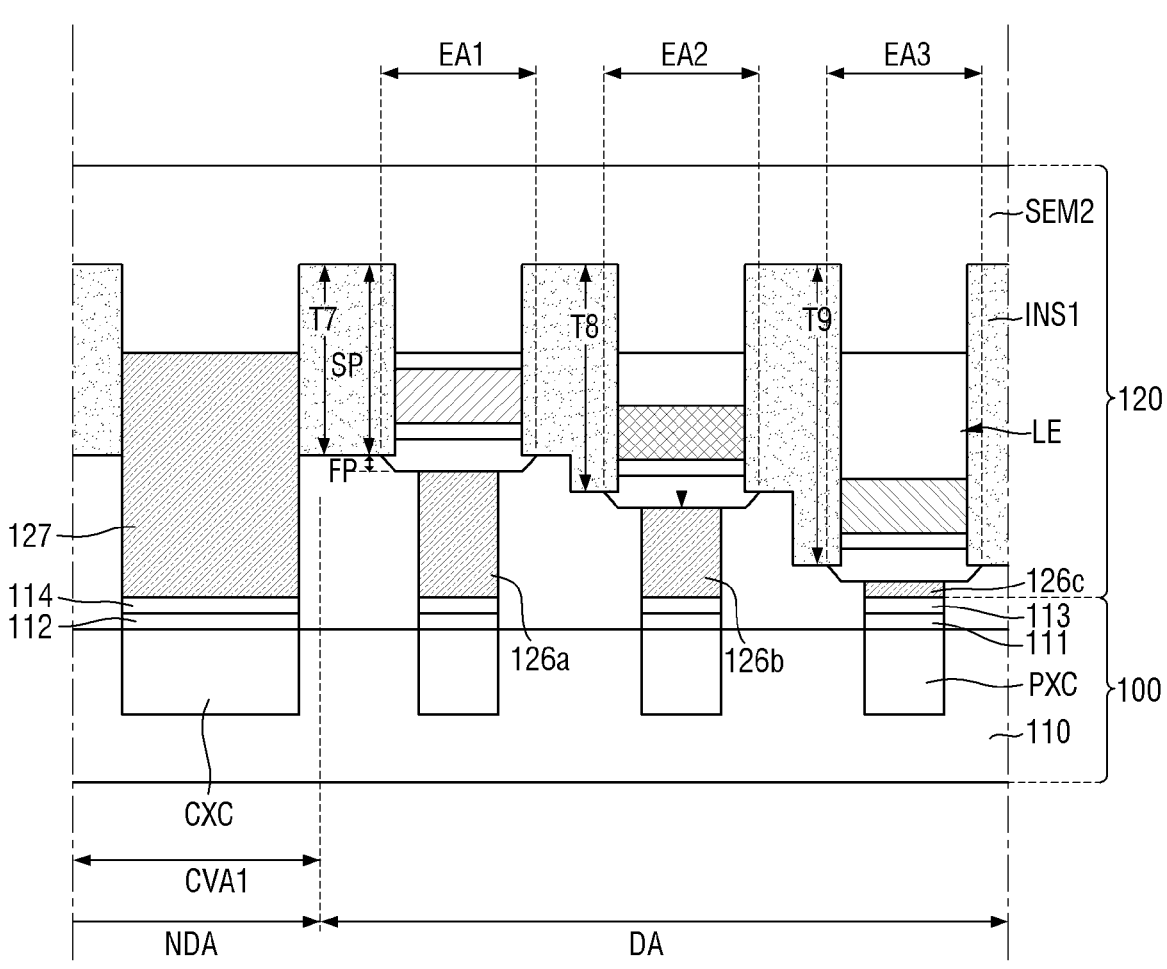
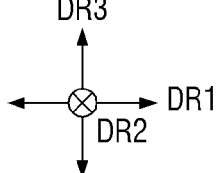
126: 126a, 126b, 126c

FIG. 41
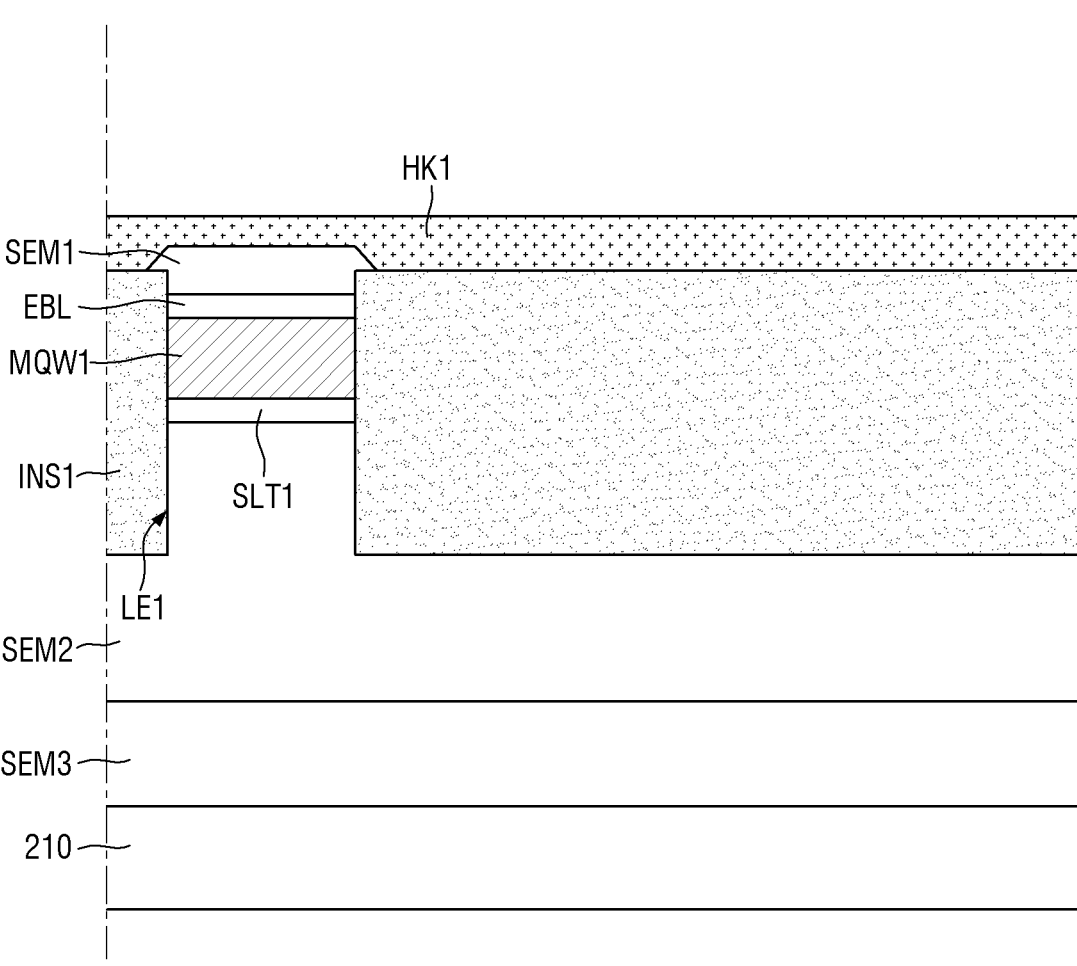
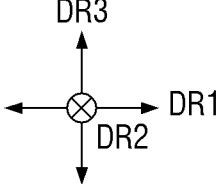

FIG. 42
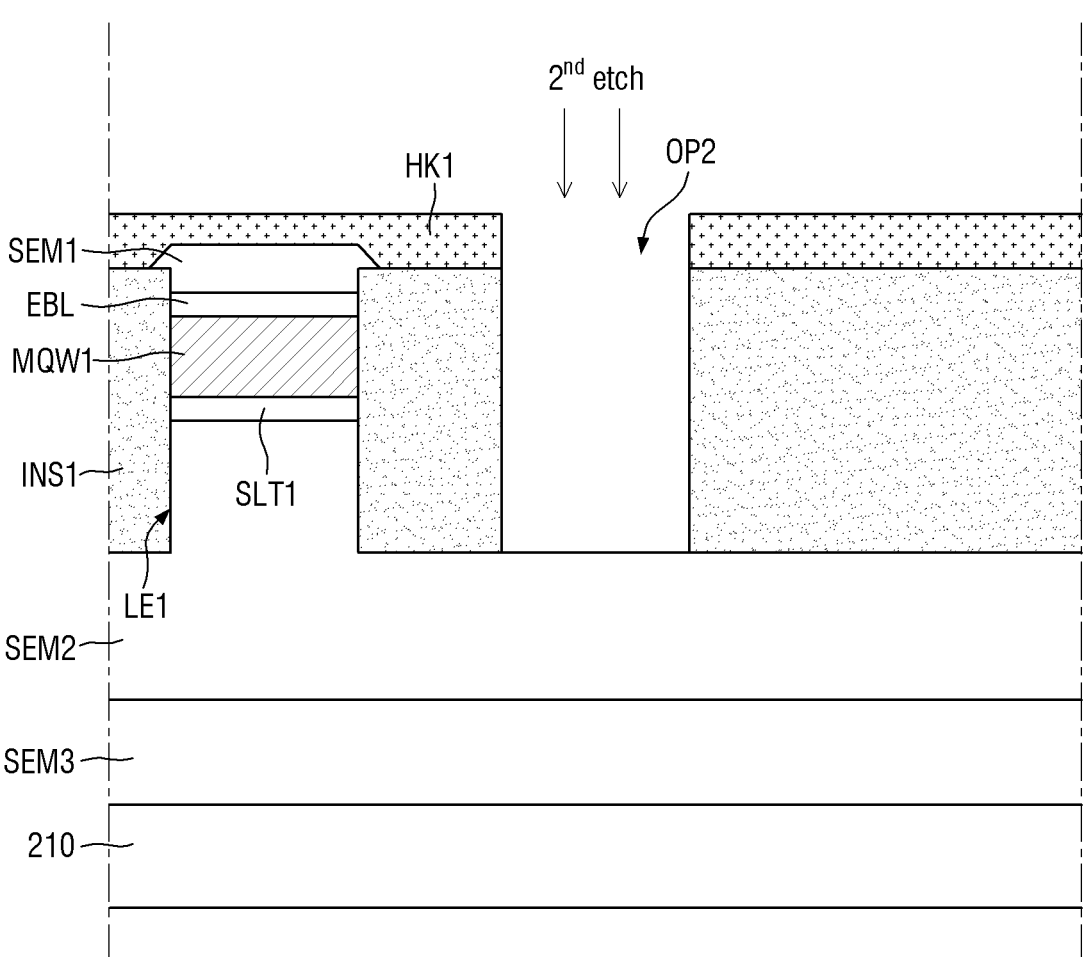
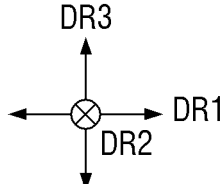

FIG. 43
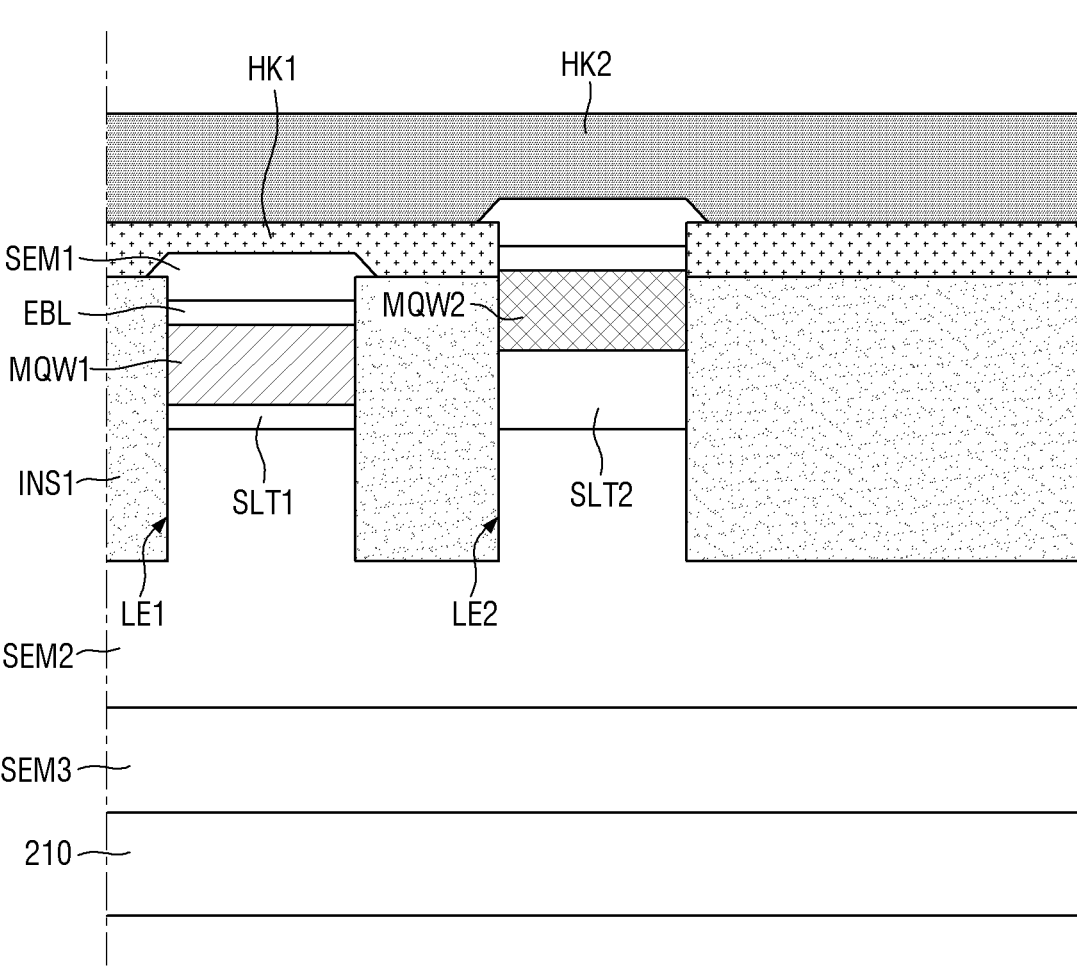
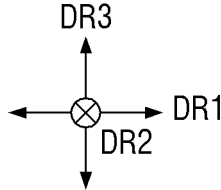

FIG. 44
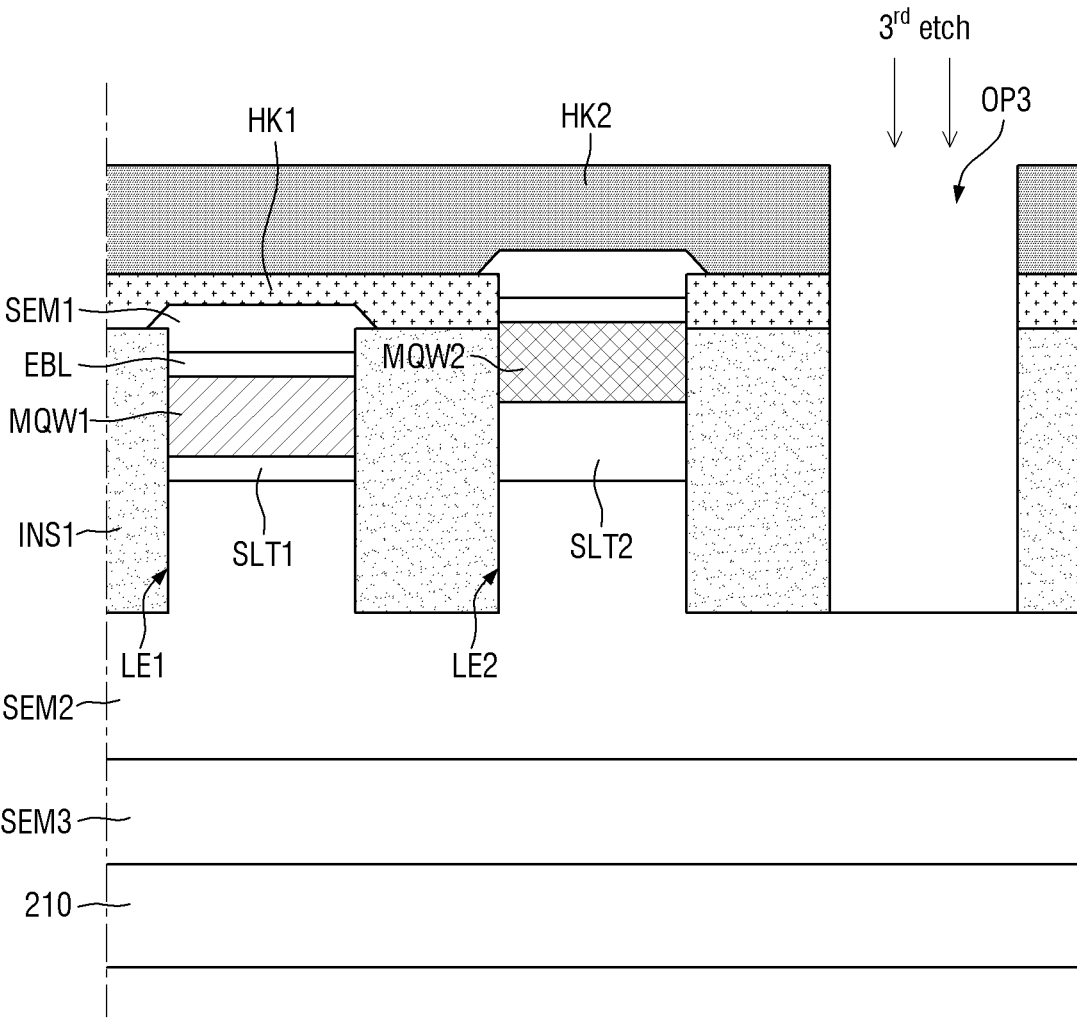
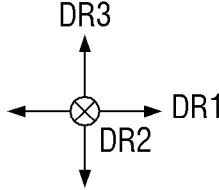

FIG. 45
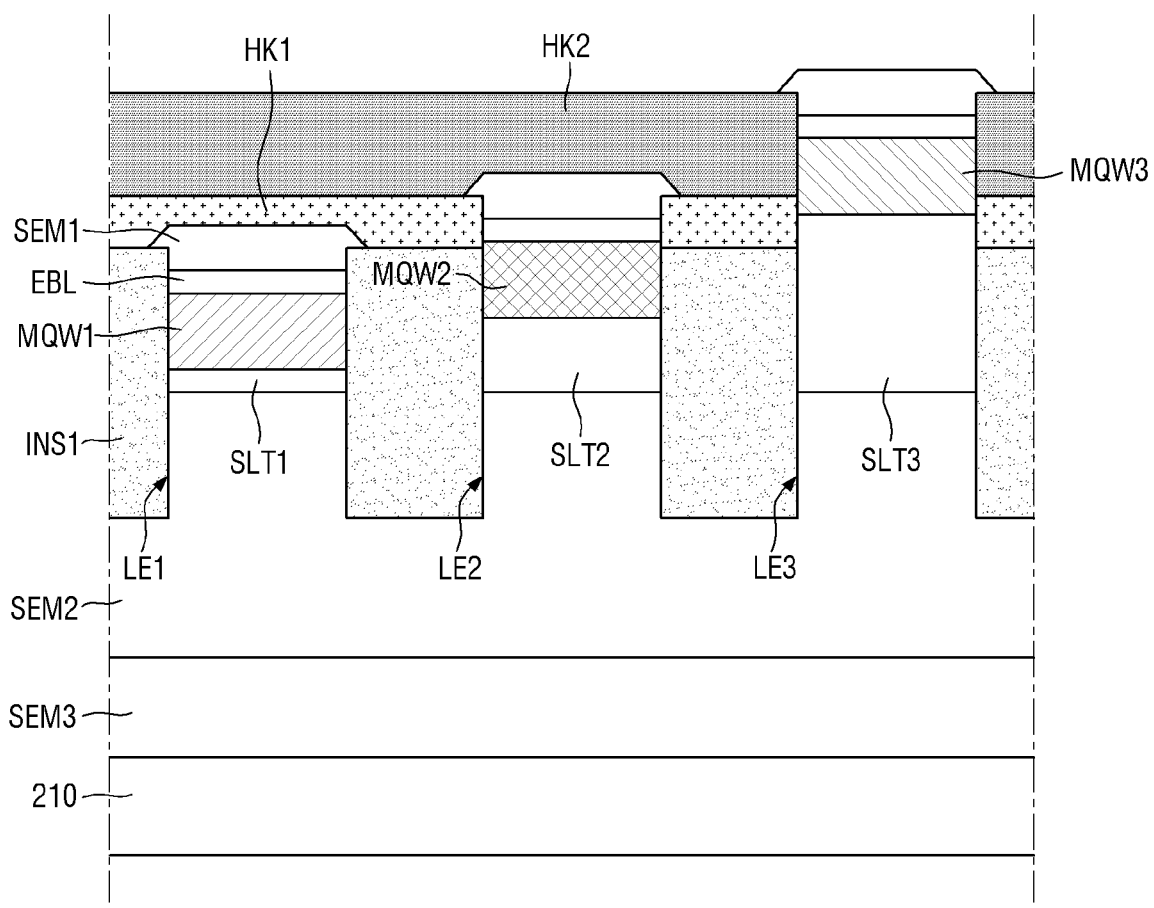
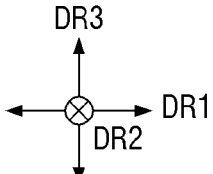
MQW: MQW1, MQW2, MQW3
SLT: SLT1, SLT2, SLT3
LE: LE1, LE2, LE3

FIG. 46
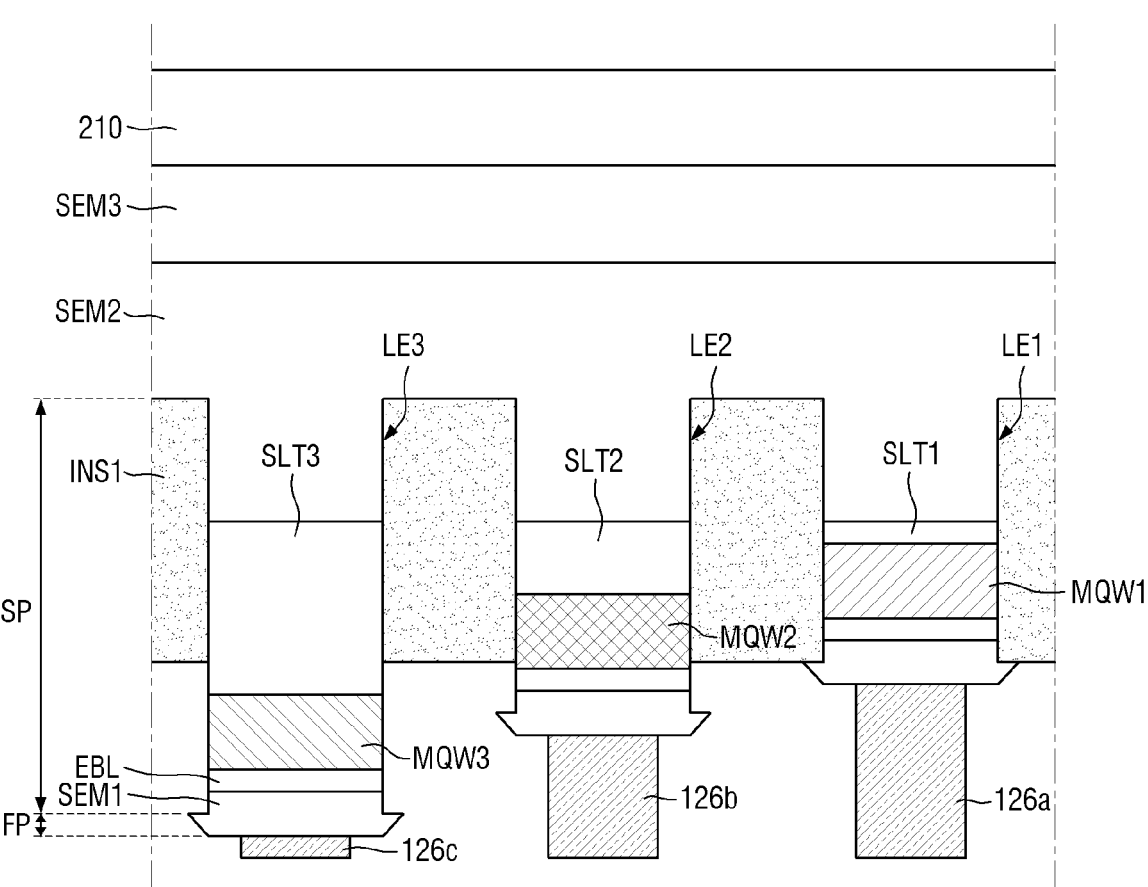
126: 126a, 126b, 126c
MQW: MQW1, MQW2, MQW3
SLT: SLT1, SLT2, SLT3
LE: LE1, LE2, LE3
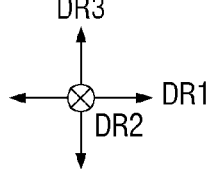

210

SEM3

SEM2

LE1          LE2          LE3

SLT1          SLT2          SLT3          INS1

MQW1

MQW2

MQW3          EBL
                                           SEM1

126a          126b          126c 113
111

PXC

110

DR3
DR1
DR2

126: 126a, 126b, 126c
MQW: MQW1, MQW2, MQW3
SLT: SLT1, SLT2, SLT3
LE: LE1, LE2, LE3

4th etch

— 210

— SEM3

— SEM2

LE1          LE2          LE3

SLT1          SLT2          SLT3          — INS1

— 120

MQW1

MQW2

MQW3          — EBL
          — SEM1

— 113
— 111

126a          126b          126c          — PXC     — 100

— 110

DR3
DR1
DR2

126: 126a, 126b, 126c
MQW: MQW1, MQW2, MQW3
SLT: SLT1, SLT2, SLT3
LE: LE1, LE2, LE3

126: 126a, 126b, 126c
MQW: MQW1, MQW2, MQW3
SLT: SLT1, SLT2, SLT3
LE: LE1, LE2, LE3

DISPLAY DEVICE WITH LIGHT EMITTING ELEMENTS HAVING DIFFERENT WIDTHS

CROSS-REFERENCE TO RELATED APPLICATION(S)

This application claims priority to and benefits of Korean Patent Application No. 10-2021-0156704 under 35 U.S.C. § 119, filed on Nov. 15, 2021, in the Korean Intellectual Property Office, the entire contents of which are incorporated herein by reference.

BACKGROUND

1. Technical Field

The disclosure relates to a display device.

2. Description of the Related Art

As the information-oriented society evolves, various demands for display devices are ever increasing. Display devices may be flat panel display devices such as liquid-crystal display devices, field emission display devices, and light-emitting display devices. Light-emitting display devices may include organic light-emitting display devices including organic light-emitting diodes as the light-emitting elements; inorganic light-emitting display devices including inorganic semiconductor elements as the light-emitting elements, and micro-LED display devices including light-emitting diodes as the light-emitting elements.

Recently, head mounted displays including a light-emitting display device have been developed. A head mounted display (HMD) is a glasses-type monitor device which may be used in virtual reality (VR) or augmented reality (AR) applications. Such displays may be worn by users in the form of glasses or a helmets that display a focus point close to the user's eyes. A high-resolution micro-LED display panel including micro light-emitting diodes may be applied to head mounted displays.

SUMMARY

Aspects of the disclosure provide a display device that may improve the light-emitting efficiency of light-emitting elements including light-emitting elements that emit a blue light.

It should be noted that the objects of the disclosure are not limited to the above-mentioned object; and other objects of the disclosure will be apparent to those skilled in the art from the following description.

According to an aspect of the disclosure, the display device may comprise contact electrodes disposed on a substrate, light-emitting elements disposed on the contact electrodes, and an insulating layer defining emission areas corresponded to the light-emitting elements. The light-emitting elements may comprise a first light-emitting element that emits a first light having a blue color, a second light-emitting element that emits a second light having a green color, and a third light-emitting element that emits a third light having a red color. A width of the first light-emitting element may be greater than a width of the second light-emitting element. The width of the first light-emitting element may be greater than a width of the third light-emitting element.

In an embodiment, the width of the second light-emitting element may be greater than or equal to the width of the third light-emitting element.

In an embodiment, the emission areas may comprise a first emission area that corresponds to the first light-emitting element, a second emission area that corresponds to the second light-emitting element, and a third emission area that corresponds to the third light-emitting element. An area of the first emission area may be greater than an area of the second emission area. An area of the first emission area may be greater than an area of the third emission area.

In an embodiment, the area of the second emission area may be greater than or equal to the area of the third emission area.

In an embodiment, each of the emission areas may have a shape of a circle or a polygon in a plan view.

In an embodiment, the light-emitting elements may comprise a fourth light-emitting element that emits the third light. The emission areas may comprise a fourth emission area that corresponds to the fourth light-emitting element.

In an embodiment, a width of the fourth light-emitting element may be equal to the width of the third light-emitting element. An area of the fourth emission area may be equal to the area of the third emission area.

In an embodiment, the area of the second emission area may be greater than or equal to a sum of the area of the third emission area and the area of the fourth emission area.

In an embodiment, each of the light-emitting elements may comprise a first semiconductor layer, a second semiconductor layer, and an active layer disposed between the first semiconductor layer and the second semiconductor layer.

In an embodiment, the first light-emitting element may comprise a first active layer. The second light-emitting element may comprise a second active layer. The third light-emitting element may comprise a third active layer. Each of the first active layer, the second active layer and the third active layer may contain indium. A content of indium in the first active layer may be smaller than a content of indium in the second active layer. The content of the indium in the first active layer may be smaller than a content of the indium in the third active layer. The content of indium in the second active layer may be smaller than the content of indium in the third active layer.

In an embodiment, the second semiconductor layer may be a common layer that extends over the light-emitting elements and may be electrically connected commonly to the light-emitting elements.

In an embodiment, the display device may further comprise connection electrodes disposed between the contact electrodes and the light-emitting elements. The light-emitting elements may be electrically connected to the contact electrodes through the connection electrodes.

According to an aspect of the disclosure, the display device may comprise contact electrodes disposed on a substrate, light-emitting elements disposed on the contact electrodes, and an insulating layer defining emission areas that correspond to the light-emitting elements. Each of the light-emitting elements may comprise a first region having a width in a first direction that varies, the first region protruding out of the insulating layer, and a second region having a width in the first direction that is constant. The first region of at least one of the light-emitting elements may be spaced apart from the insulating layer.

In an embodiment, the width in the first direction of the first region may gradually increase in a second direction perpendicular to the first direction.

In an embodiment, the light-emitting elements may have different heights in a second direction perpendicular to the first direction.

In an embodiment, the light-emitting elements may comprise a first light-emitting element that emits blue light, a second light-emitting element that emits green light, and a third light-emitting element that emits red light. A height of the first light-emitting element may be smaller than a height of the second light-emitting element. The height of the second light-emitting element may be smaller than a height of the third light-emitting element.

In an embodiment, the first region of the first light-emitting element may contact the insulating layer. The first region of the second light-emitting element and the first region of the third light-emitting element may be spaced apart from the insulating layer.

In an embodiment, each of the light-emitting elements may comprise a first semiconductor layer, an active layer, a superlattice layer and a second semiconductor layer. The first semiconductor layer, the active layer, the superlattice layer and the second semiconductor layer may be sequentially stacked in a second direction perpendicular to the first direction. A thickness of the superlattice layer of the first light-emitting element may be smaller than a thickness of the superlattice layer of the second light-emitting element. The thickness of the superlattice layer of the second light-emitting element may be smaller than a thickness of the superlattice layer of the third light-emitting element.

In an embodiment, the first semiconductor layer, the active layer and the second semiconductor layer in each of the light-emitting elements may have substantially a same thickness.

In an embodiment, a shape of the first region of each of the light-emitting elements may be a circle or a hexagon in a plan view.

In an embodiment, a surface of the first region adjacent to the substrate may be flat.

In an embodiment, the emission areas may comprise a first emission area that corresponds to the first light-emitting element, a second emission area that corresponds to the second light-emitting element, and a third emission area that corresponds to the third light-emitting element. A thickness of a portion of the insulating layer that overlaps, in a plan view, the first emission area may be smaller than a thickness of a portion of the insulating layer that overlaps, in a plan view, the second emission area. The thickness of the portion of the insulating layer that overlaps, in a plan view, the second emission area may be smaller than a thickness of a portion of the insulating layer that overlaps, in a plan view, the third emission area.

According to the above-described embodiments, in a display device including small light-emitting elements having a size of several to several tens of micrometers, the width (or area) of the light-emitting elements emitting blue light may be formed to be larger than that of other light-emitting elements, so that the light-emitting efficiency of the light-emitting elements emitting blue light can be improved. By doing so, such light-emitting elements can be applied to an ultra-high resolution display device.

According to the embodiments, the process of fabricating the display device can be simplified by forming the lengths of the light-emitting elements differently, and by forming the first region that protrudes outside the insulating layer and has a larger width in each of the light-emitting elements, it is possible to improve the light-emitting efficiency of each of the light-emitting elements.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 1 is a schematic view showing a layout of a display device according to an embodiment of the disclosure.

FIG. 2 is a schematic view showing a layout of area A of FIG. 1.

FIG. 4 is a schematic cross-sectional view showing an example of the display panel taken along line A-A' of FIG. 2.

FIG. 20 is a flowchart illustrating an example of step S120 of FIG. 19.

FIGS. 21 to 32 are schematic cross-sectional views illustrating the method of fabricating a display device according to an embodiment of the disclosure.

FIG. 33 is a schematic cross-sectional view showing an example of a display panel of a display device according to an embodiment of the disclosure.

FIG. 34 is a schematic cross-sectional view showing an example of light-emitting elements according to an embodiment.

5

Figure 36:
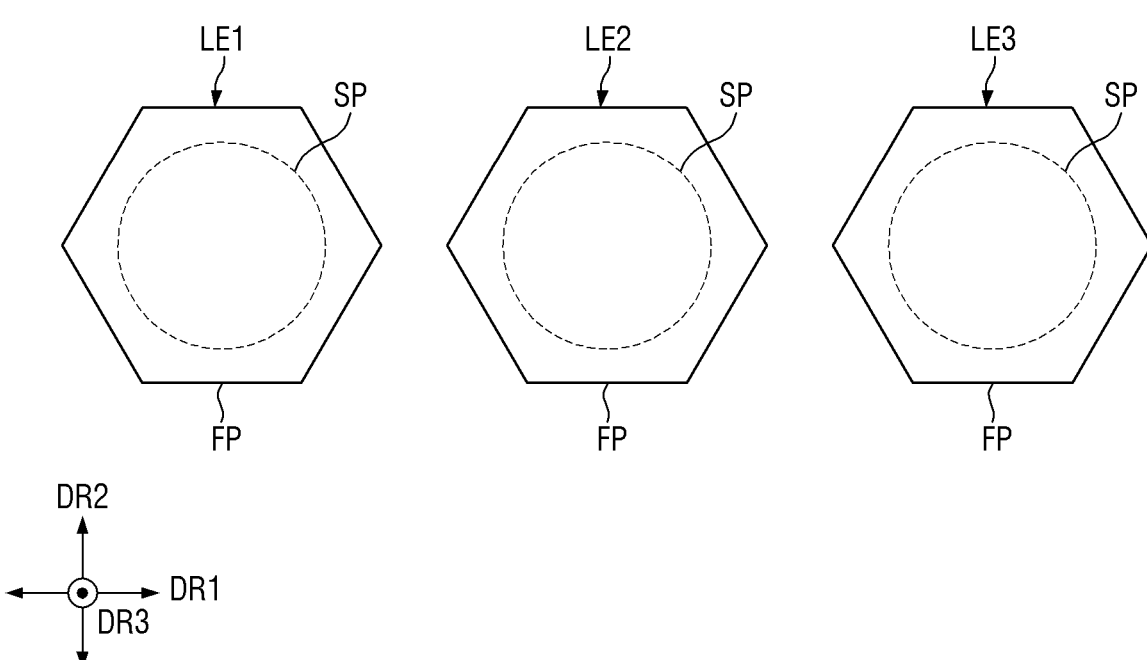

FIG. 36 is a schematic view showing an example of the layout of light-emitting elements according to an embodiment.

Figure 37:
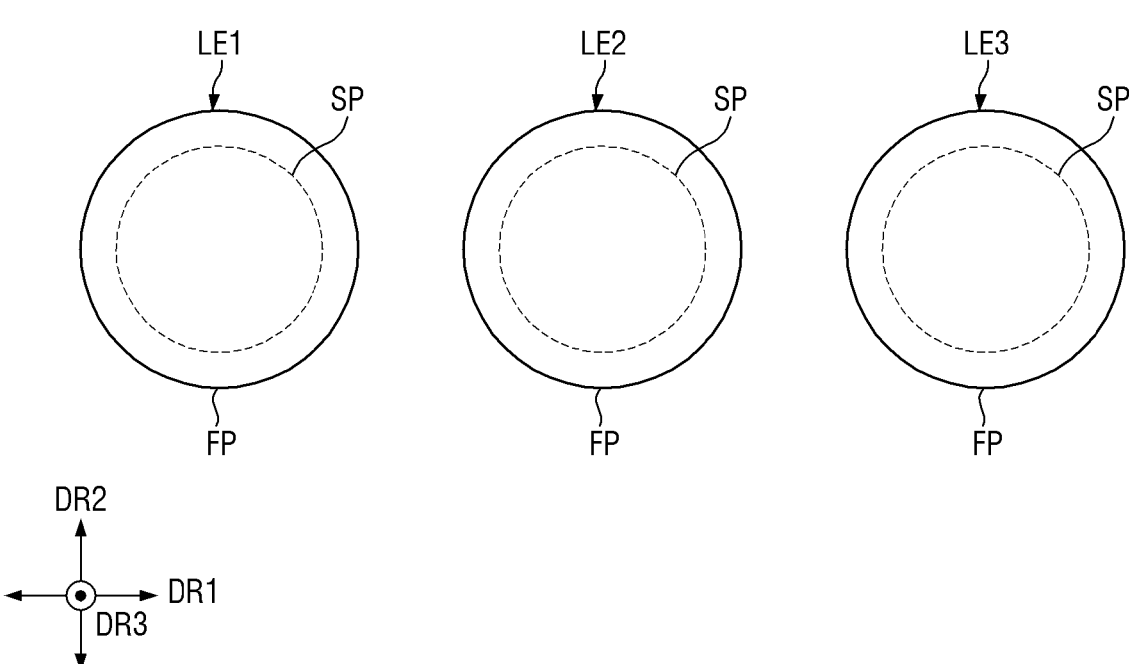

FIG. 37 is a schematic view showing an example of layout of light-emitting elements according to an embodiment.

Figure 38:
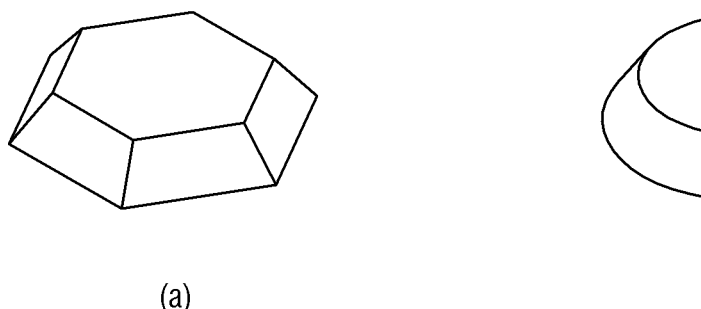

FIG. 38 is a schematic perspective view showing an example of a first semiconductor layer of a light-emitting element according to an embodiment.

Figure 39:
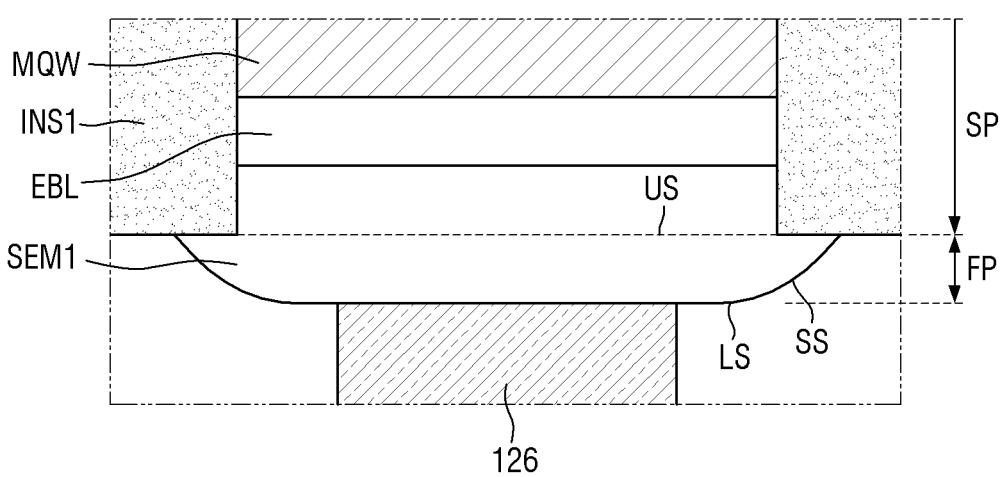

FIG. 39 is a schematic cross-sectional view showing an example of a first semiconductor layer of a light-emitting element according to an embodiment.

FIG. 40 is a schematic cross-sectional view showing an example of a display panel of a display device according to an embodiment of the disclosure.

FIGS. 41 to 49 are schematic cross-sectional views for illustrating the method of fabricating a display device according to an embodiment of the disclosure.

Figure 50:
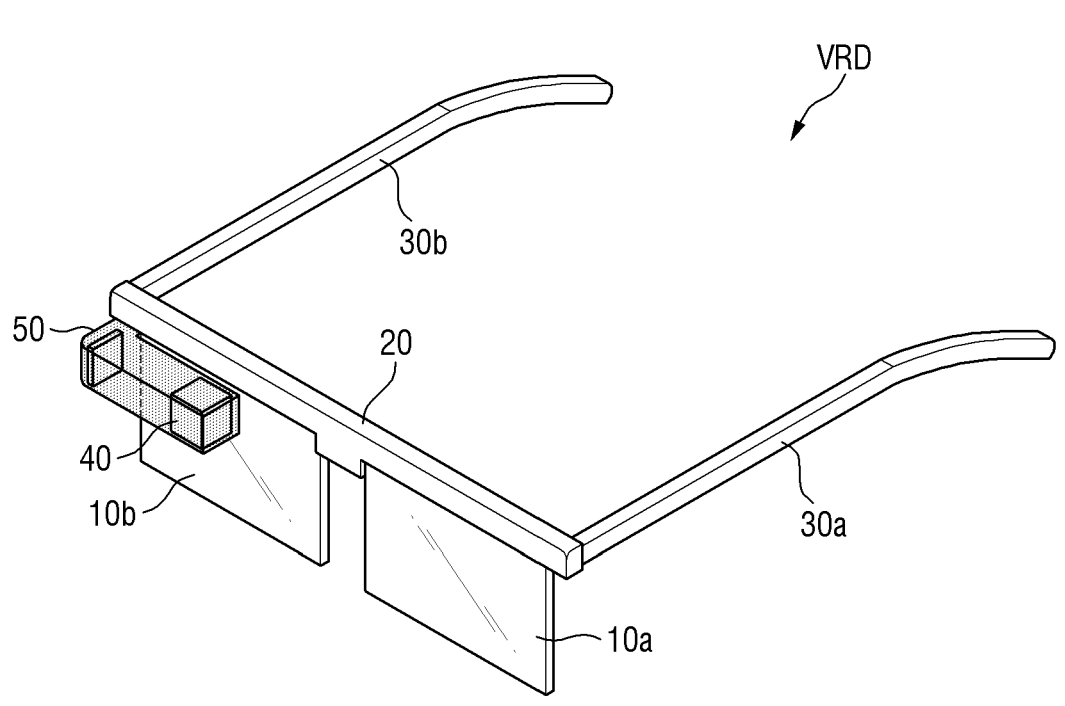

FIG. 50 is a schematic view of a virtual reality device including a display device according to an embodiment.

Figure 51:
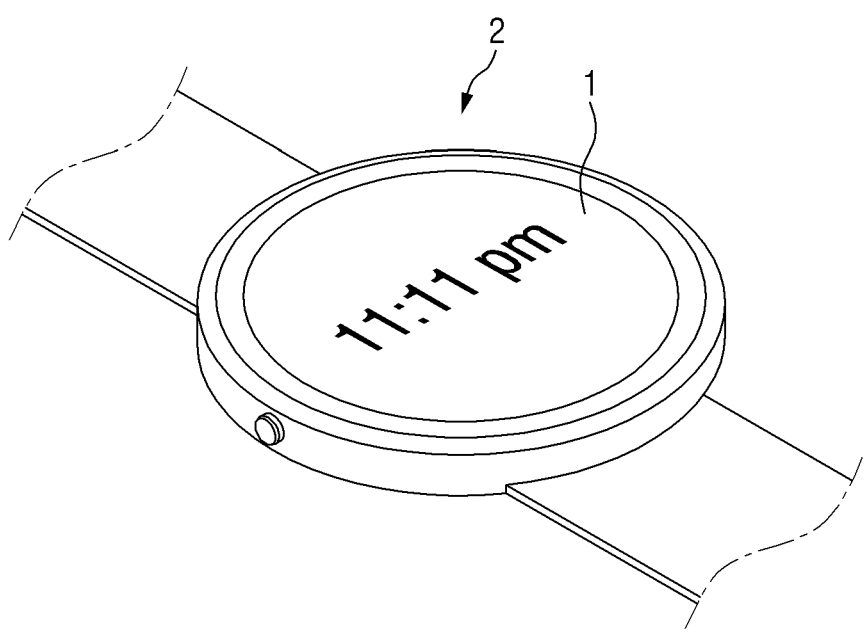

FIG. 51 is a schematic view a smart device including a display device according to an embodiment of the disclosure.

Figure 52:
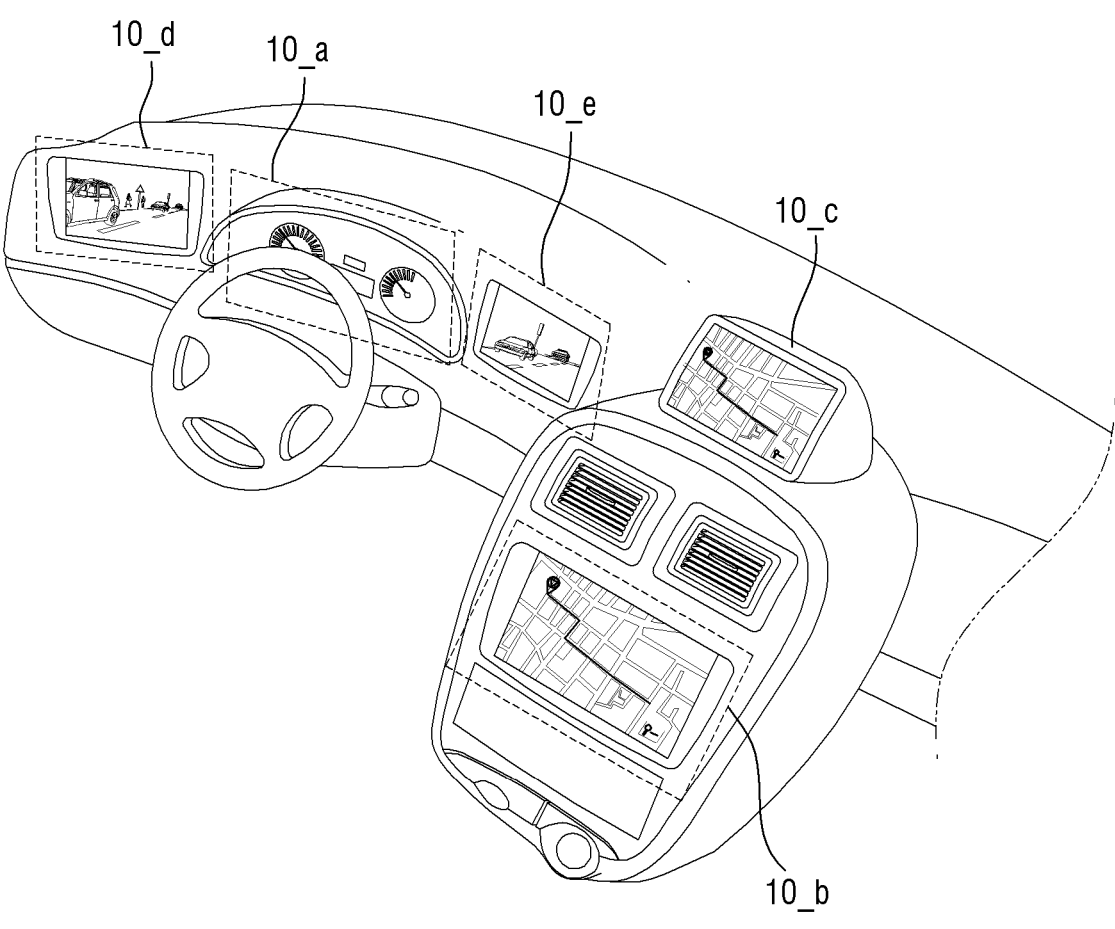

FIG. 52 is a schematic view of a vehicle display device according to an embodiment.

Figure 53:
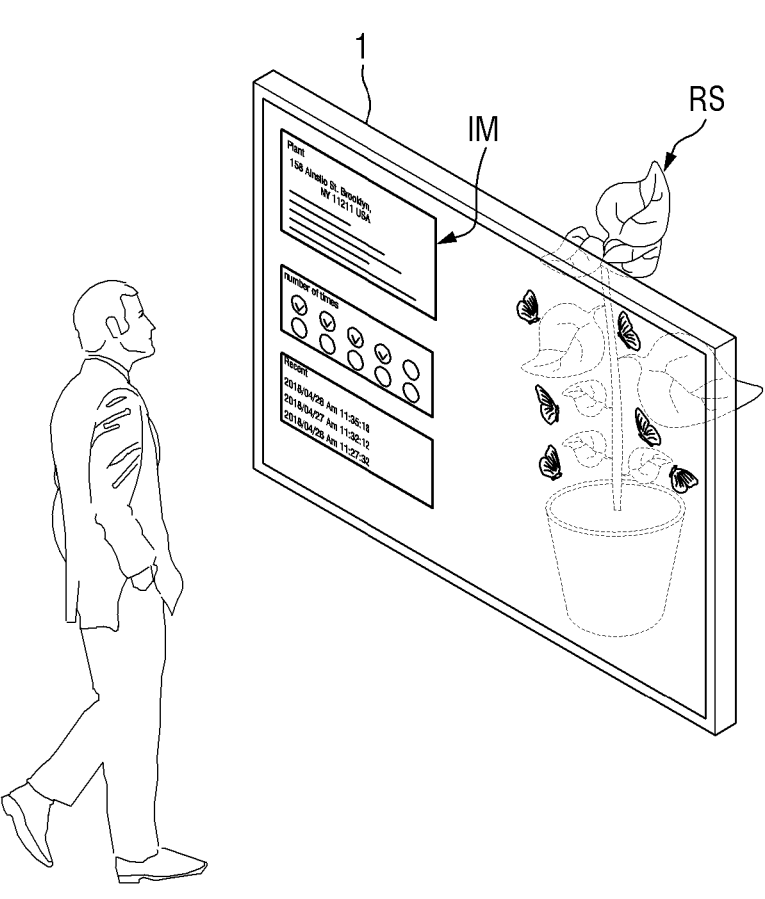

FIG. 53 is a view showing an example of a transparent display device including a display device according to an embodiment.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and etc. may be used herein to describe various elements, these elements should not be limited by these terms. These terms are used to distinguish one element from another element. For instance, a first element discussed below could be a second element without departing from the teachings of the disclosure. Similarly, the second element could also be termed the first element.

Each of the features of the various embodiments of the disclosure may be combined with each other, in part or in whole, and various interlocking and driving are possible. Each embodiment may be implemented independently of each other or may be implemented together in an association.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the accompanying drawings.

Figure 3:
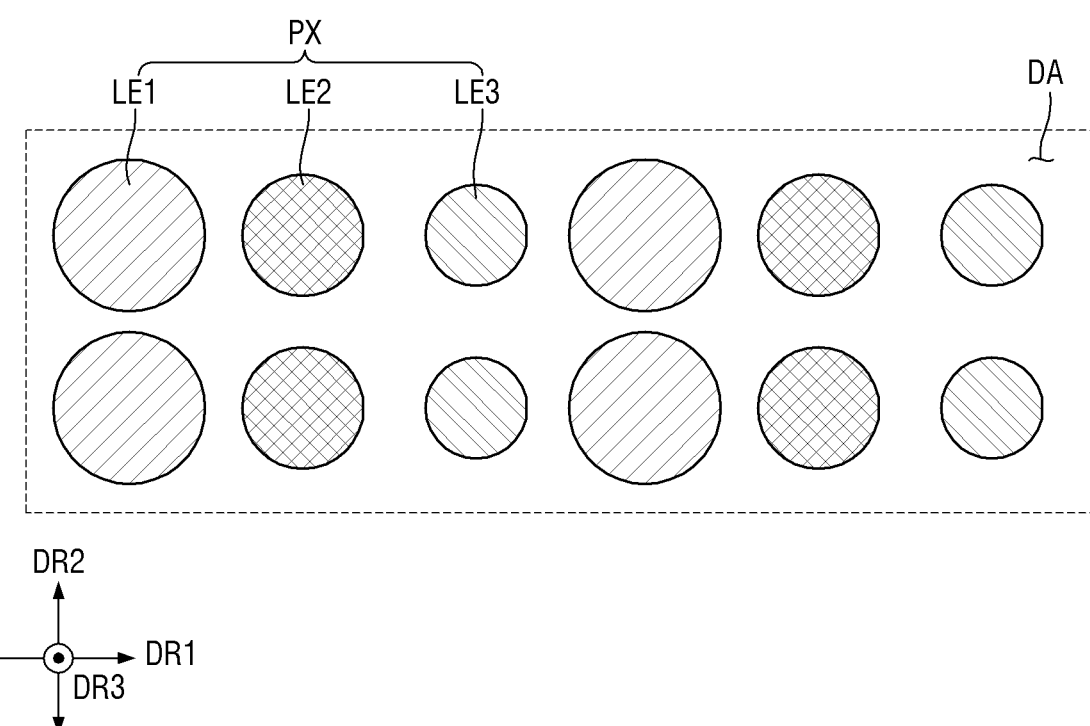
FIG. 3 is a schematic view showing a layout of pixels.

FIG. 1 is a schematic view showing a layout of a display device according to an embodiment of the disclosure. FIG. 2 is a schematic view showing a layout of area A of FIG. 1. FIG. 3 is a schematic view showing a layout of pixels.

In the example shown in FIGS. 1 to 3, the display device according to the embodiment is a micro light-emitting diode display device including a micro light-emitting diode as a light-emitting element. It should be understood, however, that the disclosure is not limited thereto.

In the example shown in FIGS. 1 to 3, the display device according to the embodiment is implemented as a light-emitting diode on silicon (LEDoS) micro-display, i.e., light-emitting diodes are disposed on a semiconductor circuit board formed via a semiconductor process. It should be understood, however, that embodiments of the disclosure are not limited thereto.

In FIGS. 1 to 3, a first direction DR1 indicates the horizontal direction of the display panel 10, a second direction DR2 indicates the vertical direction of the display panel 10, and a third direction DR3 indicates the thickness direction of the display panel 10. As used herein, the terms "left," "right," "upper" and "lower" sides indicate relative positions when the display panel 10 is viewed from the top. For example, the right side refers to one side in the first direction DR1, the left side refers to the other side in the first direction DR1, the upper side refers to one side in the second direction DR2, and the lower side refers to the other side in the second direction DR2. The upper portion refers to the side indicated by the arrow of the third direction DR3, while the lower portion refers to the opposite side in the third direction DR3.

Referring to FIGS. 1 to 3, a display device 1 according to an embodiment includes a display panel 10 including a display area DA and a non-display area NDA.

The display panel 10 may have a rectangular shape having longer sides in the first direction DR1 and shorter sides in the second direction DR2 in a plan view. It should be understood, however, that the shape of the display panels 10 is not limited thereto. It may have a polygonal, circular, oval, or irregular shape other than the rectangular shape.

In the display area DPA, images can be displayed. In the non-display area NDA, no image may be displayed. The shape of the display area DA may follow the shape of the display panel 10 in a plan view. In the example shown in FIG. 1, the display area DA has a rectangular shape in a plan view. The display area DA may be disposed at the central area of the display panel 10. The non-display area NDA may be disposed around the display area DA. The non-display area NDA may surround the display area DA.

The display area DA of the display panel 10 may include pixels PX. Each of the pixels PX may be defined as a minimum light-emitting unit for displaying white light.

Each of the pixels PX may include first to third light-emitting elements LE1, LE2 and LA3 emitting lights. Although each of the pixels PX includes three light-emitting elements LEA, LE2 and LE3 according to the embodiment of the disclosure, embodiments of the disclosure are not limited thereto. Although each of the light-emitting elements LE1, LE2 and LE3 has a circular shape in a plan view in the example shown, embodiments of the disclosure are not limited thereto.

The first light-emitting elements LE1 may emit first light. The first light may be light in a blue wavelength range. For example, the main peak wavelength B-peak of the first light may range from approximately 370 nm to 460 nm, but embodiments of the disclosure are not limited thereto.

The second light-emitting elements LE2 may emit second light. The second light may be light in a green wavelength range. For example, the main peak wavelength G-peak of the second light may range from approximately 480 nm to 560 nm, but embodiments of the disclosure are not limited thereto.

The third light-emitting elements LE3 may emit third light. The third light may be light in a red wavelength range. For example, the third light may be light in a red wavelength range. The red wavelength may range from approximately 600 nm to 750 nm.

The first light-emitting elements LE1, the second light-emitting elements LE2 and the third light-emitting elements LE3 may be arranged sequentially and repeatedly in the first direction DR1. For example, the first light-emitting elements LE1, the second light-emitting elements LE2 and the third light-emitting elements LE3 may be arranged in the order of the first light-emitting element LE1, the second light-emitting element and the third light-emitting element LE3 in the first direction DR1. The first light-emitting elements LE1 may be arranged in the second direction DR2. The second light-emitting elements LE2 may be arranged in the second direction DR2. The third light-emitting elements LE3 may be arranged in the second direction DR2.

The non-display area NDA may include a first common voltage supply area CVA1, a second common voltage supply area CVA2, a first pad area PDA1, and a second pad area PDA2.

The first common voltage supply area CVA1 may be disposed between the first pad area PDA1 and the display area DA. The second common voltage supply area CVA2 may be disposed between the second pad area PDA2 and the display area DA. Each of the first common voltage supply area CVA1 and the second common voltage supply area CVA2 may include common voltage supply units CVS connected to the common electrode CE. The common voltage may be applied to the light-emitting elements LE1, LE2 and LE3 through the common voltage supply units CVS.

The common voltage supply units CVS of the first common voltage supply area CVA1 may be electrically connected to one of first pads PD1 of the first pad area PDA1. For example, the common voltage supply units CVS of the first common voltage supply area CVA1 may receive the common voltage from one of the first pads of the first pad area PDA1.

The common voltage supply units CVS of the second common voltage supply area CVA2 may be electrically connected to one of second pads PD2 of the second pad area PDA2. For example, the common voltage supply units CVS of the second common voltage supply area CVA2 may receive the common voltage from one of the second pads of the second pad area PDA2.

Although the common electrode connection area CPA completely surrounds the display area DA in the example shown in FIG. 1, the embodiment of the specification is not limited thereto. For example, the common electrode connection area CPA may be disposed on one side, both sides, or at least three sides of the display area DA.

The first pad area PDA1 may be located at the upper portion of the display panel 10. The first pad area PDA1 may include first pads PD1 electrically connected to an external circuit board.

The second pad area PDA2 may be located on the lower side of the display panel 10. The second pad area PDA2 may include second pads PD2 for electrical connection to an external circuit board. The second pad area PDA2 may be eliminated.

Figure 4:
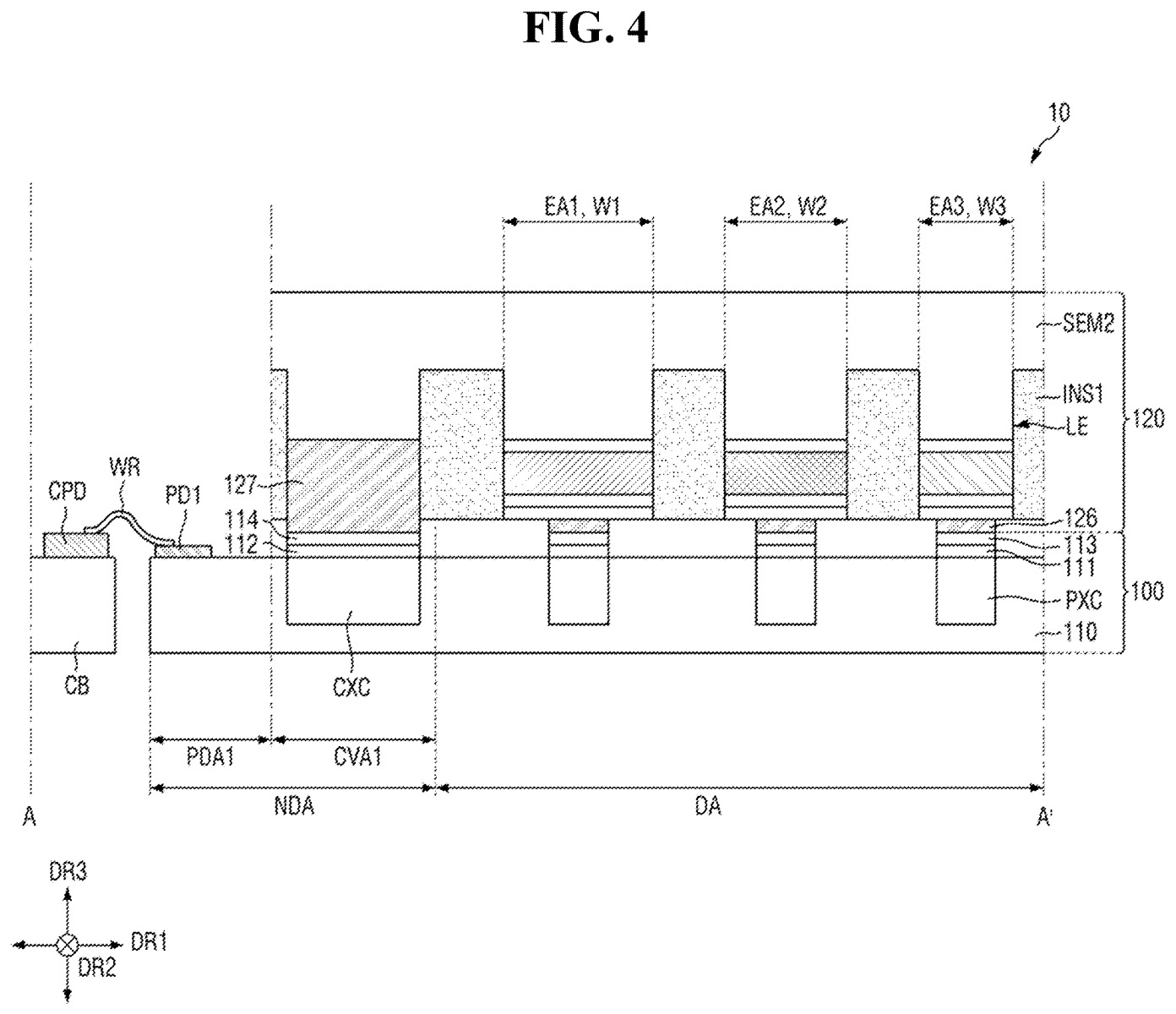
Figure 5:
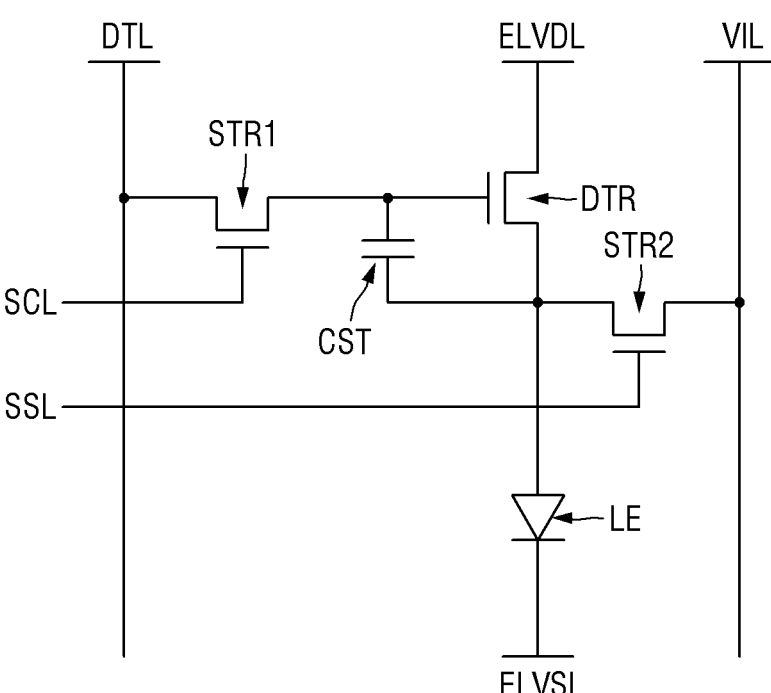
FIG. 5 is a schematic diagram of an equivalent circuit of a pixel of a display device according to an embodiment of the disclosure.
Figure 6:
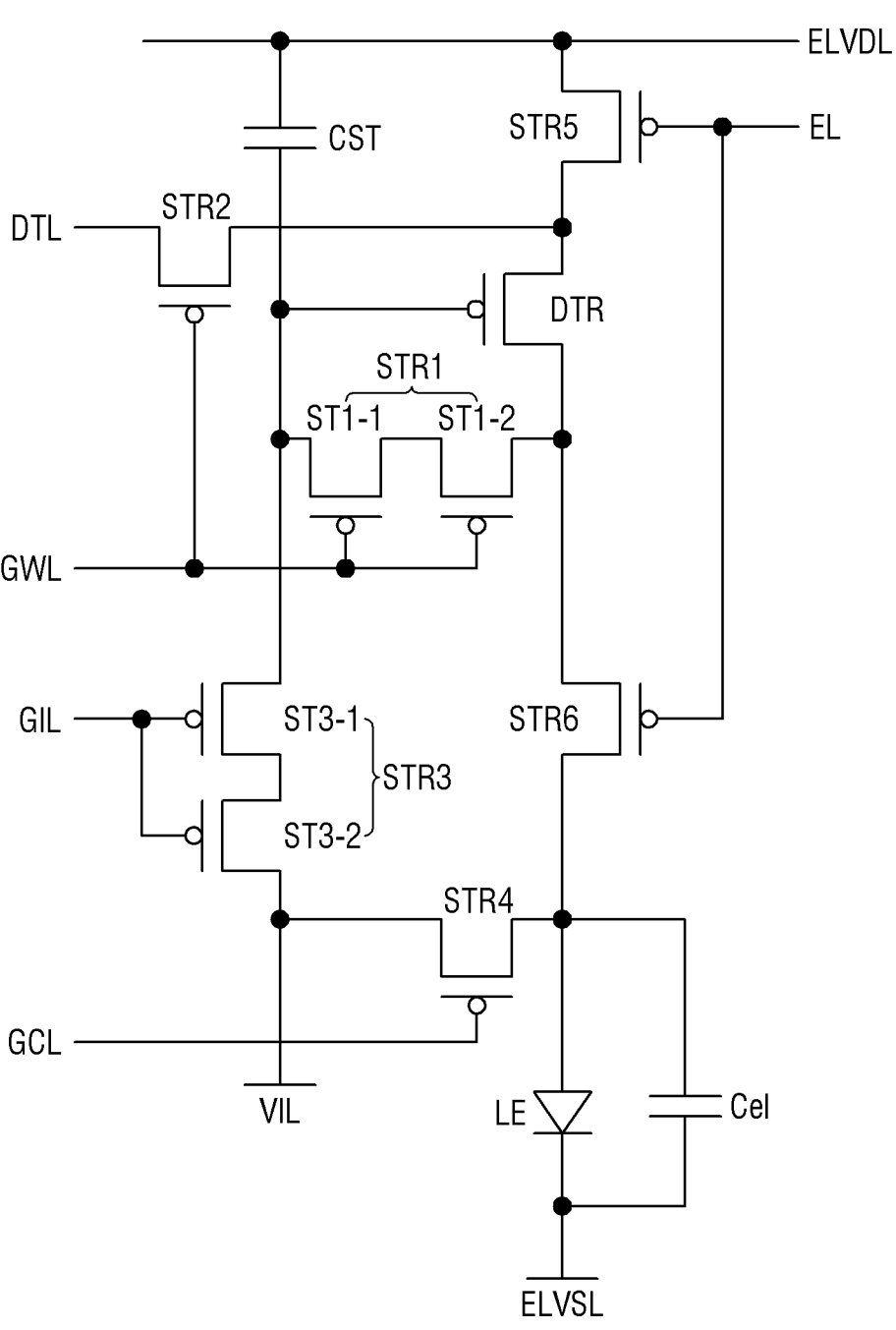
FIG. 6 is a schematic diagram of an equivalent circuit of a pixel of a display device according to an embodiment of the disclosure.
Figure 7:
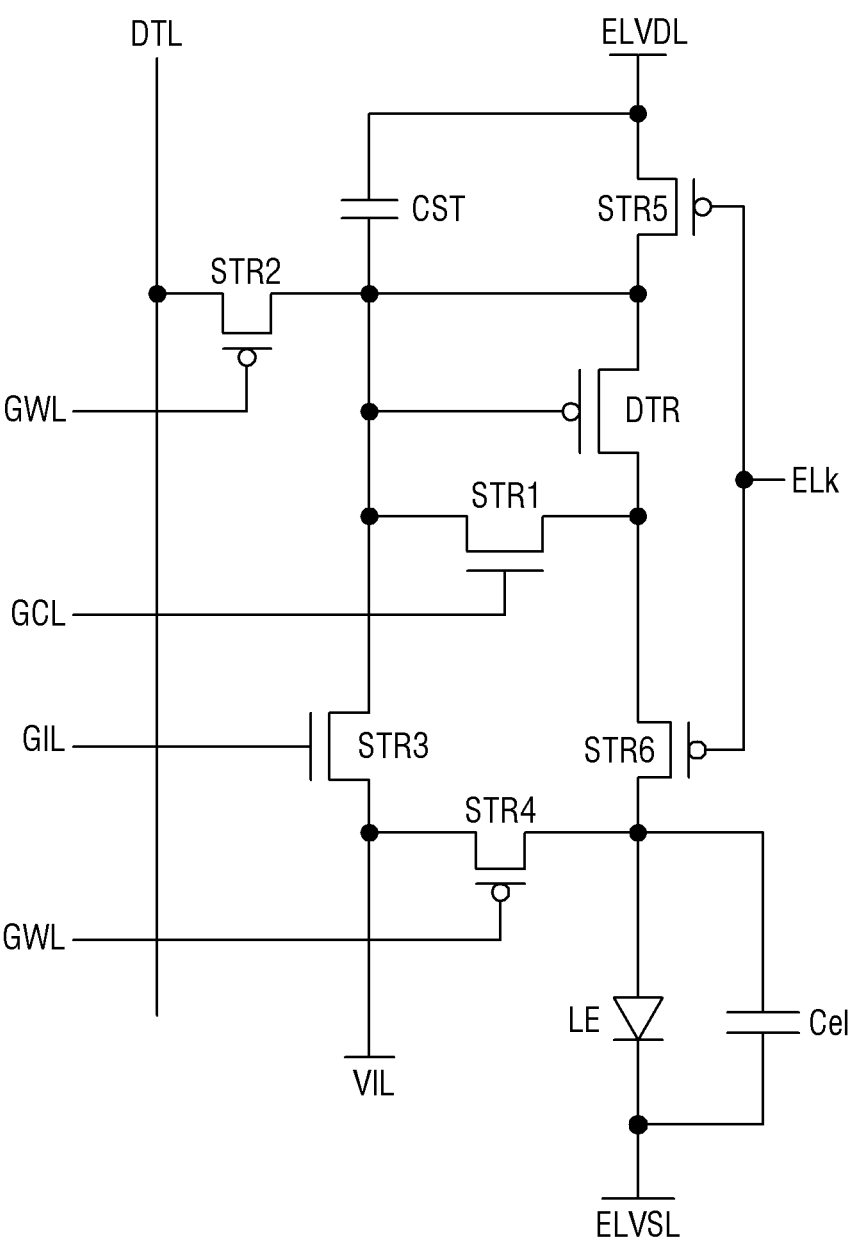
FIG. 7 is a schematic diagram of an equivalent circuit of a pixel of a display device according to an embodiment of the disclosure.
Figure 8:
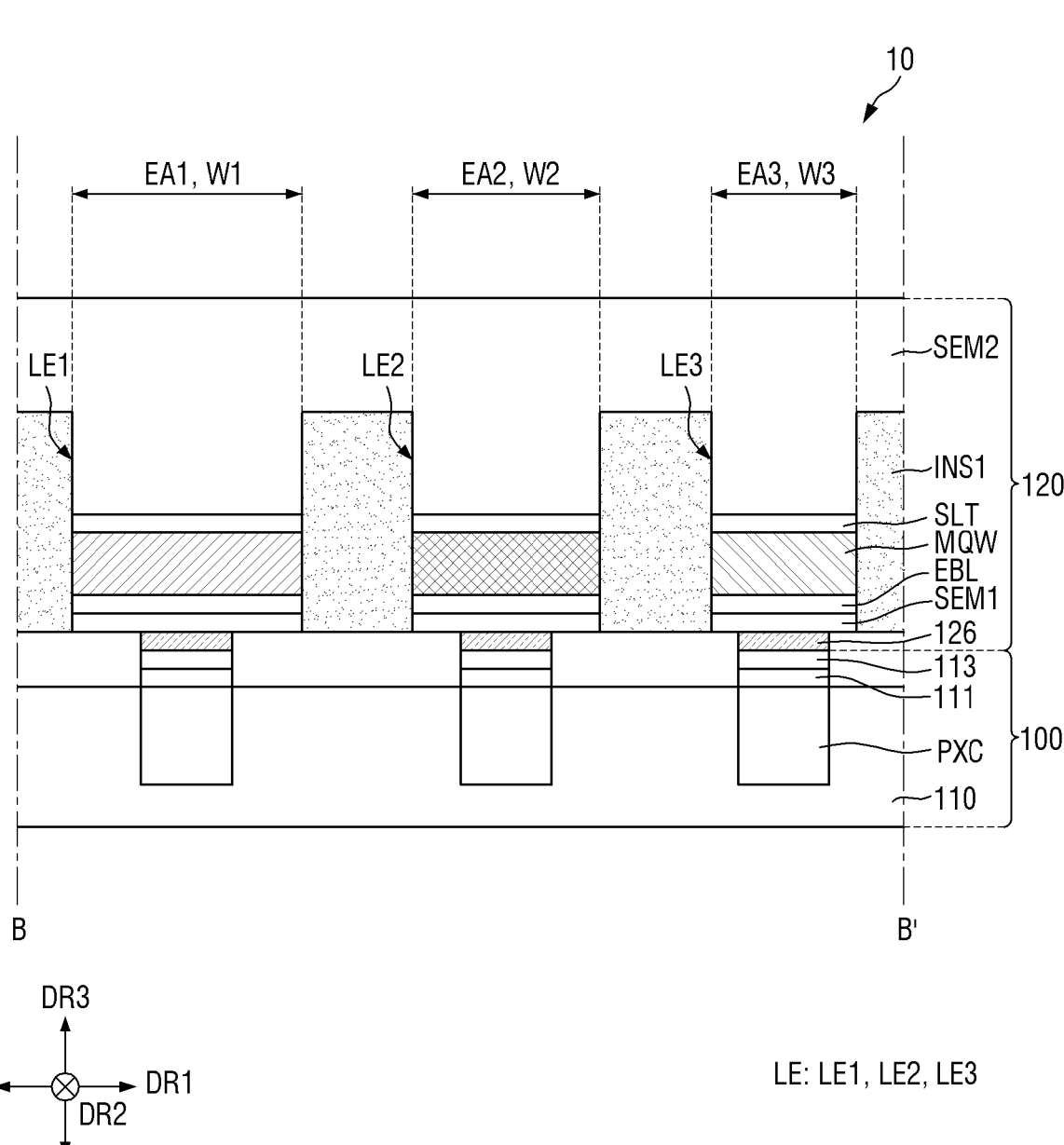
FIG. 8 is a schematic cross-sectional view showing an example of the display panel taken along line B-B' of FIG. 2.
Figure 9:
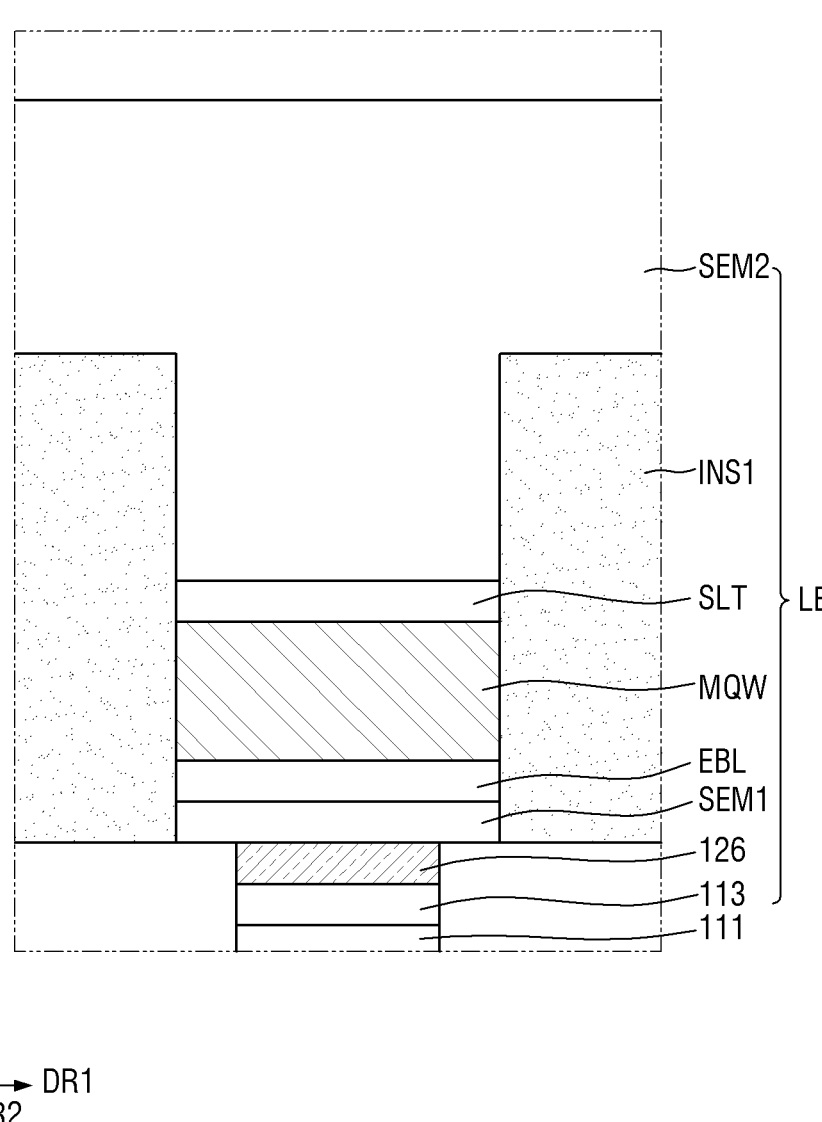
FIG. 9 is a schematic plan view showing an example of a light-emitting element layer according to an embodiment of the disclosure.

FIG. 4 is a cross-sectional view showing an example of the display panel taken along line A-A' of FIG. 2. FIG. 5 is a schematic diagram of an equivalent circuit of a pixel of a display device according to an embodiment of the disclosure. FIG. 6 is a schematic diagram of an equivalent circuit diagram of a pixel of a display device according to an embodiment of the disclosure. FIG. 7 is a schematic diagram of an equivalent circuit of a pixel of a display device according to an embodiment of the disclosure. FIG. 8 is a schematic cross-sectional view showing an example of the display panel taken along line B-B' of FIG. 2. FIG. 9 is a schematic plan view showing an example of a light-emitting element layer according to an embodiment of the disclosure.

Referring to FIGS. 4 to 9, the display panel 10 according to an embodiment may include a semiconductor circuit board 100 and a light-emitting element layer 120.

The semiconductor circuit board 100 may include a first substrate 110, pixel circuits PXC, a common circuit CXC, pixel electrodes 111, a common electrode 112, first pads PD1, contact electrodes 113 and a common contact electrode 114.

The first substrate 110 may be a silicon wafer substrate formed using a semiconductor process and may be the first substrate. The pixel circuits PXC and the common circuit CXC of the first substrate 110 may be formed using a semiconductor process.

The pixel circuits PXC may be disposed in the display area DA. The pixel circuits PXC may be electrically connected to the pixel electrodes 111, respectively. The pixel circuits PXC and the pixel electrodes 111 may be electrically connected in a one-to-one correspondence. Each of the pixel circuits PXC may overlap the light-emitting elements LE in the third direction DR3.

Each of the pixel circuits PXC may include at least one transistor formed via a semiconductor process. Each of the pixel circuits PXC may further include at least one capacitor formed via a semiconductor process. The pixel circuits PXC may include, for example, a CMOS circuit. Each of the pixel circuits PXC may apply a pixel voltage or an anode voltage to the pixel electrode 111.

Referring to FIG. 5, the pixel circuits PXC according to the embodiment may include three transistors DTR, STR1 and STR2 and a storage capacitor CST.

The light-emitting element LE emits light in proportional to the current supplied through the driving transistor DTR. The light-emitting element LE may be implemented as an inorganic light-emitting diode, an organic light-emitting diode, a micro light-emitting diode, a nano light-emitting diode, etc.

The first electrode (i.e., the anode electrode) of the light-emitting element LE may be electrically connected to the source electrode of the driving transistor DTR, and the second electrode (i.e., the cathode electrode) thereof may be electrically connected to a second supply voltage line ELVSL, from which a low-level voltage (second supply voltage) is applied, lower than a high-level voltage (first supply voltage) of a first supply voltage line ELVDL.

The driving transistor DTR adjusts a current flowing from the first supply voltage line ELVDL from which the first supply voltage is applied to the light-emitting element LE according to the voltage difference between a gate electrode and a source electrode. The gate electrode of the driving transistor DTR may be electrically connected to a first electrode of the first transistor ST1, the source electrode may be electrically connected to a first electrode of the light-emitting element LE, and the drain electrode may be electrically connected to the first supply voltage line ELVDL from which the first supply voltage is applied.

The first transistor STR1 is turned on by a scan signal of a scan line SCL to electrically connect a data line DTL with the gate electrode of the driving transistor DTR. A gate electrode of the first transistor STR1 may be electrically connected to the scan line SCL, the first electrode thereof may be electrically connected to the gate electrode of the driving transistor DTR, and a second electrode thereof may be electrically connected to the data line DTL.

The second transistor STR2 may be turned on by a sensing signal of a sensing signal line SSL to electrically connect the initialization voltage line VIL to the source electrode of the driving transistor DTR. A gate electrode of the second transistor ST2 may be electrically connected to the sensing signal line SSL, a first electrode thereof may be electrically connected to the initialization voltage line VIL, and a second electrode thereof may be electrically connected to the source electrode of the driving transistor DTR.

According to an embodiment of the disclosure, the first electrode of each of the first and second transistors STR1 and STR2 may be a source electrode while the second electrode thereof may be a drain electrode. It is, however, to be understood that the disclosure is not limited thereto. The first electrode of each of the first and second switching transistors STR1 and STR2 may be a drain electrode while the second electrode thereof may be a source electrode.

The capacitor CST may be formed between the gate electrode and the source electrode of the driving transistor DTR. The storage capacitor CST stores a voltage difference between the gate voltage and the source voltage of the driving transistor DTR.

The driving transistor DTR and the first and second transistors STR1 and STR2 may be formed as thin-film transistors. Although FIG. 5 shows that each of the driving transistor DTR and the first and second switching transistors STR1 and STR2 is implemented as an n-type MOSFET (metal oxide semiconductor field effect transistor), it is to be noted that the disclosure is not limited thereto. For example, the driving transistor DTR and the first and second switching transistors STR1 and STR2 may be implemented as p-type MOSFETs, or some of them may be implemented as n-type MOSFETs while the others may be implemented as p-type MOSFETs.

According to an embodiment of FIG. 6, the first electrode of the light-emitting element LE of the pixel circuit PXC may be electrically connected to the first electrode of the fourth transistor STR4 and the second electrode of the sixth transistor STR6, while the second electrode thereof may be electrically connected to the second supply voltage line ELVSL. A parasitic capacitance Cel may be formed between the first electrode and the second electrode of the light-emitting element LE.

Each of the pixels PX includes a driving transistor DTR, switch elements, and a capacitor CST. The switch elements include first to sixth transistors STR1, STR2, STR3, STR4, STR5 and STR6.

The driving transistor DTR includes a gate electrode, a first electrode, and a second electrode. A drain-source current Ids (hereinafter referred to as "driving current") of driving transistor DTR flowing between the first electrode and the second electrode is controlled according to the data voltage applied to the gate electrode.

The capacitor CST may be formed between the second electrode of the driving transistor DTR and the second supply voltage line ELVSL. An electrode of the capacitor CST may be electrically connected to the second electrode of the driving transistor DTR while the other electrode thereof may be electrically connected to the second voltage supply line ELVSL.

When the first electrode of each of the first to sixth transistors STR1, STR2, STR3, STR4, STR5 and STR6 and the driving transistor DTR is the source electrode, the second electrode thereof may be the drain electrode. In other examples, when the first electrode of each of the first to sixth transistors STR1, STR2, STR3, STR4, STR5 and STR6 and the driving transistor DTR is the drain electrode, the second electrode thereof may be the source electrode.

The active layer of each of the first to sixth transistors STR1, STR2, STR3, STR4, STR5 and STR6 and the driving transistor DTR may be made of poly silicon, amorphous silicon, or an oxide semiconductor. When the semiconductor layer of each of the first to sixth transistors STR1, STR2, STR3, STR4, STR5 and STR6 and the driving transistor DTR is made of poly silicon, a low-temperature poly silicon (LTPS) process may be employed.

Although the first to sixth transistors STR1, STR2, STR3, STR4, STR5 and STR6 and the driving transistor DTR may be p-type metal oxide semiconductor field effect transistors (MOSFETs) in FIG. 6, this is merely illustrative. They may be n-type MOSFETs.

The first supply voltage from the first voltage supply line ELVDL, a second supply voltage from the second voltage supply line ELVSL, and a third supply voltage from a third voltage supply line VIL may be determined based on the characteristics of the driving transistor DTR, the characteristics of the light-emitting element LE, etc.

The circuit of FIG. 7 is different from the circuit of FIG. 6 in that the driving transistor DTR, the second transistor STR2, the fourth transistor STR4, the fifth transistor STR5 and the sixth transistor STR6 are implemented as p-type MOSFETs while the first transistor STR1 and the third transistor STR3 are implemented as n-type MOSFETs.

The active layer of each of the driving transistor DRT, the second transistor STR2, the fourth transistor STR4, the fifth transistor STR5 and the sixth transistor STR6 implemented as p-type MOSFETs may be made of polysilicon, and the active layer of the first transistor STR1 and the third transistor STR3 implemented as n-type MOSFETs may be made of oxide semiconductor.

The embodiment of FIG. 7 is different from the embodiment of FIG. 4 in that the gate electrode of the second transistor STR2 and the gate electrode of the fourth transistor STR4 are electrically connected to a write scan line GWL, and the gate electrode of the first transistor STR1 is electrically connected to a control scan line GCL. In FIG. 7, since the first transistor STR1 and the third transistor STR3 may be formed of n-type MOSFETs, a scan signal of a gate-high voltage may be applied to the control scan line GCL and an initialization scan line GIL. In contrast, since the second transistor STR2, the fourth transistor STR4, the fifth transistor STR5 and the sixth transistor STR6 may be formed of p-type MOSFETs, a scan signal of a gate-low voltage may be applied to the write scan line GWL and an emission line EL.

It should be noted that the equivalent circuit diagrams of the pixels according to the embodiments of the disclosure are not limited to those illustrated in FIGS. 5 to 7. The equivalent circuit diagrams of the pixels according to the embodiments of the disclosure may be implemented as other circuit structures than those of the embodiments shown in FIGS. 5 to 7.

Referring to FIG. 4 common circuit CXC may be disposed in the non-display area NDA. The common circuit CXC may be disposed in line with the common contact electrode 114 and may be electrically connected to the second semiconductor layer SEM2 commonly connected electrically to the light-emitting elements LE.

The pixel electrodes 111 may be disposed on the pixel circuits PXC, respectively. Each of the pixel electrodes 111 may be an exposed electrode exposed from the respective pixel circuit PXC. The pixel electrodes 111 may be formed integrally with the pixel circuits PXC, respectively. Each of the pixel electrodes 111 may receive a pixel voltage or an anode voltage from the respective pixel circuit PXC. The pixel electrodes 111 may include at least one of gold (Au), copper (Cu), tin (Sn) and silver (Ag). For example, the pixel electrodes 111 may include a 9:1 alloy, an 8:2 alloy or a 7:3 alloy of gold and tin, or may include an alloy of copper, silver and tin (for example, SAC305).

The common electrode 112 may be disposed in the first common voltage supply area CVA1 of the non-display area NDA. The common electrode 112 may be disposed to surround the display area DA. The common electrode 112 may be electrically connected to one of the first pads PD1 of the first pad area PDA1 through the common circuit CXC formed in the non-display area NDA to receive a common voltage. The common electrode 112 and the pixel electrodes 111 may include a same material. The common electrode 112 and the pixel electrodes 111 may be formed via the same process.

The contact electrodes 113 may be disposed on the pixel electrodes 111, respectively. The contact electrodes 113 may include a metal material for attaching the pixel electrodes 111 to the light-emitting elements LE. For example, the contact electrodes 113 may include at least one of gold (Au), copper (Cu), aluminum (Al), and tin (Sn). In other examples, the contact electrodes 113 may include a first layer including one of gold (Au), copper (Cu), aluminum (Al) and tin (Sn), a second layer including another one of gold (Au), copper (Cu), aluminum (Al) and tin (Sn).

The common contact electrode 114 may be disposed on the common electrode 112 of the non-display area NDA and may be disposed to surround the display area DA. The common contact electrode 114 may be electrically connected to one of the first pads PD1 of the first pad area PDA1 through the common circuit CXC formed in the non-display area NDA to receive a common voltage. The common contact electrode 114 and the contact electrodes 113 may include a same material. The common contact electrode 114 may electrically connect the voltage line of the common circuit CXC and the common connection electrode 127 of the light-emitting element layer 120.

Each of the first pads PD1 may be electrically connected to a pad electrode CPD of the circuit board CB through a conductive connection member such as a wire WR corresponding to each first pad PD1. For example, the first pads PD1, the wires WR and the pads CPD of the circuit board CB may be electrically connected to each other, respectively.

The circuit board CB may be a flexible film such as a flexible printed circuit board (FPCB), a printed circuit board (PCB), a flexible printed circuit (FPC) and a chip-on-film (COF).

The second pads of the second pad area PDA2 (refer to FIG. 2) may be substantially identical to the first pads PD1 described above, and redundant descriptions will be omitted.

Referring to FIGS. 4, 8, and 9, the light-emitting element layer 120 may include light-emitting elements LE, an insulating layer INS1, a connection electrode 126, and a common connection electrode 127.

The light-emitting element layer 120 may include first emission areas EA1, second emission areas EA2, and third emission areas EA3 corresponded to the respective light-emitting elements LE. The light-emitting elements LE may be disposed in the first emission areas EA1, the second emission areas EA2 and the third emission areas EA3, respectively.

The light-emitting elements LE may be disposed on the pixel electrodes 111 in the first emission areas EA1, the second emission areas EA2 and the third emission areas EA3. Each of the light-emitting elements LE may be a vertical light-emitting diode extending in the third direction DR3. For example, the length of the light-emitting elements LE in the third direction DR3 may be larger than the length in the horizontal direction. The horizontal length refers to either the length in the first direction DR1 or the length in the second direction DR2. For example, the length of the light-emitting elements LE in the third direction DR3 may be in a range of approximately 1 μm to 5 μm.

Each of the light-emitting elements LE may be a micro light-emitting diode. The light-emitting element LE may include a connection electrode 126, a first semiconductor layer SEM1, an electron blocking layer EBL, an active layer MQW, a superlattice layer SLT, and a second semiconductor layer SEM2 in the third direction DR3 as shown in FIG. 9. The connection electrode 126, the first semiconductor layer SEM1, the electron blocking layer EBL, the active layer MQW, the superlattice layer SLT and the second semiconductor layer SEM2 may be stacked in this order in the third direction DR3.

As shown in FIG. 9, the light-emitting element LE may have a cylindrical shape, a disk shape, or a rod shape having the width longer than the height. It should be understood, however, that the disclosure is not limited thereto. The light-emitting element LE may have a shape of a rod, wire, tube, etc., a shape of a polygonal column such as a cube, a cuboid and a hexagonal column, or may have a shape extended in a direction with partially inclined outer surface.

The connection electrode 126 may be disposed on the pixel electrode 111 and the contact electrode 113. The connection electrode 126 may be in contact with the contact electrode 113 to apply an emission signal to the light-emitting element LE. The light-emitting element LE may include at least one connection electrode 126. Although the light-emitting element LE includes one connection layer 126 in the example shown in FIG. 9, but the disclosure is not limited thereto. In some implementations, the light-emitting element LE may include a larger number of electrode layers or may not include any. The following description on the light-emitting element LE may be equally applied even if the number of electrode layers 126 is different or it further includes other structures.

The connection electrode 126 may be disposed between the contact electrode 113 and the first semiconductor layer SEM1. The connection electrode 126 may be an ohmic connection electrode. It is, however, to be understood that the disclosure is not limited thereto. The connection electrodes CNE1 and CNE2 may be Schottky connection electrodes. The connection layer 126 may reduce the resistance between the light-emitting element LE and the contact electrode when the light-emitting element LE is electrically connected to the contact electrode in the display panel 10 according to the embodiment of the disclosure. The connection electrode 126 may include a metal having conductivity. For example, the connection electrode 126 may include at least one of gold (Au), copper (Cu), tin (Sn), titanium (Ti), aluminum (Al) and silver (Ag). For example, the connection electrodes 126 may include a 9:1 alloy, an 8:2 alloy or a 7:3 alloy of gold and tin, or may include an alloy of copper, silver and tin (SAC305).

The first semiconductor layer SEM1 may be disposed on the connection electrode 126. The first semiconductor layer SEM1 may be p-type semiconductor, and may include a semiconductor material having the following chemical formula: $Al_xGa_yIn_{1-x-y}N$ ($0 \leq x \leq 1$, $0 \leq y \leq 1$ and $0 \leq x+y \leq 1$). For example, it may be at least one of p-type doped AlGaInN, GaN, AlGaN, InGaN, AlN and InN. The first semiconductor layer SEM1 may be doped with a p-type dopant, and the p-type dopant may be Mg, Zn, Ca, Se, Ba, etc. For example, the first semiconductor layer SEM1 may be p-GaN doped with p-type Mg. The thickness of the first semiconductor layer SEM1 may be in a range of about 30 nm to about 200 nm, but the embodiments are not limited thereto.

The electron blocking layer EBL may be disposed on the first semiconductor layer SEM1. The electron blocking layer EBL may suppress or prevent too many electrons from flowing into the active layer MQW. For example, the electron blocking layer EBL may be p-AlGaN doped with p-type Mg. The thickness of the electron blocking layer may be in a range of 10 nm to 50 nm, but the disclosure is not limited thereto. The electron blocking layer EBL may be eliminated.

The active layer MQW (refer to FIGS. 8 and 9) may be disposed on the electron blocking layer EBL. The active layer MQW may emit light as electron-hole pairs are combined therein in response to an electrical signal applied through the first semiconductor layer SEM1 and the second semiconductor layer SEM2. The active layer MQW may emit a first light of a blue wavelength range, or a second light of a green wavelength range.

The active layer MQW may include a material having a single or multiple quantum well structure. When the active layer MQW includes a material having the multiple quantum well structure, well layers and barrier layers may be alternately stacked in the structure. The well layers may be made of InGaN, and the barrier layers may be made of GaN or AlGaN, but the disclosure is not limited thereto. The thickness of the well layers may be in a range of approximately 1 nm to 4 nm, and the thickness of the barrier layers may be about 3 nm to about 10 nm.

In other examples, the structure of the active layer MQW may have a semiconductor material having a large band gap energy and a semiconductor material having a small band gap energy that are alternately stacked, and may include other Group III to Group V semiconductor materials depending on the wavelength range of the emitted light. The light emitted by the active layer MQW is not limited to the first light (in the blue wavelength range). In some implementations, the second light (in the green wavelength range) or the third light (in the red wavelength range) may be emitted by the active layer MQW. According to an embodiment of the disclosure, when indium is included among the semiconductor materials included in the active layer MQW, the color of emitted light may vary depending on the content of indium. For example, when the content of indium is in a range of approximately 10% to 15%, light of the blue wavelength range may be emitted. When the content of indium is in a range of approximately 20% to 25%, light of the green wavelength range may be emitted. When the content of indium is in a range of approximately 30% to 45%, light of the red wavelength range may be emitted.

The superlattice layer SLT may be disposed on the active layer MQW. The superlattice layer SLT may relieve stress between the second semiconductor layer SEM2 and the active layer MQW. For example, the superlattice layer SLT may be made of InGaN or GaN. The thickness of the superlattice layer SLT may be in a range of approximately 50 nm to 200 nm. The superlattice layer SLT may be eliminated.

The second semiconductor layer SEM2 may be disposed on the superlattice layer SLT. The second semiconductor layer SEM2 may be an n-type semiconductor. The second semiconductor layer SEM2 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The second semiconductor layer SEM2 may be doped with an n-type dopant, and the n-type dopant may be Si, Ge, Sn, etc. For example, the second semiconductor layer SEM2 may be n-GaN doped with n-type Si. The thickness of the second semiconductor layer SEM2 may be in a range of, about 2 μm to about 4 μm, but the embodiments are not limited thereto.

As shown in FIG. 4, the second semiconductor layer SEM2 may be a common layer disposed across the light-emitting elements LE. At least a portion of the second semiconductor layer SEM2 may be disposed in a patterned shape in each of the light-emitting elements LE in the third direction DR3, and the remaining part may extend in the first direction DR1 and thus may be disposed across the light-emitting elements LE. The second semiconductor layer SEM2 allows the common voltage applied through the common connection electrode 127 to be commonly applied to the light-emitting elements LE. The second semiconductor layer SEM2 may extend from the display area DA to the non-display area NDA.

The common connection electrode 127 (refer to FIG. 4) may be disposed in the first common voltage supply area CVA1 of the non-display area NDA. The common connection electrode 127 may be disposed on one surface of the second semiconductor layer SEM2. The common connection electrode 127 may transmit a common voltage signal of the light-emitting elements from the common contact electrode 114. The common connection electrode 127 may be made of the same material as the connection electrodes 126. In order to be electrically connected to the common contact electrode 114, the common connection electrode 127 may be thick in the third direction DR3.

The above-described light-emitting elements LE may receive the pixel voltage or the anode voltage of the pixel electrodes 111 through the connection electrodes 126 and may receive the common voltage through the second semiconductor layer SEM2. The light-emitting element LE may emit light with a selected luminance according to a voltage difference between the pixel voltage and the common voltage.

The insulating layer INS1 may define each of the light-emitting elements LE and may define each of the emission areas EA1, EA2 and EA3. The insulating layer INS1 may be disposed to surround the light-emitting elements LE and may be in direct contact with the side surfaces of the light-emitting elements LE. Accordingly, the light-emitting elements LE may not be exposed to external foreign substances, for example, dust or air during the process of fabricating the display device. Since the light-emitting elements LE may be partitioned by the insulating layer INS1, it is possible to separate the light-emitting elements LE from each other even without an etching process for the light-emitting elements LE.

The insulating layer INS1 may include an inorganic insulating material such as silicon oxide (SiOx), silicon nitride (SiNx), silicon oxynitride (SiOxNy), aluminum oxide (AlxOy) and aluminum nitride (AlN). The thickness of the insulating layer INS1 may be in a range of approximately 0.1 μm to 10 μm, but the embodiments are not limited thereto.

Figure 10:
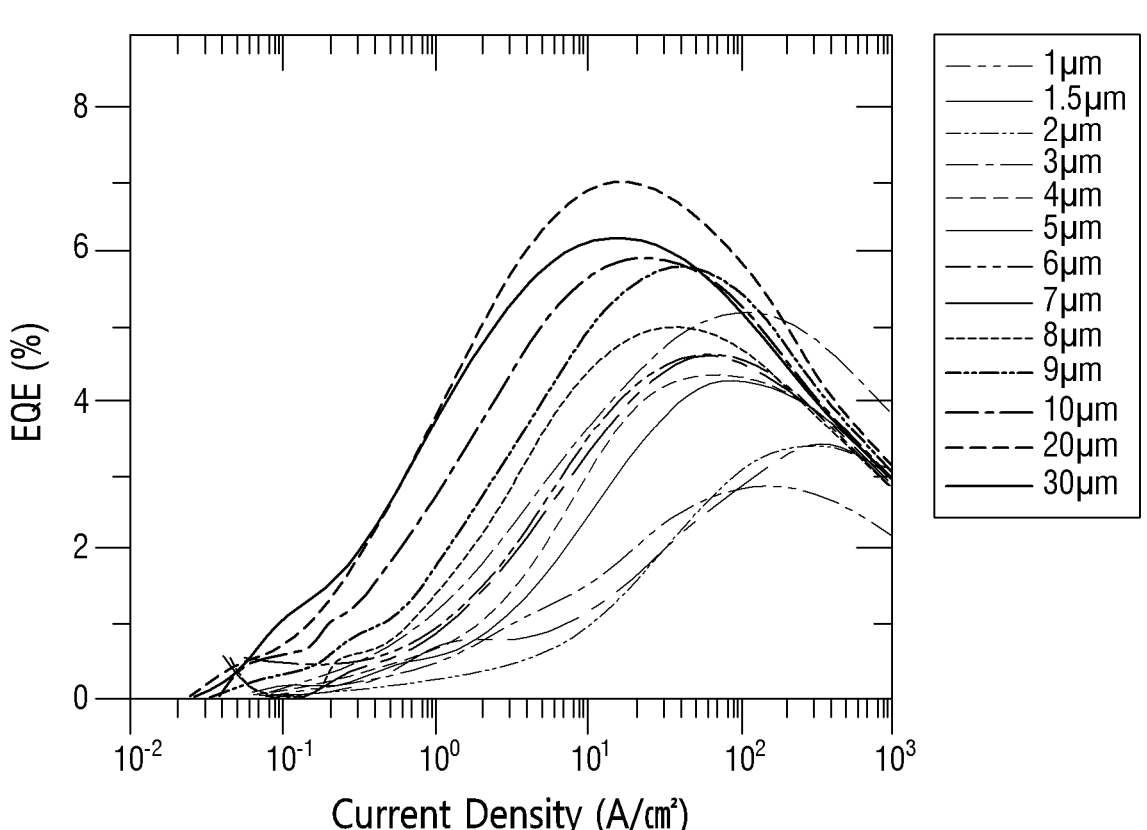
FIG. 10 is a graph showing the light-emitting efficiency versus the current density of a first light-emitting element.
Figure 11:
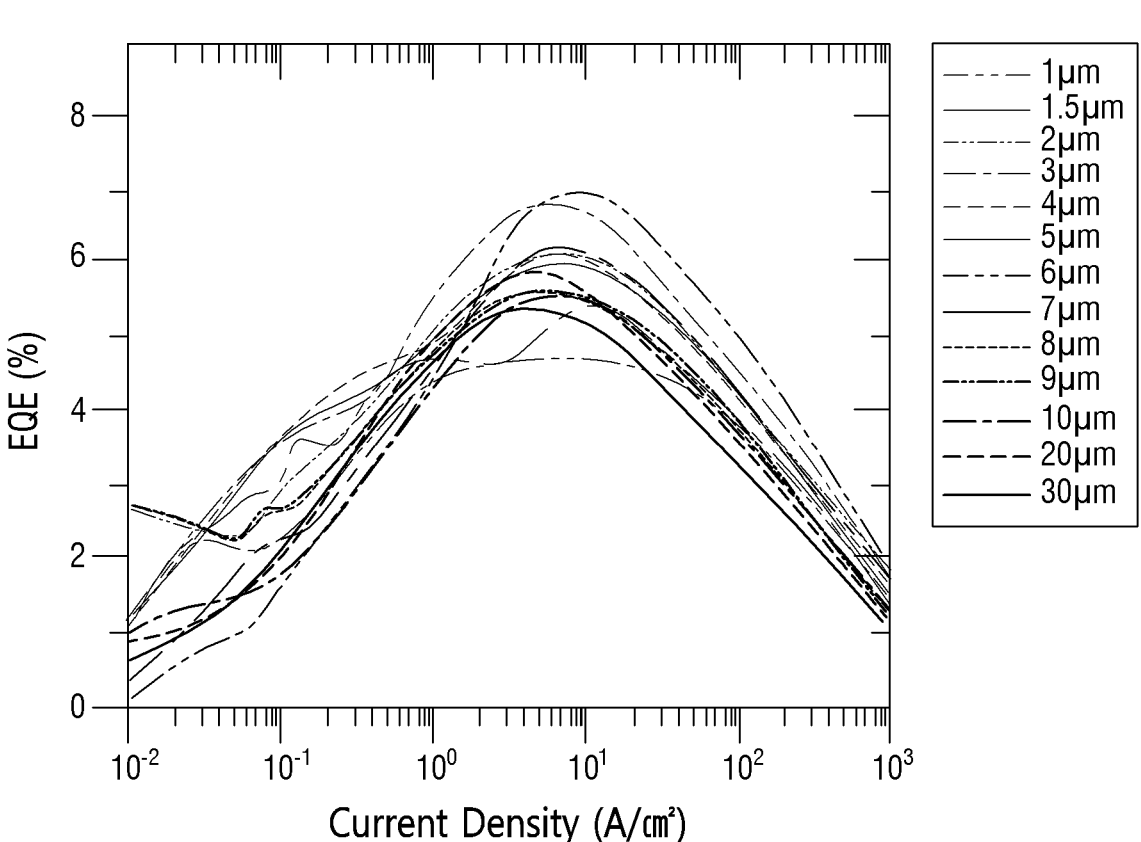
FIG. 11 is a graph showing the light-emitting efficiency versus the current density of a second light-emitting element.
Figure 12:
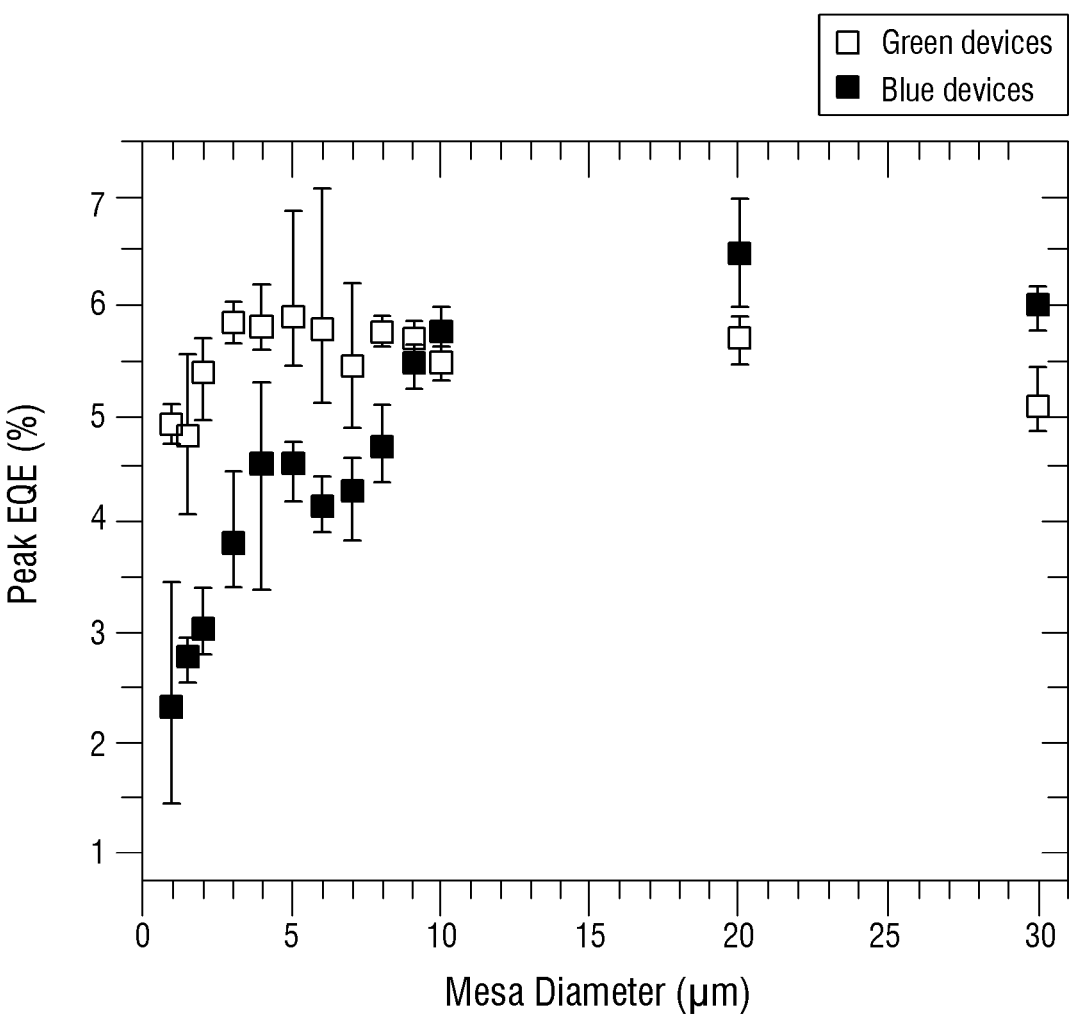
FIG. 12 is a graph showing light-emitting efficiency of peak wavelengths versus widths of a first light-emitting element and a second light-emitting element.

FIG. 10 is a graph showing the light-emitting efficiency (the external quantum efficiency; EQE) versus the current density of the first light-emitting element (emitting a blue light). FIG. 11 is a graph showing the light-emitting efficiency (the external quantum efficiency; EQE) versus the current density of the second light-emitting element (emitting a green light). FIG. 12 is a graph showing light-emitting efficiency comparing the ranges of peak efficiency versus the widths of the first light-emitting element (blue) and the second light-emitting element (green).

FIG. 10 shows the light-emitting efficiency versus the current density when the width (or diameter) of the first light-emitting element ranges from about 1 μm to about 30 μm. As the width of the first light-emitting element gradually decreases from about 30 μm to about 1 the light-emitting efficiency gradually decreases from a maximum (a peak efficiency) of approximately 7% to approximately 2%.

FIG. 11 shows the light-emitting efficiency versus the current density when the width (or diameter) of the second light-emitting element ranges from about 1 μm to about 30 μm. As the width of the second light-emitting element gradually decreases from about 30 μm to about 1 μm, the light-emitting efficiency gradually decreases from a maximum (a peak efficiency) of approximately 7% to approximately 4%.

Referring to FIG. 12, as the width (or the mesa diameter) of the first light-emitting element gradually decreases from about 30 μm to about 1 the light-emitting efficiency of the peak wavelength range (in a range of approximately 370 nm to 460 nm) gradually decreases down to approximately 2%. As the width (or diameter) of the second light-emitting element gradually decreases from about 30 μm to about 1 the light-emitting efficiency of the peak wavelength range (in a range of approximately 480 nm to 560 nm) remains in a range of approximately 5% to 6%.

FIGS. 10, 11, and 12 show that the light-emitting efficiency of the first light-emitting element may significantly decrease when the width (or diameter) decreases. The light-emitting efficiency of second light-emitting element emitting green light may be maintained when the width (or diameter) decreases.

Hereinafter, a display device will be described, which includes micro light-emitting elements for ultra-high resolution and can improve the light-emitting element efficiency of first light-emitting elements by increasing the size of the first light-emitting elements.

Referring to FIGS. 2 to 4 and 8, according to an embodiment of the disclosure, the width W1 of the first light-emitting element LE1 may be greater than the width W2 of the second light-emitting element LE2 and the width W3 of the third light-emitting element LE3. The widths W1, W2 and W3 of the light-emitting elements LE1, LE2 and LE3 may be the distances from one side to the other side in the first direction DR1. When the shape of the light-emitting elements LE1, LE2 and LE3 is circular in a plan view, the width may be the diameter of each of the light-emitting elements LE1, LE2 and LE3.

The width W1 of the first light-emitting element LE1 may be greater than the width W2 of the second light-emitting element LE2 and the width W3 of the third light-emitting element LE3. When the width W1 of the first light-emitting element LE1 is greater than the width W2 of the second light-emitting element LE2 and the width W3 of the third light-emitting element LE3, the emission area of the first light-emitting element LE1 increases, so that the light-emitting efficiency of the first light-emitting element LE1 can increase. In this manner, the luminance of the first light of the first light-emitting element LE1, the luminance of the second light of the second light-emitting element LE2, and the luminance of the third light of the third light-emitting element LE3 can be maintained at the same level. For example, when the size of each of the light-emitting elements LE1, LE2 and LE3 is small in the range of approximately several to about several tens of micrometers, the width of the first light-emitting elements emitting blue light is formed to be larger than that of the other light-emitting elements, so that the light-emitting efficiency of the first light-emitting elements can be improved, allowing them to be applied to an ultra-high resolution display device.

When the width W1 of the first light-emitting element LE1 is greater than the width W2 of the second light-emitting element LE2 and the width W3 of the third light-emitting element LE3, the width W2 of the second light-emitting element LE2 may be equal to or greater than the width W3 of the third light-emitting element LE3. For example, the width W2 of the second light-emitting element LE2 may be greater than the width W3 of the third light-emitting element LE3. The width W2 of the second light-emitting element LE2 may be equal to the width W3 of the third light-emitting element LE3.

When the width W1 of the first light-emitting element LE1 is greater than the width W2 of the second light-emitting element LE2 and the width W3 of the third light-emitting element LE3, the area of the first emission area EA1 of the first light-emitting element LE1 may be greater than the area of the second emission area EA2 of the second light-emitting element LE2 and may be greater than the area of the third emission area EA3 of the third light-emitting element LE3. The area of the first emission area EA1 may be equal to the area of the first light-emitting element LE1, the area of the second emission area EA2 may be equal to the area of the second light-emitting element LE2, and the area of the third emission area EA3 may be equal to the area of the third light-emitting element LE3.

As shown in FIGS. 2 and 3, the first emission area EA1 of the first light-emitting element LE1 may be greater than the second emission area EA2 of the second light-emitting element LE2 and the third emission area EA3 of the third light-emitting element LE3. The area of the second emission area EA2 of the second light-emitting element LE2 may be greater than or equal to the area of the third emission area EA3 of the third light-emitting element LE3.

Figure 13:
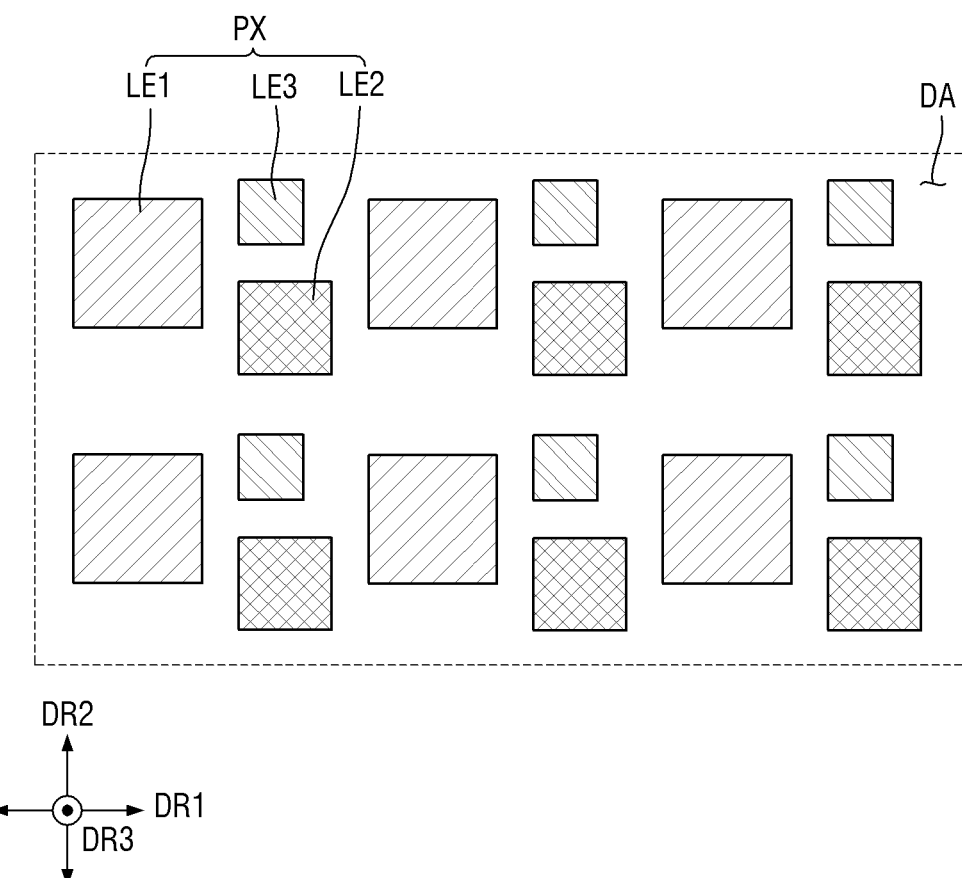
FIGS. 13 to 15 are views showing schematic layouts of pixels.
Figure 14:
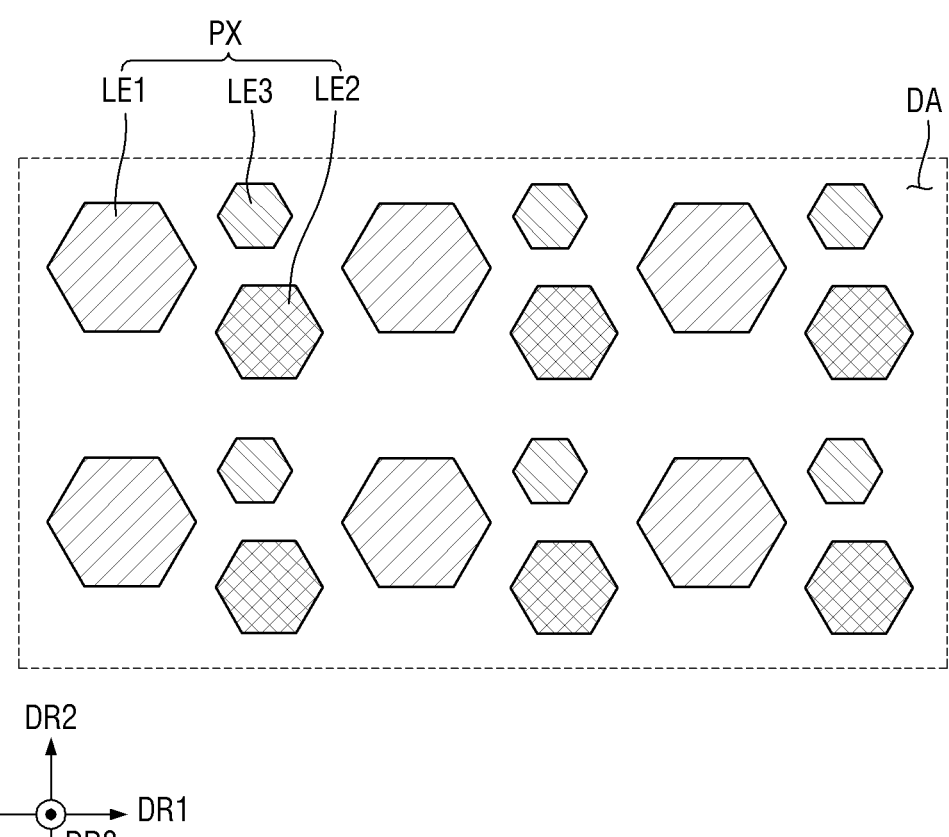
Figure 15:
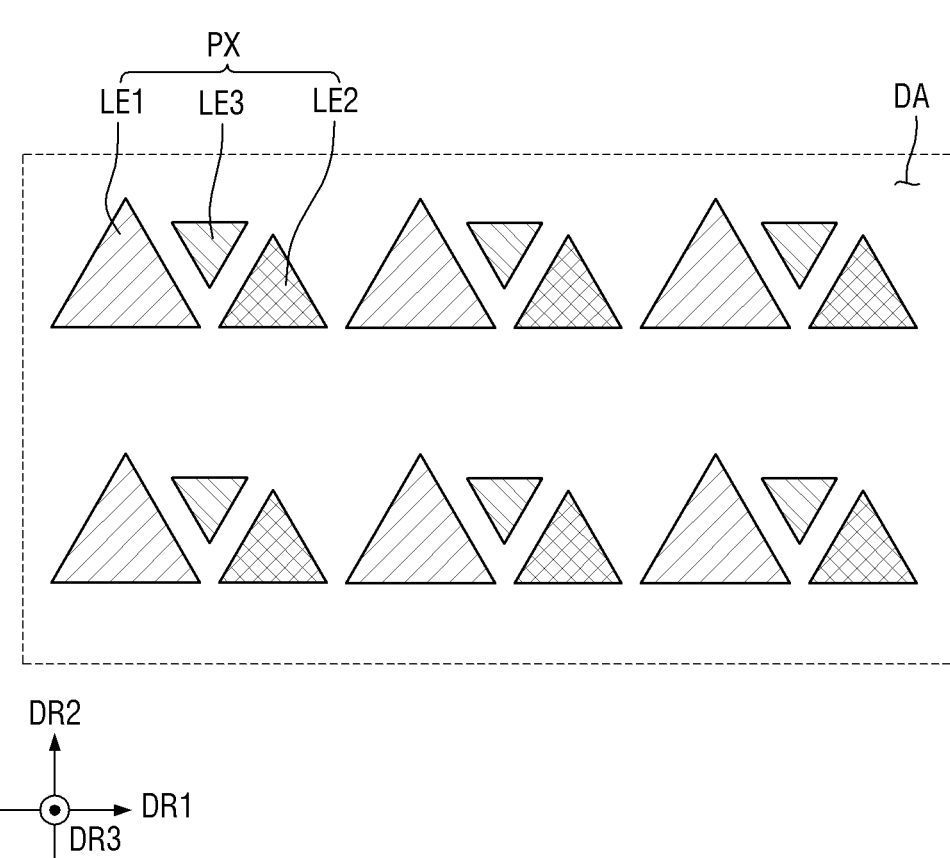

FIGS. 13 to 15 are views showing layouts of pixels.

Referring to FIGS. 13 to 15, the above-described light-emitting elements LE1, LE2 and LE3 may be disposed in a variety of ways.

In the display area DA, the first light-emitting elements LE1 may be arranged in the first direction DR1 and the second direction DR2. The second light-emitting elements LE2 and the third light-emitting elements LE3 may be arranged alternately in the second direction DR2 and may be arranged alternately with the first light-emitting elements LE1 in the first direction DR1.

In each of the pixels PX, each of the second light-emitting element LE2 and the third light-emitting element LE3 may be disposed in the first direction DR1 from the first light-emitting element LE1. The second light-emitting element LE2 and the third light-emitting element LE3 may be arranged in the second direction DR2.

The area of the first light-emitting element LE1 may be greater than that of the second light-emitting element LE2, and the area of the second light-emitting element LE2 may be greater than that of the third light-emitting element LE3. In an embodiment, the area of the second light-emitting element LE2 may be equal to that of the third light-emitting element LE3.

The distance between the first light-emitting element LE1 and the second light-emitting element LE2 adjacent to each other, the distance between the second light-emitting element LE2 and the third light-emitting element LE3 adjacent to each other, and the distance between the first light-emitting element LE1 and the third light-emitting element LE3 adjacent to each other may be substantially all equal, but the disclosure is not limited thereto. For example, the distance between the first light-emitting element LE1 and the second light-emitting element LE2 adjacent to each other may be different from the distance between the second light-emitting element LE2 and the third light-emitting element LE3 adjacent to each other. The distance between the first light-emitting element LE1 and the third light-emitting element LE3 adjacent to each other may be different from the distance between the second light-emitting element LE2 and the third light-emitting element LE3 adjacent to each other.

As shown in FIG. 13, the first light-emitting element LE1, the second light-emitting element LE2 and the third light-emitting element LE3 may have a rectangular shape in a plan view. As shown in FIG. 14, the first light-emitting element LE1, the second light-emitting element LE2 and the third light-emitting element LE3 may have a hexagonal shape. As shown in FIG. 15, the first light-emitting element LE1, the second light-emitting element LE2 and the third light-emitting element LE3 may have a triangular shape. In an embodiment, the shape of at least one of the first light-emitting element LE1, the second light-emitting element LE2 and the third light-emitting element LE3 may be different from the others. For example, the shape of the first light-emitting element LE1 in a plan view may be a rectangle, while the shapes of the second light-emitting element LE2 and the third light-emitting element LE3 may be a hexagons. The first light-emitting element LE1 may have a circular shape in a plan view, the second light-emitting element LE2 may have a quadrangular shape, and the third light-emitting element LE3 may have a triangular shape.

However, the embodiments of the disclosure are not limited thereto. For example, the first light-emitting element LE1, the second light-emitting element LE2 and the third light-emitting element LE3 may have a polygonal shape such as a triangle, a square, a pentagon, a hexagon and an octagon, an elliptical shape, or irregular shapes.

Figure 16:
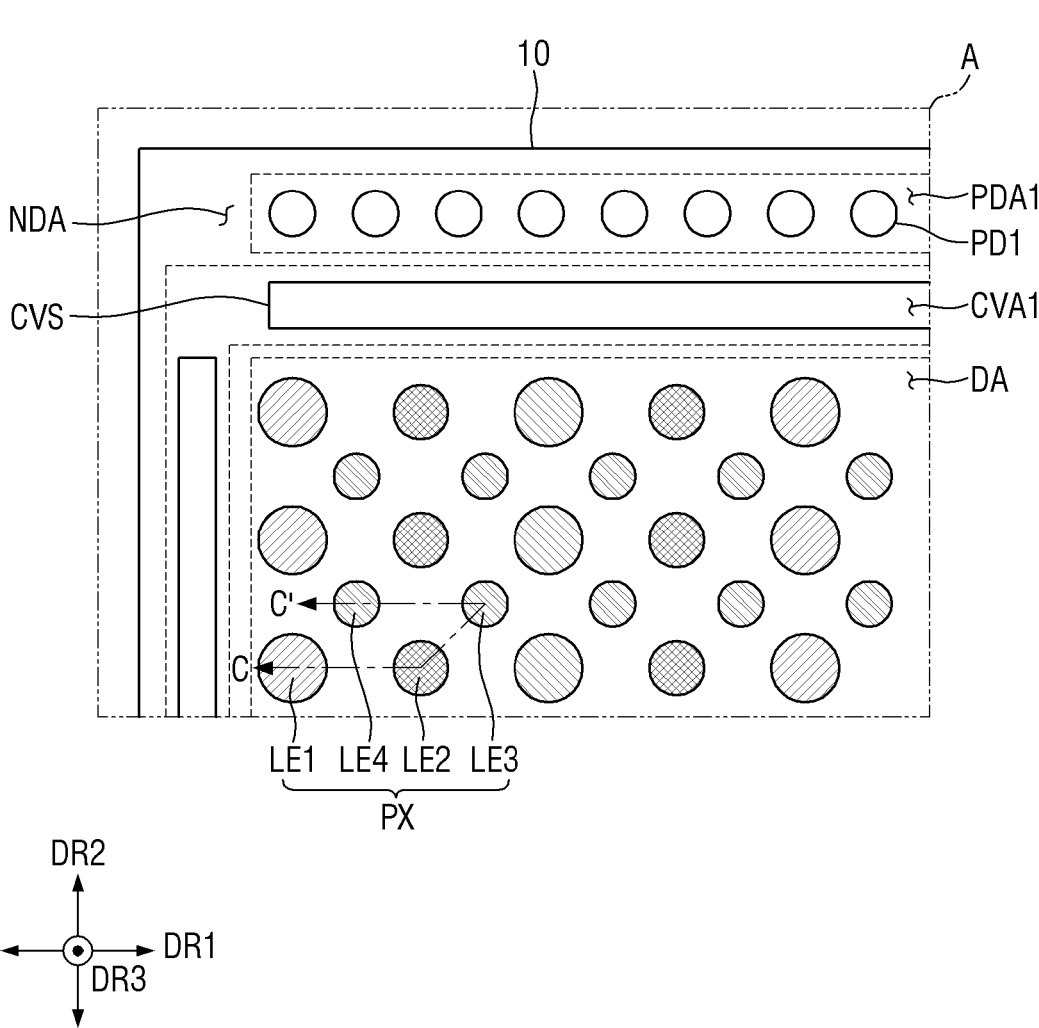
FIG. 16 is a schematic view showing an example of the layout of area A of FIG. 2.
Figure 17:
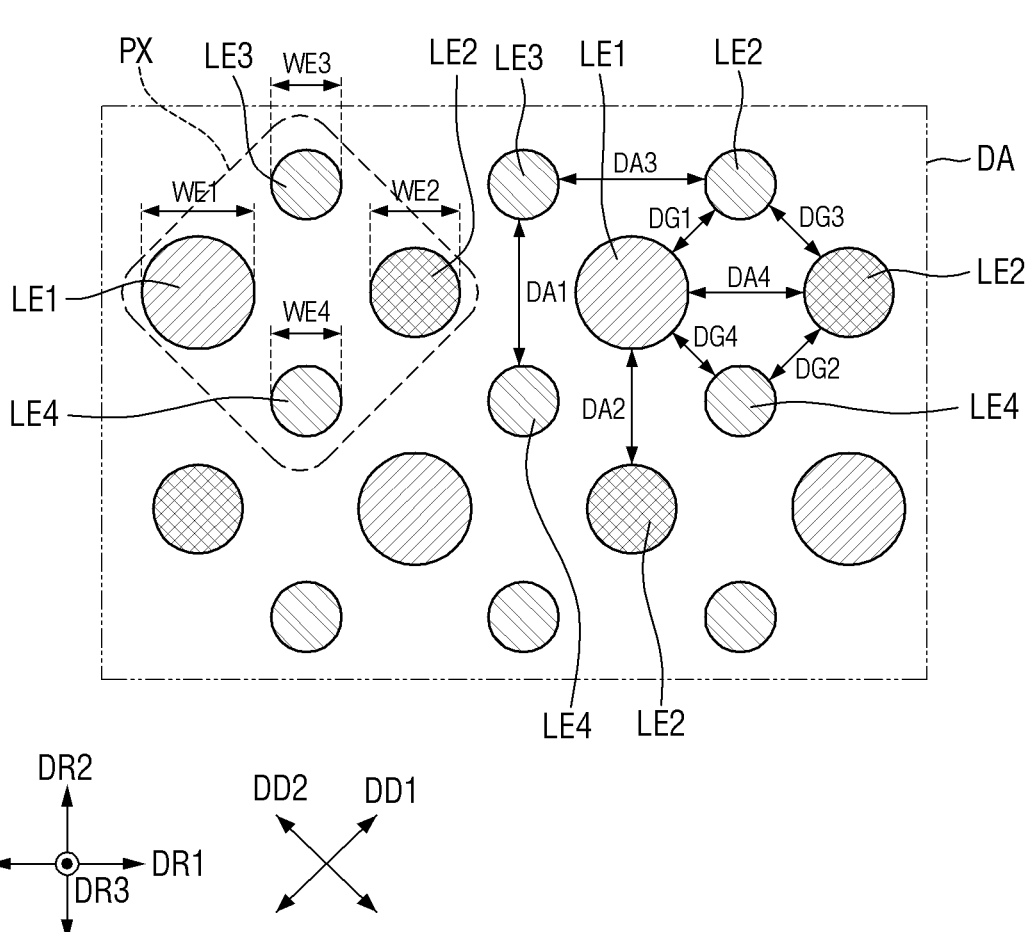
FIG. 17 is a schematic view showing an example of the layout of pixels.
Figure 18:
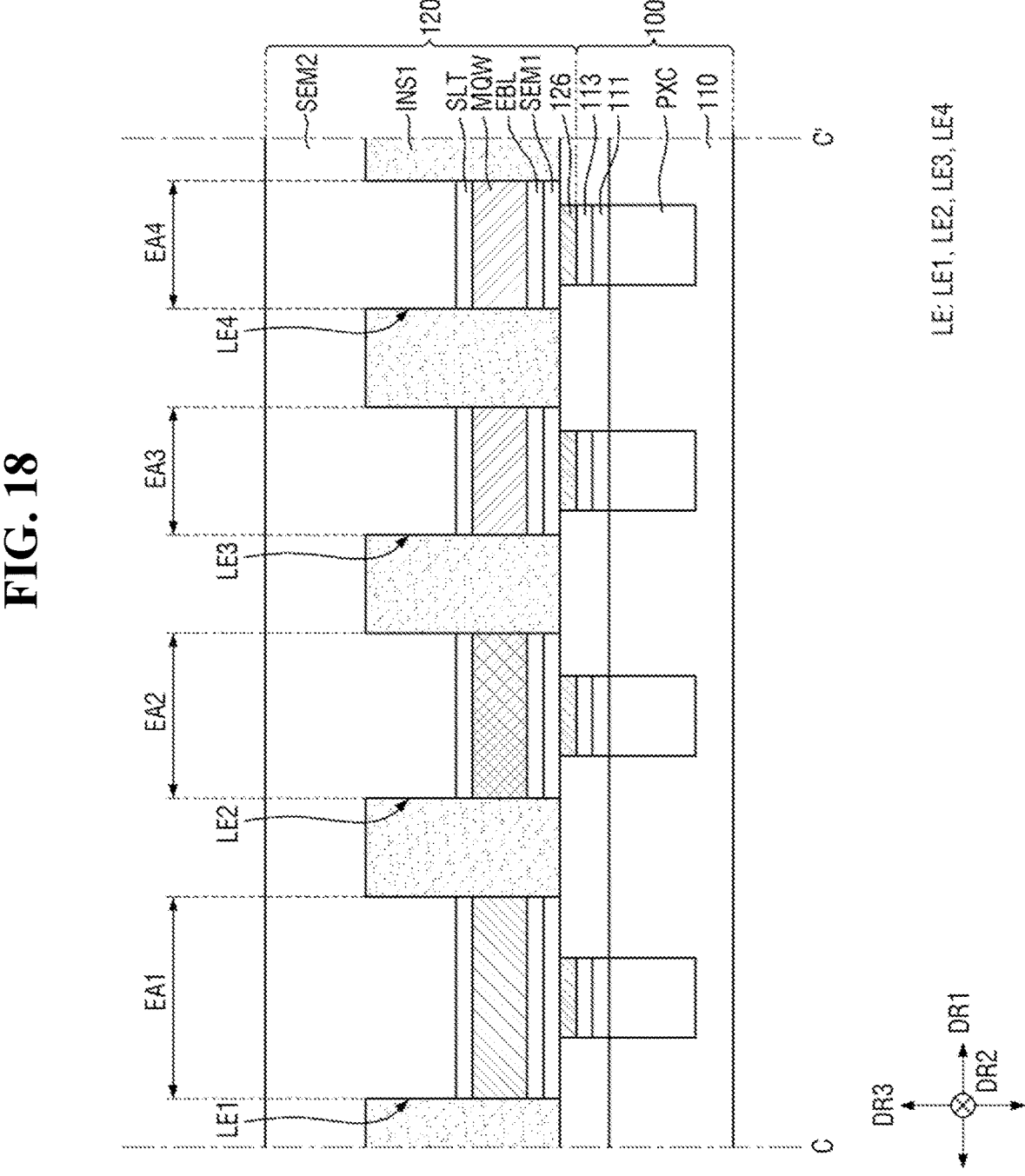
FIG. 18 is a schematic cross-sectional view showing an example of a display panel taken along line C-C' of FIG. 16.

FIG. 16 is a schematic view showing another example of the layout of area A of FIG. 2. FIG. 17 is a schematic view showing another example of the layout of pixels. FIG. 18 is a schematic cross-sectional view showing an example of a display panel taken along line C-C' of FIG. 16.

The embodiments of FIGS. 16 to 18 are substantially identical to the embodiments of FIGS. 2 and 3 except a fourth light-emitting element LE4 that emits the same light as the third light-emitting element LE3, and that the emission areas EA1, EA2, EA3 and EA4 are arranged in a PENTILE™ matrix; and, therefore, redundant descriptions will be omitted.

Referring to FIGS. 16 to 18, each of the pixels PX may include a first light-emitting element LE1 emitting a first light, a second light-emitting element LE2 emitting a second light, a third light-emitting element LE3 emitting a third light, and a fourth light-emitting element LE4 emitting a fourth light.

In the display area DA, the first light-emitting elements LE1 and the second light-emitting elements LE2 may be arranged alternately in the first direction DR1. The third light-emitting elements LE3 and the fourth light-emitting elements LE4 may be arranged alternately in the second direction DR2. The first light-emitting elements LE1, the second light-emitting elements LE2, the third light-emitting elements LE3 and the fourth light-emitting elements LE4 may be arranged sequentially and repeatedly in a first diagonal direction DD1 and a second diagonal direction DD2. The first diagonal direction DD1 may be a diagonal direction between the first and second directions DR1 and DR2, and the second diagonal direction DD2 may be perpendicular to the first diagonal direction DD1.

In each of the pixels PX, the first light-emitting elements LE1 and the second light-emitting elements LE2 may be arranged in the first direction DR1, and the third light-emitting elements LE3 and the fourth light-emitting elements LE4 may be arranged in the second direction DR2. In each of the pixels PX, the first light-emitting elements LE1 and the third light-emitting elements LE3 may be arranged in the first diagonal direction DD1, the second light-emitting elements LE2 and the third light-emitting elements LE3 may be arranged in the second diagonal direction DD2, and the first light-emitting elements LE1 and the fourth light-emitting elements LE4 may be arranged in the second diagonal direction DD2.

The fourth light-emitting element LE4 may be substantially identical to the third light-emitting element LE3. For example, the fourth light-emitting element LE4 may emit the third light and may have the same structure as the third light-emitting element LE3.

The first light-emitting element LE1 may be disposed in the first emission area EA1, the second light-emitting element LE2 may be disposed in the second emission area EA2, the third light-emitting element LE3 may be disposed in the third emission area EA3, and the fourth light-emitting element LE4 may be disposed in the fourth emission area EA4.

The first emission area EA1 may be greater than the second emission area EA2, the third emission area EA3 and the fourth emission area EA4. The area of the first emission area EA1 may be greater than the sum of the area of the third emission area EA3 and the area of the fourth emission area EA4. The area of the second emission area EA2 may be greater than the area of the third emission area EA3 and the area of the fourth emission area EA4. The area of the second emission area EA2 may be greater than the sum of the area of the third emission area EA3 and the area of the fourth emission area EA4. According to an embodiment, the area of the second emission area EA2 may be substantially equal to the sum of the area of the third emission area EA3 and the area of the fourth emission area EA4. The area of the third emission area EA3 may be substantially equal to that of the fourth emission area EA4.

A first diameter WE1 of the first light-emitting element LE1 may be greater than diameters WE2, WE3 and WE4 of the second light-emitting element LE2, the third light-emitting element LE3 and the fourth light-emitting element LE4. The second diameter WE2 of the second light-emitting element LE2 may be greater than diameters WE3 and WE4 of the third light-emitting element LE3 and the fourth light-emitting element LE4. The third diameter WE3 of the third light-emitting element LE3 may be substantially equal to the fourth diameter WE4 of the fourth light-emitting element LE4.

According to an embodiment of the disclosure, the distance between the light-emitting elements LE adjacent to each other may be different from light-emitting element to light-emitting element. For example, a first distance DA1 between the third light-emitting element LE3 and the fourth light-emitting element LE4 adjacent to each other in the second direction DR2 may be greater than a second distance DA2 between the first light-emitting element LE1 and the second light-emitting element LE2 adjacent to each other in the second direction DR2. The third distance DA3 between the third light-emitting elements LE3 adjacent to each other in the first direction DR1 may be greater than a fourth distance DA4 between the first light-emitting element LE1 and the second light-emitting element LE2 adjacent to each other in the first direction DR1. A first diagonal distance DG1 between the first light-emitting element LE1 and the third light-emitting element LE3 adjacent to each other in the first diagonal direction DD1 may be different from a second diagonal distance DG2 between the second light-emitting element LE2 and the fourth light-emitting element LE4 adjacent to each other in the first diagonal direction DD1. A third diagonal distance DG3 between the second light-emitting element LE2 and the third light-emitting element LE3 adjacent to each other in the second diagonal direction DD2 may be different from a fourth diagonal distance DG4 between the first light-emitting element LE1 and the fourth light-emitting element LE4 adjacent to each other in the second diagonal direction DD2.

In an embodiment in which the first diameter WE1 of the first light-emitting element LE1 is greater than the second diameter WE2 of the second light-emitting element LE2, the first diagonal distance DG1 may be smaller than the second diagonal distance DG2 and the third diagonal distance DG3 may be greater than the fourth diagonal distance DG4. It is, however, to be understood that the disclosure is not limited thereto. The distance between the light-emitting elements LE adjacent to each other may vary depending on the arrangement and diameters of the light-emitting elements LE.

Although the distances DA1 to DA4 and DG1 to DG4 between the light-emitting elements LE1, LE2, LE3 and LE4 are measured between the circumferences of the light-emitting elements LE1, LE2, LE3 and LE4 in the example shown in FIG. 17, the disclosure is not limited thereto. The distances between the light-emitting elements LE1, LE2, LE3 and LE4 described with reference to FIG. 26 may be equally applied when the distances between the light-emitting elements LE1, LE2, LE3 and LE4 are measured between the centers. It should be understood, that in an embodiment where the light-emitting elements LE1, LE2, LE3 and LE4 have different diameters, the relative distances measured between on the borders of the light-emitting elements LE1, LE2, LE3 and LE4 may be different from the relative distances measured between the centers of the light-emitting elements LE1, LE2, LE3 and LE4.

Hereinafter, processing steps of fabricating the display device 1 will be described with reference to other drawings.

Figure 19:
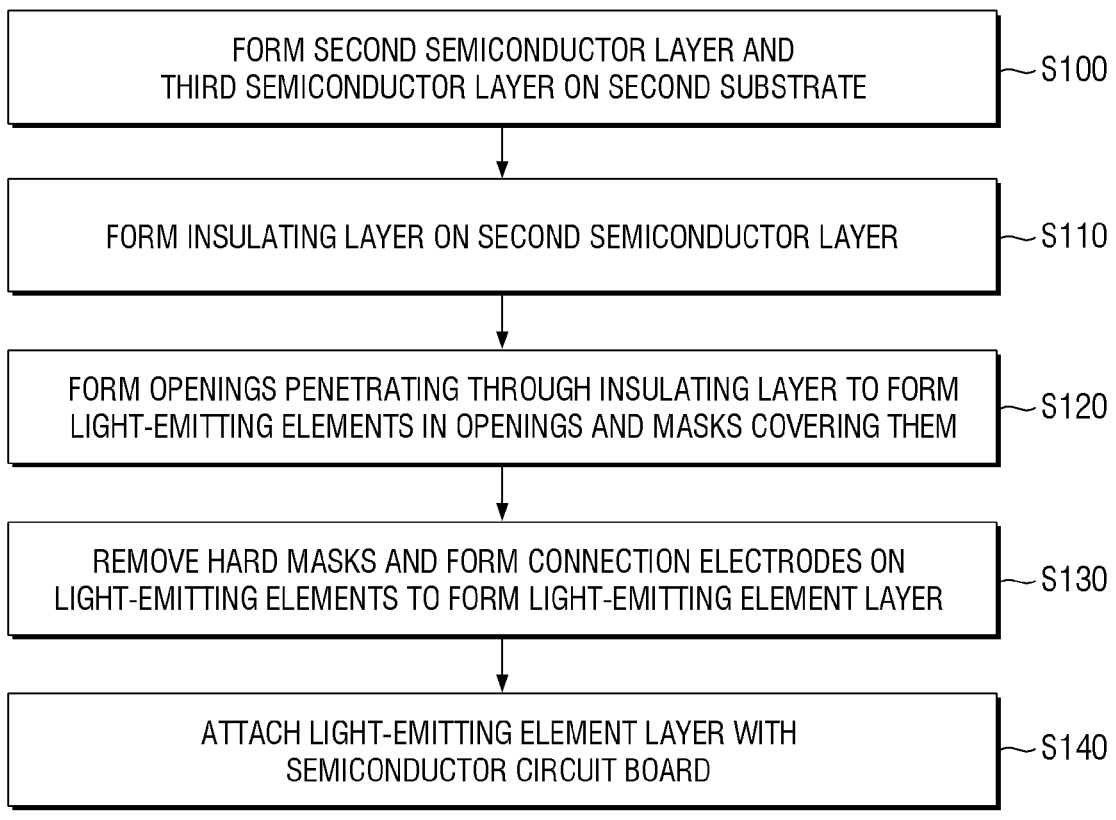
FIG. 19 is a flowchart illustrating a method of fabricating a display device according to an embodiment of the disclosure.

FIG. 19 is a flowchart for illustrating a method of fabricating a display device according to an embodiment of the disclosure. FIG. 20 is a flowchart for illustrating an example of step S120 of FIG. 19. FIGS. 21 to 32 are schematic cross-sectional views for illustrating the method of fabricating a display device according to an embodiment of the disclosure.

FIGS. 21 to 32 are schematic cross-sectional views showing structures of layers of the display panel 10 of the display device 1 in the order that the layers may be formed. FIGS. 21 to 32 show a process of fabricating the light-emitting element layer 120, which may be corresponded to the cross-sectional view of FIG. 8. Hereinafter, a method of fabricating the display panel shown in FIGS. 21 to 32 will be described in conjunction with FIGS. 19 and 20.

Referring to FIG. 21, a second semiconductor layer SEM2 and a third semiconductor layer SEM3 may be formed on a second substrate 210 (step S100 of FIG. 19).

Initially, the second substrate 210 is prepared. The second substrate 210 may be a sapphire substrate (for example, Al2O3) or a silicon wafer including silicon. It should be understood, however, that the disclosure is not limited thereto. According to an embodiment of the disclosure, the second substrate 210 is a sapphire substrate.

The second semiconductor layer SEM2 and the third semiconductor layer SEM3 may be formed on the second substrate 210. The second semiconductor layer SEM2 and the third semiconductor layer SEM3 may be grown by an epitaxial process, and may be formed by growing a seed crystal. The method of forming the semiconductor layer may include an electron beam deposition method, physical vapor deposition (PVD), chemical vapor deposition (CVD), plasma laser deposition (PLD), dual-type thermal evaporation, sputtering, metal-organic chemical vapor deposition (MOCVD), etc. For example, the method may be carried out by metal-organic chemical vapor deposition (MOCVD). It is, however, to be understood that the disclosure is not limited thereto.

A precursor material for forming the second semiconductor layer SEM2 and the third semiconductor layer SEM3 is not particularly limited, and a variety of materials that may form the target material may be selected. For example, the precursor material may be a metal precursor including an alkyl group such as a methyl group or an ethyl group. For example, it may be, but is not limited to, a compound such as trimethyl gallium (Ga(CH3)3), trimethyl aluminum (Al (CH3)3), or triethyl phosphate ((C2H5)3PO4).

The third semiconductor layer SEM3 may be formed on the second substrate 210. Although the third semiconductor layer SEM3 is a single layer in the drawings, the disclosure is not limited thereto. The third semiconductor layer SEM3 may be formed of multiple layers. The third semiconductor layer SEM3 may be disposed to reduce a difference in lattice constant between a second semiconductor layer SEM2 and the second substrate 210. For example, the third semiconductor layer SEM3 may include an undoped semiconductor, and may be a material not doped into an n-type or p-type. In an embodiment, the third semiconductor layer SEM3 may include, but is not limited to, at least one of undoped InAlGaN, GaN, AlGaN, InGaN, AlN, and InN.

Referring to FIG. 22, an insulating layer INS1 may be formed on the second semiconductor layer SEM2 (step S110 of FIG. 19).

The insulating layer INS1 may be formed entirely on the second semiconductor layer SEM2. The insulating layer INS1 may include an insulating material such as silicon oxide (SiOx), silicon nitride (SiNx) and silicon oxynitride (SiOxNy), and may work as a mask used when forming the light-emitting elements LE.

Referring to FIG. 23, openings penetrating through the insulating layer INS1 may be formed to form light-emitting elements LE and hard masks HK1 and HK2 covering the light emitting elements in each of the openings (step S120 of FIG. 19).

The insulating layer INS1 is etched (First etch) to form the first openings OP1 exposing the second semiconductor layer SEM2 (step S121 of FIG. 20). The first openings OP1 are spaced apart from each other. A first light-emitting element LE1 may be formed in each of the first openings OP1. The width W1 of the first openings OP1 may be larger than other openings formed in a subsequent process.

Referring to FIG. 24, first light-emitting elements LE1 may be formed in the first openings OP1, and a first hard mask HK1 covering the first light-emitting elements LE1 may be formed (step S122 of FIG. 20).

The process of forming the first light-emitting elements LE1 may be carried out via an epitaxial process in the same manner as the second semiconductor layer SEM2 and the third semiconductor layer SEM3. When the upper surface of the second semiconductor layer SEM2 is exposed via the first openings OP1, a precursor material is injected on the second semiconductor layer SEM2 to grow a semiconductor crystal. The second semiconductor layer SEM2 may be continuously grown by the precursor material.

A superlattice layer SLT, a first active layer MQW1, an electron blocking layer EBL, and the first semiconductor layer SEM1 may be sequentially grown to form the first light-emitting element LE1. In this process, the first light-emitting elements LE1 having the first active layer MQW1 may be formed, and the light-emitting elements LE2 and LE3 including the second active layer MQW2 or the first active layer MQW1 may be formed in subsequent repeated processes.

The first hard mask HK1 covering the first light-emitting element LE1 may formed. The first hard mask HK1 may include an insulating material such as silicon oxide (SiOx), silicon nitride (SiNx) and silicon oxynitride (SiOxNy), and the insulating layer INS 1 and the first hard mask HK1 may include a same material. However, the embodiments of the disclosure are not limited thereto. The first hard mask HK1 may be a protective film or a barrier film that protects the first light-emitting element LE1.

Referring to FIG. 25, the second openings OP2 penetrating through the first hard mask HK1 and the insulating layer INS1 may be formed (step S123 of FIG. 20).

The first hard mask HK1 and the insulating layer INS1 are etched (Second etch) to form the second openings OP2 exposing the second semiconductor layer SEM2. The second openings OP2 are disposed adjacent to the first openings OP1, and the second openings OP2 are spaced apart from each other. The width W2 of the second openings OP2 may be smaller than the width W1 of the first openings OP1.

Referring to FIG. 26, second light-emitting elements LE2 may be formed in the second openings OP2, and a second hard mask HK2 covering the second light-emitting elements LE2 may be formed (step S124 of FIG. 20).

The second light-emitting elements LE2 may be formed by injecting a precursor material onto the upper surface of the second semiconductor layer SEM2 exposed by the second openings OP2 to grow a semiconductor crystal. The second semiconductor layer SEM2 may be continuously grown using the precursor material. A superlattice layer SLT, a second active layer MQW2, an electron blocking layer EBL, and the first semiconductor layer SEM1 are sequentially grown to form the second light-emitting element LE2. The composition of the second active layer MQW2 may be different from that of the first active layer MQW1 of the first light-emitting element LE1 described above. For example, the content of indium in the second active layer MQW2 may be greater than the content of indium in the first active layer MQW1.

A second hard mask HK2 covering the second light-emitting element LE2 and the first hard mask HK1 may be formed. The second hard mask HK2 may include an insulating material such as silicon oxide (SiOx), silicon nitride (SiNx) and silicon oxynitride (SiOxNy), and the first hard mask HK1 and the second hard mask HK2 may include a same material.

Referring to FIG. 27, the third openings OP3 penetrating through the first hard mask HK1, the second hard mask HK2, and the insulating layer INS1 may be formed (step S125 of FIG. 20).

The third openings OP3 exposing the second semiconductor layer SEM2 may be formed by etching the first hard mask HK1, the second hard mask HK2 and the insulating layer INS1 (Third etch). The third openings OP3 are disposed adjacent to the first openings OP1 and the second openings OP2, and the third openings OP3 are spaced apart from each other. The width W3 of the third openings OP3 may be smaller than the width W1 of the first openings OP1 and the width W2 of the second openings OP2.

Referring to FIG. 28, third light-emitting elements LE3 may be formed in the third openings OP3, and the first hard mask HK1 and the second hard mask HK2 may be removed (step S125 of FIG. 20).

The third light-emitting elements LE3 may be formed by injecting a precursor material onto the upper surface of the second semiconductor layer SEM2 exposed by the third openings OP3 to grow a semiconductor crystal. The second semiconductor layer SEM2 may be continuously grown by the precursor material. A superlattice layer SLT, a third active layer MQW2, an electron blocking layer EBL, and the first semiconductor layer SEM1 are sequentially grown to form the third light-emitting element LE3. The composition of the third active layer MQW3 may be different from that of the second active layer MQW2 of the second light-emitting element LE2 described above. For example, the content of indium in the third active layer MQW3 may be greater than the content of indium in the second active layer MQW2.

The first hard mask HK1 and the second hard mask HK2 may be removed. As the first hard mask HK1 and the second hard mask HK2 are removed, the surface of the first semiconductor layer SEM1 of each of the light-emitting elements LE1, LE2 and LE3 may be exposed outside the insulating layer INS1. For example, the surface of the first semiconductor layer SEM1 of each of the light-emitting elements LE1, LE2 and LE3 may be aligned with the surface of the insulating layer INS1 and may be in line with it.

The process of removing the first hard mask HK1 and the second hard mask HK2 may be carried out via an etching process. The etching process may be dry etching, wet etching, reactive ion etching (ME), deep reactive ion etching (DRIE), inductively-coupled-plasma reactive ion etching (ICP-RIE), etc.

Figure 29:
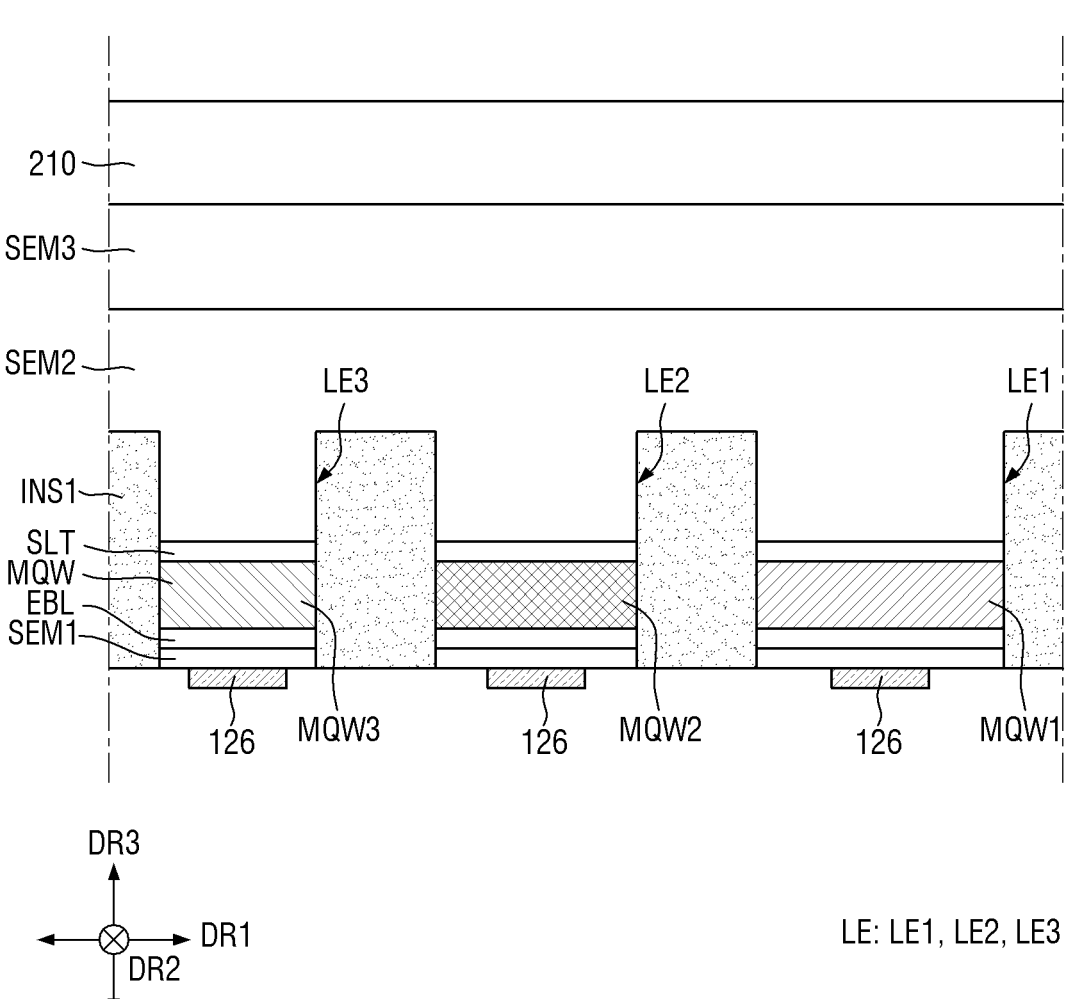

Referring to FIG. 29, the connection electrodes 126 may be formed on the light-emitting elements LE1, LE2 and LE3 to form a light-emitting element layer 120 (step S130 of FIG. 19).

The connection electrodes 126 may be formed directly on the first semiconductor layer SEM1 of each of the light-emitting elements LE1, LE2 and LE3 via a photo process. In this manner, the light-emitting element layer 120 disposed on the second substrate 210 may be produced.

Figure 30:
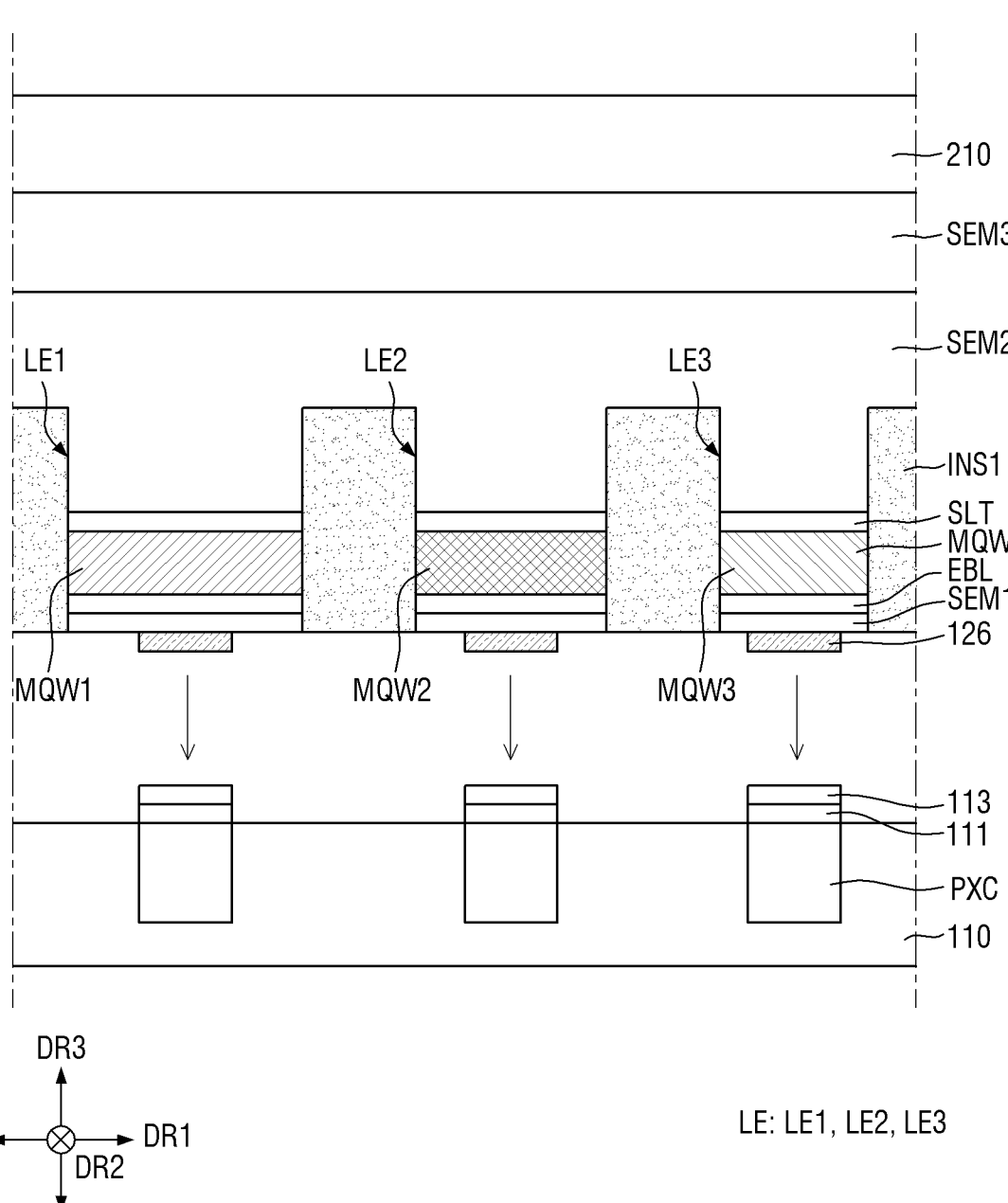

Referring to FIG. 30, the light-emitting element layer 120 and the semiconductor circuit board 100 may be attached together (step S140 of FIG. 19).

The semiconductor circuit board 100 (refer to FIGS. 31 and 32) may be prepared. The semiconductor circuit board 100 may include pixel circuits PXC, pixel electrodes 111, and contact electrodes 113 on the first substrate 110.

The pixel electrodes 111 may be formed on the first substrate 110 on which the pixel circuits PXC may be formed. A contact electrode material layer may be stacked on the pixel electrodes 111 and etched to form contact electrodes 113. The contact electrode material layer may include gold (Au), copper (Cu), aluminum (Al) or tin (Sn).

After aligning the light-emitting element layer 120 (refer to FIGS. 31 and 32) on the semiconductor circuit board 100 (refer to FIGS. 31 and 32), the semiconductor circuit board 100 and the light-emitting element layer 120 may be attached together.

The contact electrodes 113 of the semiconductor circuit board 100 may be brought into contact with the connection electrodes 126 of the light-emitting element layer 120. The semiconductor circuit board 100 and the light-emitting element layer 120 may be attached together by fusion bonding the contact electrodes 113 with the connection electrodes 126 while applying heat.

Figure 31:
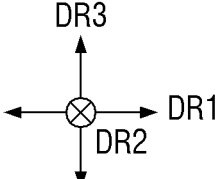

Referring to FIGS. 31 and 32, the second substrate 210 of the light-emitting element layer 120 and the third semiconductor layer SEM3 are removed by etching (Fourth etch), so that the display device according to the embodiment of the disclosure can be fabricated. The second substrate 210 and the third semiconductor layer SEM3 may be removed by chemical mechanical polishing (CMP) or the above-described etching process.

Hereinafter, a display device according to an embodiment of the disclosure will be described with reference to other drawings.

Figure 35:
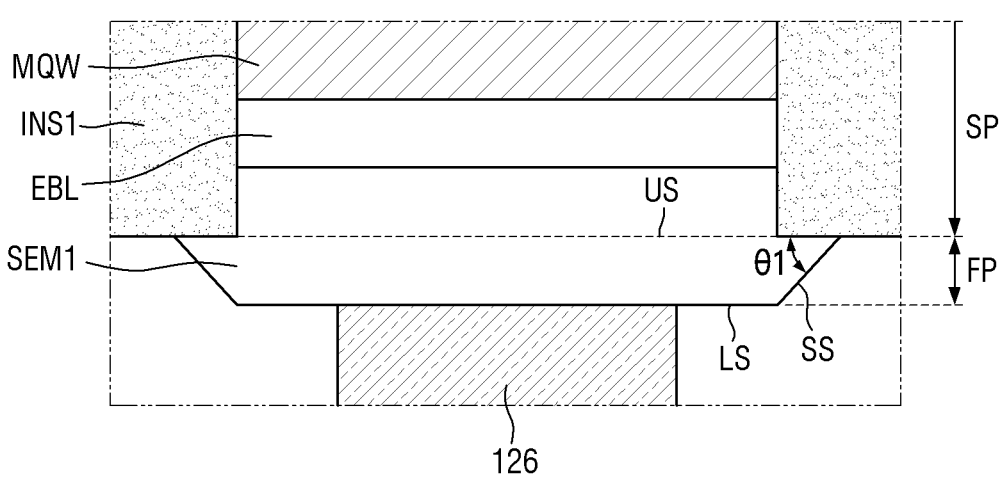
FIG. 35 is a cross-sectional view showing an example of a first semiconductor layer of a light-emitting element according to an embodiment.

FIG. 33 is a schematic cross-sectional view showing an example of a display panel of a display device according to an embodiment of the disclosure. FIG. 34 is a schematic cross-sectional view showing an example of light-emitting elements according to an embodiment. FIG. 35 is a schematic cross-sectional view showing an example of a first semiconductor layer of a light-emitting element according to an embodiment. FIG. 36 is a schematic view showing an example of the layout of light-emitting elements according to an embodiment. FIG. 37 is a schematic view showing an example of the layout of light-emitting elements according to an embodiment. FIG. 38 is a schematic perspective view showing an example of a first semiconductor layer of a light-emitting element according to an embodiment. FIG. 39 is a cross-sectional view showing an example of a first semiconductor layer of a light-emitting element according to an embodiment.

The embodiments of FIGS. 33 to 39 are substantially identical to the embodiment of FIGS. 2 and 3 except that a first light-emitting element LE1, a second light-emitting element LE2 and a third light-emitting element LE3 have different lengths, and that partially protrude out of an insulating layer INS1; and, therefore, redundant descriptions will be omitted.

The light-emitting element layer 120 may include light-emitting elements LE, an insulating layer INS1, a connection electrode 126, and a common connection electrode 127.

The light-emitting element layer 120 may include first emission areas EA1, second emission areas EA2, and third emission areas EA3 corresponded to the respective light-emitting elements LE. The widths of the first emission areas EA1, the second emission areas EA2 and the third emission areas EA3 may be equal to the maximum width of the light-emitting elements LE in the first direction DR1. For example, the maximum width of the light-emitting elements LE including a part that protrudes from the lower surface of the insulating layer INS1 facing the semiconductor circuit board 100 in each light-emitting elements LE may be the respective maximum width of the emission areas EA1, EA2 and EA3.

The light-emitting elements LE may include a first light-emitting element LE1 corresponded to the first emission area EA1, a second light-emitting element LE2 corresponded to the second emission area EA2, and a third light-emitting element LE3 corresponded to the third emission area EA3. Each of the light-emitting elements LE may include a connection electrode 126, a first semiconductor layer SEM1, an electron blocking layer EBL, an active layer MQW, a superlattice layer SLT and a second semiconductor layer SEM2 in the third direction DR3.

The first light-emitting element LE1 may include a first connection electrode 126a, a first semiconductor layer SEM1, an electron blocking layer EBL, a first active layer MQW1, a first superlattice layer SLT1, and a second semiconductor layer SEM2. The second light-emitting element LE2 may include a second connection electrode 126b, the first semiconductor layer SEM1, an electron blocking layer EBL, a second active layer MQW2, a second superlattice layer SLT2, and the second semiconductor layer SEM2. The third light-emitting element LE3 may include a third connection electrode 126c, the first semiconductor layer SEM1, an electron blocking layer EBL, a third active layer MQW3, a third superlattice layer SLT3, and the second semiconductor layer SEM2.

According to an embodiment of the disclosure, the first light-emitting element LE1, the second light-emitting element LE2 and the third light-emitting device LE3 may different heights. The heights H1, H2 and H3 of the light-emitting elements LE1, LE2 and LE3 refer to the distances from the lower surface of the first semiconductor layer SEM1 to the upper surface of the second semiconductor layer SEM2.

As shown in FIGS. 33 and 34, the first height H1 of the first light-emitting element LE1 may be smaller than the second height H2 of the second light-emitting element LE2, and the second height H2 of the second light-emitting element LE2 may be smaller than the third height H3 of the third light-emitting element LE3. According to an embodiment, the third height H3 of the third light-emitting element LE3 may be smaller than the second height H2 of the second light-emitting element LE2, and the second height H2 of the second light-emitting element LE2 may be smaller than the first height H1 of the first light-emitting element LE1. According to an embodiment, the second height H2 of the second light-emitting element LE2 may be greater than the first height H1 of the first light-emitting element LE1, and the first height H1 of the first light-emitting element LE1 may be greater than the third height H3 of the third light-emitting element LE3.

As the light-emitting elements LE1, LE2 and LE3 have different heights H1, H2 and H3, a process of removing a hard mask for masking the light-emitting elements LE1, LE2 and LE3 in a fabrication process to be described below can be omitted, so that the process can become simpler. A more detailed description thereon will be given below.

The heights H1, H2 and H3 of the light-emitting elements LE1, LE2 and LE3 may be adjusted according to the thickness of the superlattice layer SLT of the light-emitting elements LE1, LE2 and LE3. For example, in the structure of FIGS. 33 and 34, the thickness T1 of the first superlattice layer SLT1 of the first light-emitting element LE1 may be smaller than the thickness T2 of the second superlattice layer SLT2 of the second light-emitting element LE2, and the thickness T2 of the second superlattice layer SLT2 of the second light-emitting element LE2 may be smaller than the thickness T3 of the third superlattice layer SLT3 of the third light-emitting element LE3. The thicknesses of the first semiconductor layer SEM1, the electron blocking layer EBL, the active layer MQW and the second semiconductor layer SEM2 of the light-emitting elements LE1, LE2 and LE3 may all be substantially equal.

It should be understood, however, that the disclosure is not limited thereto. The heights H1, H2 and H3 of the light-emitting elements LE1, LE2 and LE3 may become different by adjusting the thickness of the electron blocking layer EBL of each of the light-emitting elements LE1, LE2 and LE3. In other examples, the heights H1, H2 and H3 of the light-emitting elements LE1, LE2 and LE3 may become different by adjusting the thickness of the electron blocking layer EBL as well as the thickness of the superlattice layer SLT of each of the light-emitting elements LE1, LE2 and LE3.

Each of the light-emitting elements LE1, LE2 and LE3 may include a first region FP having a varying width and a second region SP having a constant width. As used herein, a varying width may mean that the width gradually increases in a selected direction, for example, the third direction DR3. A constant width may mean that the width is constant in the third direction DR3. The width of each of the light-emitting elements LE1, LE2 and LE3 may mean the length extending in the first direction DR1.

The first region FP of each of the light-emitting elements LE1, LE2 and LE3 may be the end of each of the light-emitting elements LE1, LE2 and LE3, while the second region SP may be the other part than the first region FP. For example, the first region FP of each of the light-emitting elements LE1, LE2 and LE3 may contact the connection electrodes 126.

As shown in FIGS. 36 to 38, the first region FP may have a hexagonal or circular shape in a plan view and the second region SP may have a circular shape. For example, the shape of the first region FP disposed on the second region SP having a circular shape may have one of two shapes, i.e., hexagonal and circular shapes in a plan view. The first region FP may be formed as a hexagonal column or a circular column, and in this instance, the side surfaces may be included. A surface of the first region FP, e.g., the lower surface of the first region FP in contact with the connection electrodes 126 may be made flat, to ensure electrical contact characteristics with the connection electrodes 126. The shapes of the first region FP may be adjusted depending on growth conditions of the light-emitting elements.

As shown in FIG. 35, the cross-sectional shape of the first region FP may be an inverted trapezoid. The length of the lower surface LS of the first region FP may be smaller than the length of the upper surface US. Accordingly, the width of the first region FP in the first direction DR1 may increase from the lower surface LS to the upper surface US of the first area FP in the third direction DR3. For example, in the first region FP, the width of each of the light-emitting elements LE1, LE2 and LE3 increases in the third direction DR3. The angle θ1 between the side surface SS and the upper surface US of the first region FP may be, but is not limited to, in a range of about 20 degrees or more and less than about 90 degrees. According to an embodiment, the side surfaces SS of the first region FP may have a rounded shape as shown in FIG. 39.

According to an embodiment of the disclosure, the maximum width D1 of the first region FP may be greater than the maximum width D2 (refer to FIG. 33) of the second region SP. The first region FP may have the maximum width D1 (refer to FIG. 33) adjacent to the insulating layer INS1. When the maximum width D1 of the first region FP is greater than the maximum width D2 of the second region SP, light emitted from each active layer MQW may be scattered and diffused in the first region FP to improve light-emitting efficiency.

The first region FP may include the first semiconductor layer SEM1. The first semiconductor layer SEM1 may protrude out of the insulating layer INS1. It should be understood, however, that the disclosure is not limited thereto. The first region FP may further include an electron blocking layer EBL, may further include an electron blocking layer EBL and an active layer MQW, or may further include an electron blocking layer EBL, an active layer MQW and a superlattice layer SLT.

As the light-emitting elements LE1, LE2 and LE3 have different heights H1, H2 and H3, the connection electrodes 126 electrically connecting the light-emitting elements LE1, LE2 and LE3 with the contact electrodes 113 may have different thicknesses as well. For example, the thickness T4 of the first connection electrode 126a corresponded to the first light-emitting element LE1 may be greater than the thickness T5 of the second connection electrode 126b corresponded to the second light-emitting element LE2. The thickness T5 of the second connection electrode 126b may be greater than the thickness T6 of the third connection electrode 126c corresponded to the third light-emitting element LE3. It should be understood, however, that the disclosure is not limited thereto. The thickness of the connection electrode corresponding to the light-emitting element having the smallest height among the light-emitting elements LE1, LE2 and LE3 may be the largest, and the thickness of the connection electrode corresponding to the light-emitting element having the largest height may be the smallest.

The insulating layer INS1 may be disposed to surround each of the light-emitting elements LE1, LE2 and LE3, and may directly contact the side surfaces of each of the light-emitting elements LE1, LE2 and LE3. As shown in FIGS. 33 and 34, the insulating layer INS1 may have the same thickness in each of the emission areas EA1, EA2 and EA3. For example, the insulating layer INS1 may directly contact the side surfaces of the second semiconductor layer SEM2, the first superlattice layer SLT1, the first active layer MQW1, the electron blocking layer EBL and the first semiconductor layer SEM1 of the first light-emitting element LE1. The insulating layer INS1 may be in direct contact with the side surfaces of the second semiconductor layer SEM2, the second superlattice layer SLT2 and the second active layer MQW2 of the second light-emitting element LE2, and may not contact the side surfaces of the electron blocking layer EBL and the first semiconductor layer SEM1 of the second light-emitting element LE2. The insulating layer INS1 may directly contact the side surfaces of the second semiconductor layer SEM2 and the third superlattice layer SLT3 of the third light-emitting element LE3, and may not contact the side surfaces of the third active layer MQW3, the electron blocking layer EBL and the first semiconductor layer SEM1. The first region FP of the first light-emitting element LE1 may contact the insulating layer INS1, the first region FP of the second light-emitting element LE2 may be spaced apart from the insulating layer INS1, and the first region FP of the third light-emitting element LE3 may be spaced apart from the insulating layer INS1.

As described above, according to the embodiment, the light-emitting elements LE1, LE2 and LE3 have different heights, and the first region FP having a varying width may be formed at one end thereof, so that the light-emitting efficiency of the light-emitting elements LE1, LE2 and LE3 can be improved.

FIG. 40 is a cross-sectional view showing an example of a display panel of a display device according to an embodiment of the disclosure.

The embodiment of FIG. 40 is substantially identical to the embodiment of FIGS. 33 to 39 except that the thickness of the insulating layer INS1 is different across emission areas EA1, EA2, and EA3; and, therefore, redundant descriptions will be omitted.

The insulating layer INS1 may be disposed to surround each of the light-emitting elements LE1, LE2 and LE3, and may directly contact the side surfaces of each of the light-emitting elements LE1, LE2 and LE3. The first region FP of each of the light-emitting elements LE1, LE2 and LE3 may protrude from the lower surface of the insulating layer INS1, and the second region SP may be disposed in the insulating layer INS1. The upper surface of the first region FP of each of the light-emitting elements LE1, LE2 and LE3 may directly contact the lower surface of the insulating layer INS1.

According to an embodiment of the disclosure, the insulating layer INS1 may have different thicknesses across the emission areas EA1, EA2 and EA3. As the insulating layer INS1 has different thicknesses across emission areas, it may be disposed to surround the second region SP of each of the light-emitting elements LE1, LE2 and LE3. The insulating layer INS1 surrounds each of the light-emitting elements LE1, LE2 and LE3 except the first region FP, so that it is possible to prevent deterioration of device characteristics which may occur if the light-emitting elements LE1, LE2 and LE3 are exposed to oxygen in a subsequent process.

As shown in FIG. 40, a thickness T7 of the insulating layer INS1 overlapping the first emission area EA1 may be smaller than a thickness T8 of the insulating layer INS1 overlapping with the second emission area EA2, and a thickness T8 of the insulating layer INS1 overlapping the second emission area EA2 may be smaller than a thickness T9 of the insulating layer INS1 overlapping the third emission area EA3. For example, the thickness T7 of the insulating layer INS1 overlapping the first emission area EA1 may be the smallest, while the thickness T9 of the insulation layer INS1 overlapping the third emission area EA3 may be the largest.

The thickness of the insulating layer INS1 in each of the emission areas EA1, EA2 and EA3 is not limited thereto, and may vary depending on the height of each of the light-emitting elements LE1, LE2 and LE3 corresponding to the emission areas EA1, EA2 and EA3. For example, when the height of the first light-emitting element LE1 is greater than the height of the second light-emitting element LE2 and the height of the second light-emitting element LE2 is greater than the height of the third light-emitting element LE3, the thickness T7 of the insulating layer INS1 overlapping the first emission area EA1 may be greater than the thickness T8 of the insulating layer INS1 overlapping the second emission area EA2, and the thickness T8 of the insulating layer INS1 overlapping the second emission area EA2 may be greater than the thickness T9 of the insulating layer INS1 overlapping the third emission area EA3.

FIGS. 41 to 49 are cross-sectional views for illustrating a method of fabricating a display device according to an embodiment of the disclosure.

FIGS. 41 to 49 are cross-sectional views showing structures of layers of the display panel 10 of the display device 1 in the order that the layers may be formed. FIGS. 41 to 49 show a process of fabricating the light-emitting element layer 120, which may be corresponded to the cross-sectional view of FIG. 34. The elements already described above with respect to FIGS. 21 to 32 will not be described again.

Referring to FIG. 41, first light-emitting elements LE1 may be formed in the first openings OP1, and a first hard mask HK1 covering the first light-emitting elements LE1 may be formed, as described above with reference to FIG. 24.

The process of forming the first light-emitting elements LE1 may be carried out via an epitaxial process in the same manner as the second semiconductor layer SEM2 and the third semiconductor layer SEM3. When the upper surface of the second semiconductor layer SEM2 is exposed via the first openings OP1, a precursor material is injected on the second semiconductor layer SEM2 to grow a semiconductor crystal. The second semiconductor layer SEM2 may be continuously grown by the precursor material. A first superlattice layer SLT1, a first active layer MQW1, an electron blocking layer EBL, and a first semiconductor layer SEM1 are sequentially grown to form the first light-emitting element LE1.

The first semiconductor layer SEM1 of the first light-emitting element LE1 may protrude above the surface of the insulating layer INS1. The first semiconductor layer SEM1 may protrude above the surface of the insulating layer INS1 by increasing the growth time of the first semiconductor layer SEM1. The first semiconductor layer SEM1 protrudes above the surface of the insulating layer INS1 and spreads widely on the surface of the insulating layer INS1. The shape of the protruding portion of the first semiconductor layer SEM1 may be a hexagonal column or a cylinder, and may be formed by controlling the growth conditions of the first semiconductor layer SEM1, e.g., temperature or a flow of a reaction gas.

Referring to FIG. 42, the second openings OP2 penetrating through the first hard mask HK1 and the insulating layer INS1 may be formed.

The first hard mask HK1 and the insulating layer INS1 are etched (Second etch) to form the second openings OP2 exposing the second semiconductor layer SEM2. The second openings OP2 are disposed adjacent to the first openings OP1, and the second openings OP2 are spaced apart from each other.

Referring to FIG. 43, second light-emitting elements LE2 may be formed in the second openings OP2, and a second hard mask HK2 covering the second light-emitting elements LE2 may be formed.

The second light-emitting elements LE2 may be formed by injecting a precursor material onto the upper surface of the second semiconductor layer SEM2 exposed by the second openings OP2 to grow a semiconductor crystal. The second semiconductor layer SEM2 may be continuously grown by the precursor material. A second superlattice layer SLT2, a second active layer MQW2, an electron blocking layer EBL, and a first semiconductor layer SEM1 are sequentially grown to form the second light-emitting element LE2. The composition of the second active layer MQW2 may be different from that of the first active layer MQW1 of the first light-emitting element LE1 described above. For example, the content of indium in the second active layer MQW2 may be greater than the content of indium in the first active layer MQW1. The second superlattice layer SLT2 may be formed to have a thickness different from that of the first superlattice layer SLT1 of the first light-emitting element LE1 described above. For example, the thickness of the second superlattice layer SLT2 may be greater than the thickness of the first superlattice layer SLT1.

A second hard mask HK2 covering the second light-emitting element LE2 and the first hard mask HK1 may be formed. The second hard mask HK2 may include an insulating material such as silicon oxide (SiOx), silicon nitride (SiNx) and silicon oxynitride (SiOxNy), and the first hard mask HK1 and the second hard mask HK2 may include a same material.

Referring to FIG. 44, the third openings OP3 penetrating through the first hard mask HK1, the second hard mask HK2 and the insulating layer INS1 may be formed.

The third openings OP3 exposing the second semiconductor layer SEM2 may be formed by etching the first hard mask HK1, the second hard mask HK2 and the insulating layer INS1 (Third etch). The third openings OP3 are disposed adjacent to the first openings OP1 and the second openings OP2, and the third openings OP3 are spaced apart from each other.

Referring to FIGS. 45 and 46, third light-emitting elements LE3 may be formed in the third openings OP3, and the first hard mask HK1 and the second hard mask HK2 are removed.

The third light-emitting elements LE3 may be formed by injecting a precursor material onto the upper surface of the second semiconductor layer SEM2 exposed by the third openings OP3 to grow a semiconductor crystal. The second semiconductor layer SEM2 may be continuously grown by the precursor material. A third superlattice layer SLT3, a third active layer MQW2, an electron blocking layer EBL, and a first semiconductor layer SEM1 are sequentially grown to form the third light-emitting element LE3. The composition of the third active layer MQW23 may be different from that of the second active layer MQW2 of the second light-emitting element LE2 described above. For example, the content of indium in the third active layer MQW3 may be greater than the content of indium in the second active layer MQW2. The third superlattice layer SLT3 may be formed to have a thickness different from that of the second superlattice layer SLT2 of the second light-emitting element LE2 described above. For example, the thickness of the third superlattice layer SLT3 may be greater than the thickness of the second superlattice layer SLT2.

The first hard mask HK1 and the second hard mask HK2 are removed. As the first hard mask HK1 and the second hard mask HK2 are removed, at least one end of each of the light-emitting elements LE1, LE2 and LE3 may be exposed outside the insulating layer INS1. For example, the first region FP having a varying width of the first light-emitting element LE1 may protrude outside the surface of the insulating layer INS1. The first region FP having the varying width and a portion of the second region SP having a constant width of each of the second light-emitting element LE2 and the third light-emitting element LE3 may protrude outside the surface of the insulating layer INS1.

Connection electrodes 126 may be formed on the light-emitting elements LE1, LE2 and LE3, so that the light-emitting element layer 120 may be formed.

The connection electrodes 126 may be formed directly on the first semiconductor layer SEM1 of each of the light-emitting elements LE1, LE2 and LE3 via a photo process. As the light-emitting elements LE1, LE2 and LE3 have different heights, the connection electrodes 126 formed on the light-emitting elements LE1, LE2 and LE3 may have different heights as well. For example, the height of the first connection electrode 126a corresponded to the first light-emitting element LE1 may be greater than the height of the second connection electrode 126b corresponded to the second light-emitting element LE2. The height of the second connection electrode 126b may be greater than the height of the third connection electrode 126c corresponded to the third light-emitting element LE3.

In this manner, the light-emitting element layer 120 disposed on the second substrate 210 may be produced.

Figure 47:
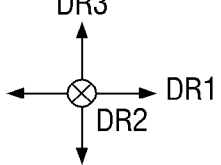

Referring to FIG. 47, the light-emitting element layer 120 (refer to FIGS. 48 and 49) and the semiconductor circuit board 100 (refer to FIGS. 48 and 49) may be attached together.

The semiconductor circuit board 100 is prepared. The semiconductor circuit board 100 may include the pixel circuits PXC, pixel electrodes 111, and contact electrodes 113 on the first substrate 110.

The pixel electrodes 111 may be formed on the first substrate 110 on which the pixel circuits PXC may be formed. A contact electrode material layer may be stacked on the pixel electrodes 111 and etched to form contact electrodes 113. The contact electrode material layer may include gold (Au), copper (Cu), aluminum (Al) or tin (Sn).

After aligning the light-emitting element layer 120 on the semiconductor circuit board 100, the semiconductor circuit board 100 and the light-emitting element layer 120 are attached together.

The contact electrodes 113 of the semiconductor circuit board 100 are brought into contact with the connection electrodes 126 of the light-emitting element layer 120. The semiconductor circuit board 100 and the light-emitting element layer 120 may be attached together by fusion bonding the contact electrodes 113 with the connection electrodes 126 while applying heat.

Figure 48:
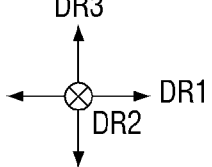
Figure 49:
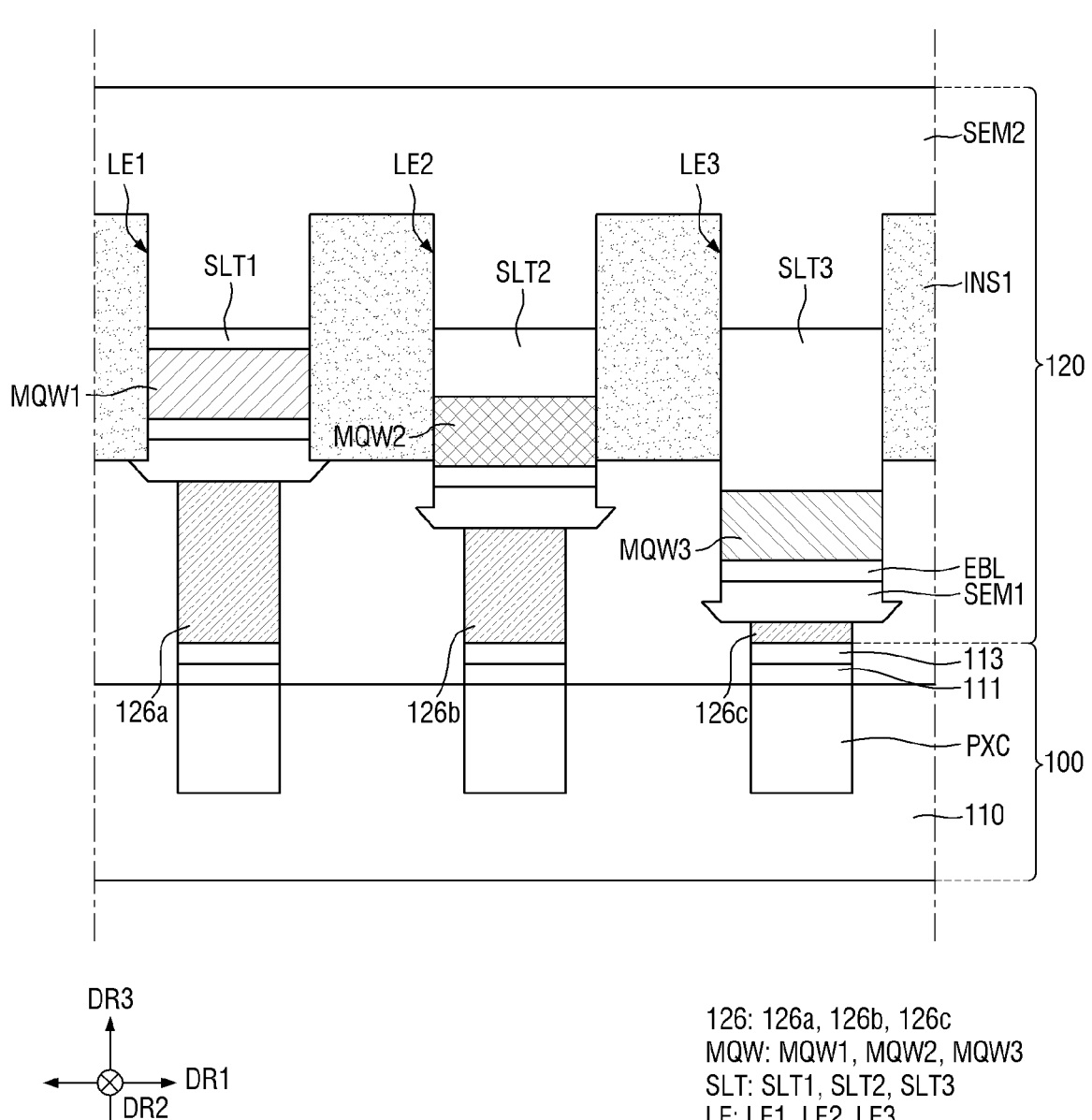

Referring to FIGS. 48 and 49, the second substrate 210 of the light-emitting element layer 120 and the third semiconductor layer SEM3 are removed by etching (Fourth etch), so that the display device according to the embodiment of the disclosure can be fabricated.

As described above with reference to FIGS. 41 to 49, in the display device 1 according to an embodiment, the first hard mask HK1 and the second hard mask HK2 are removed together after the process of forming the second opening OP2 and the third opening OP3, instead of removing them individually. Therefore, the process may be simplified, and fabrication costs may be reduced.

According to the above-described embodiments, in the display device 1 including small light-emitting elements having a size of several to several tens of micrometers, the width (or area) of the light-emitting elements emitting blue light is formed to be larger than that of other light-emitting elements, so that the light-emitting efficiency of the light-emitting elements emitting blue light can be improved. By doing so, such light-emitting elements can be applied to an ultra-high resolution display device.

According to the embodiments, the process of fabricating the display device can be simplified by forming the lengths of the light-emitting elements differently, and by forming the first region that protrudes outside the insulating layer and has a larger width in each of the light-emitting elements, it is possible to improve the light-emitting efficiency of each of the light-emitting elements.

FIG. 50 is a view showing an example of a virtual reality device including a display device according to an embodiment. FIG. 50 shows a virtual reality device VRD employing a display device 1 according to an embodiment.

Referring to FIG. 50, the virtual reality device VRD according to the embodiment may be a device in the form of glasses. The virtual reality device VRD according to the embodiment of the disclosure may include the display device 1, a left eye lens 10a, a right eye lens 10b, a support frame 20, eyeglass temples 30a and 30b, a reflective member 40, and a display case 50.

Although FIG. 50 shows the virtual reality device VRD including the eyeglass temples 30a and 30b, a head mounted display with a head strap, instead of the eyeglass temples 30a and 30b, may be employed as the virtual reality device VRD according to an embodiment of the disclosure. For example, the virtual reality device VRD is not limited to that shown in FIG. 50 but may be applied in a variety of electronic devices in a variety of forms.

The display device case 50 may include the display device 1 and the reflective member 40. An image displayed on the display device 1 may be reflected by the reflective member 40 and provided to the user's right eye through the right eye lens 10b. Accordingly, the user may see a virtual reality image displayed on the display device 1 through the right eye.

Although the display case 50 is disposed at the right end of the support frame 20 in the example shown in FIG. 50, the embodiments of the disclosure are not limited thereto. For example, the display case 50 may be disposed at the left end of the support frame 20. An image displayed on the display device 1 may be reflected by the reflective member 40 and provided to the user's left eye through the left eye lens 10a. Accordingly, the user may see a virtual reality image displayed on the display device 1 through the left eye. In other examples, the display device cases 50 may be disposed at both the left and right ends of the support frame 20, respectively. The user may see a virtual reality image displayed on the display device 1 through both the left and right eyes.

FIG. 51 is a view showing an example of a smart device including a display device according to an embodiment of the disclosure.

Referring to FIG. 51, a display device 1 according to an embodiment may be applied to a smart device such as a smart watch 2.

FIG. 52 is a view showing an example of a vehicle including a display device according to an embodiment. FIG. 52 shows a vehicle in which display devices according to an embodiment of the disclosure are employed.

Referring to FIG. 52, display devices 10_a, 10_b and 10_c according to an embodiment of the disclosure may be applied to the instrument cluster of a vehicle, may be applied to the center fascia of a vehicle, or may be applied to a center information display (CID) disposed on the dashboard of a vehicle. The display devices 10_d and 10_e according to an embodiment of the disclosure may be applied to mirror displays, which may replace side mirrors of a vehicle.

FIG. 53 is a view showing an example of a transparent display device including a display device according to an embodiment.

Referring to FIG. 53, a display device 1 according to an embodiment may be applied to a transparent display device. The transparent display device may transmit light while displaying images IM. Therefore, a user located on the front side of the transparent display device may not only see the images IM displayed on the display device 1 but also see an object RS or the background located behind the transparent display device. When the display device 1 is applied to the transparent display device, the semiconductor circuit board 100 of the display device 1 shown in FIG. 4 may include a light-transmitting portion that can transmit light or may be made of a material that can transmit light.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
contact electrodes disposed on a substrate;
light-emitting elements disposed on the contact electrodes; and
an insulating layer defining emission areas that correspond to the light-emitting elements, wherein
the light-emitting elements comprise:
    a first light-emitting element that emits a first light having a blue color;
    a second light-emitting element that emits a second light having a green color; and
    a third light-emitting element that emits a third light having a red color,
a width of the first light-emitting element is greater than a width of the second light-emitting element,
the width of the first light-emitting element is greater than a width of the third light-emitting element,
each of the light-emitting elements comprises:
    a first semiconductor layer
    a second semiconductor layer; and
    an active layer disposed between the first semiconductor layer and the second semiconductor layer,
the first light-emitting element comprises a first active layer,
the second light-emitting element comprises a second active layer,
the third light-emitting element comprises a third active layer,
each of the first active layer, the second active layer, and the third active layer contains indium,
a content of indium in the first active layer is smaller than a content of indium in the second active layer,
the content of indium in the first active layer is smaller than a content of indium in the third active layer, and the content of indium in the second active layer is smaller than the content of indium in the third active layer.

2. The display device of claim 1, wherein the width of the second light-emitting element is greater than or equal to the width of the third light-emitting element.

3. The display device of claim 1, wherein
the emission areas comprise:
a first emission area that corresponds to the first light-emitting element;
a second emission area that corresponds to the second light-emitting element; and
a third emission area that corresponds to the third light-emitting element,
an area of the first emission area is greater than an area of the second emission area, and
the area of the first emission area is greater than an area of the third emission area.

4. The display device of claim 3, wherein the area of the second emission area is greater than or equal to the area of the third emission area.

5. The display device of claim 3, wherein each of the emission areas has a shape of a circle or a polygon in a plan view.

6. The display device of claim 3, wherein
the light-emitting elements comprise a fourth light-emitting element that emits the third light, and
the emission areas comprise a fourth emission area that corresponds to the fourth light-emitting element.

7. The display device of claim 6, wherein
a width of the fourth light-emitting element is equal to the width of the third light-emitting element, and
an area of the fourth emission area is equal to the area of the third emission area.

8. The display device of claim 7, wherein the area of the second emission area is greater than or equal to a sum of the area of the third emission area and the area of the fourth emission area.

9. The display device of claim 1, wherein the second semiconductor layer is a common layer that extends over the light-emitting elements and is electrically connected commonly to the light-emitting elements.

10. The display device of claim 1, further comprising:
connection electrodes disposed between the contact electrodes and the light-emitting elements,
wherein the light-emitting elements are electrically connected to the contact electrodes through the connection electrodes.

* * * * *